US008161438B2

(12) United States Patent
Suaya et al.

(10) Patent No.: US 8,161,438 B2
(45) Date of Patent: Apr. 17, 2012

(54) DETERMINING MUTUAL INDUCTANCE BETWEEN INTENTIONAL INDUCTORS

(75) Inventors: Roberto Suaya, Meylan (FR); Rafael Escovar, Grenoble (FR); Salvador Ortiz, Grenoble (FR)

(73) Assignee: Mentor Graphics Corporation, Wilsonville, OR (US)

( * ) Notice: Subject to any disclaimer, the term of this patent is extended or adjusted under 35 U.S.C. 154(b) by 719 days.

(21) Appl. No.: 11/435,426

(22) Filed: May 16, 2006

(65) Prior Publication Data

US 2006/0282492 A1   Dec. 14, 2006

Related U.S. Application Data

(63) Continuation-in-part of application No. 10/972,025, filed on Oct. 21, 2004, now Pat. No. 7,496,871.

(60) Provisional application No. 60/513,343, filed on Oct. 21, 2003, provisional application No. 60/681,613, filed on May 16, 2005.

(51) Int. Cl.
*G06F 17/50* (2006.01)
*G06F 9/45* (2006.01)

(52) U.S. Cl. ........ 716/106; 716/100; 716/102; 716/104; 716/107; 716/110; 716/111; 716/117; 716/136; 703/14

(58) Field of Classification Search .................. 716/1–6, 716/11, 100, 102, 104, 106, 107, 110, 111, 716/117, 136; 438/381; 336/192, 200; 703/13, 703/14
See application file for complete search history.

(56) References Cited

U.S. PATENT DOCUMENTS

| 4,026,040 | A | * | 5/1977 | Valentine et al. | 434/314 |
|---|---|---|---|---|---|
| 5,436,564 | A | * | 7/1995 | Kreger et al. | 600/411 |
| 5,767,009 | A | * | 6/1998 | Yoshida et al. | 438/613 |
| 5,781,009 | A | * | 7/1998 | Lee et al. | 324/239 |
| 5,826,215 | A | * | 10/1998 | Garrett et al. | 702/75 |
| 5,973,495 | A | * | 10/1999 | Mansfield | 324/322 |
| 5,998,999 | A | * | 12/1999 | Richard et al. | 324/318 |
| 6,053,950 | A | | 4/2000 | Shinagawa | |
| 6,295,634 | B1 | | 9/2001 | Matsumoto | |
| 6,311,313 | B1 | | 10/2001 | Camporese et al. | |
| 6,327,696 | B1 | | 12/2001 | Mahajan | |
| 6,378,080 | B1 | | 4/2002 | Anjo et al. | |
| 6,381,730 | B1 | | 4/2002 | Chang et al. | |
| 6,434,724 | B1 | | 8/2002 | Chang et al. | |
| 6,453,444 | B1 | | 9/2002 | Shepard | |

(Continued)

OTHER PUBLICATIONS

Niknejad et al.; "Analysis, design, and optimization of spiral inductors and transformers for Si RF ICs"; Oct. 1998; Solid-State Circuits, IEEE Journal of; vol. 33, Issue 10, pp. 1470-1481.*

(Continued)

*Primary Examiner* — Helen Rossoshek
(74) *Attorney, Agent, or Firm* — Klarquist Sparkman, LLP

(57) ABSTRACT

Various methods for analyzing mutual inductance in an integrated circuit layout are disclosed. In one exemplary embodiment, for example, circuit design information indicative of a first inductor and a second inductor is received. A dipole moment associated with the first inductor is determined, where the magnetic field associated with the dipole moment is representative of magnetic fields created by respective turns in the first inductor. A mutual inductance between the first inductor and the second inductor is determined by determining a magnetic flux of the magnetic field of the dipole moment through surfaces bounded by respective wire segments of the second inductor.

19 Claims, 27 Drawing Sheets

U.S. PATENT DOCUMENTS

| | | | |
|---|---|---|---|
| 6,459,352 B1 * | 10/2002 | Liu et al. .................... 336/200 | |
| 6,487,703 B1 | 11/2002 | McBride et al. | |
| 6,578,174 B2 | 6/2003 | Zizzo | |
| 6,588,002 B1 | 7/2003 | Lampaert et al. | |
| 6,604,225 B1 | 8/2003 | Otsu et al. | |
| 6,643,831 B2 | 11/2003 | Chang et al. | |
| 6,651,230 B2 | 11/2003 | Cohn et al. | |
| 6,742,165 B2 | 5/2004 | Lev et al. | |
| 6,820,245 B2 | 11/2004 | Beattie et al. | |
| 6,934,669 B1 | 8/2005 | Suaya et al. | |
| 6,938,231 B2 | 8/2005 | Yoshida et al. | |
| 6,966,040 B2 | 11/2005 | Ismailov | |
| 6,981,230 B1 | 12/2005 | Lin et al. | |
| 7,013,442 B2 | 3/2006 | Suaya et al. | |
| 7,078,987 B1 * | 7/2006 | Petrovic .................... 333/177 | |
| 7,096,148 B2 * | 8/2006 | Anderson et al. ............ 702/134 | |
| 7,096,174 B2 | 8/2006 | Beattie et al. | |
| 7,099,808 B2 | 8/2006 | Suaya et al. | |
| 7,260,796 B2 | 8/2007 | Suaya et al. | |
| 7,350,175 B2 * | 3/2008 | Iwaki et al. .................... 716/11 | |
| 7,426,706 B2 * | 9/2008 | Suaya et al. .................... 716/6 | |
| 7,454,300 B2 | 11/2008 | Suaya et al. | |
| 7,496,871 B2 | 2/2009 | Suaya et al. | |
| 2002/0116696 A1 | 8/2002 | Suaya et al. | |
| 2003/0131334 A1 | 7/2003 | Suaya et al. | |
| 2004/0158801 A1 | 8/2004 | Leisten et al. | |
| 2005/0120316 A1 | 6/2005 | Suaya et al. | |
| 2005/0268260 A1 | 12/2005 | Suaya et al. | |
| 2006/0143586 A1 | 6/2006 | Suaya et al. | |
| 2007/0018767 A1 * | 1/2007 | Gabara .................... 336/200 | |
| 2007/0225925 A1 * | 9/2007 | Suaya et al. .................... 702/57 | |
| 2007/0226659 A1 * | 9/2007 | Suaya et al. .................... 716/1 | |
| 2008/0276207 A1 | 11/2008 | Suaya et al. | |
| 2009/0013300 A1 | 1/2009 | Suaya et al. | |
| 2009/0172613 A1 * | 7/2009 | Suaya et al. .................... 716/4 | |
| 2009/0228847 A1 * | 9/2009 | Suaya .................... 716/4 | |

OTHER PUBLICATIONS

Jiang et al.; "On-chip spiral inductors suspended over deep copper-lined cavities"; Dec. 2000; Microwave Theory and Techniques, IEEE Transactions on; vol. 48, Issue 12, pp. 2415-2423.*

Burghartz et al.; "On the design of RF spiral inductors on silicon"; Mar. 2003; Electron Devices, IEEE Transactions on vol. 50, Issue 3, pp. 718-729.*

Lopera et al.; "A multiwinding modeling method for high frequency transformers and inductors"; May 2003: Power Electronics, IEEE Transactions on; vol. 18, Issue 3, May 2003 pp. 896-906.*

Yue et al.;; "Design strategy of on-chip inductors for highly integrated RF systems"; Jun. 1999; DAC '99: Proceedings of the 36th ACM/IEEE conference on Design automation; Publisher: ACM.*

Hu et al.; "Analysis of full-wave conductor system impedance over substrate using novel integration techniques "; Jun. 2005; DAC '05: Proceedings of the 42nd annual conference on Design automation; Publisher: ACM.*

Belk et al.; "The simulation and design of integrated inductors "; Jun. 1999; DAC '99: Proceedings of the 36th ACM/IEEE conference on Design automation; Publisher: ACM.*

Niknejad et al.; "Analysis and optimization of monolithic inductors and transformers for RF ICs"; May 5-8, 1997; Custom Integrated Circuits Conference, 1997., Proceedings of the IEEE 1997; pp. 375-378.*

"ASITIC: Analysis and Simulation of Spiral Inductors and Transformers for ICs," downloaded from http://rfic.eecs.berkeley.edu/~niknejad/asitic.html, 1 p. (document not dated, downloaded on Aug. 15, 2006).

"ASITIC Documentation: Grackle Release," downloaded from http://rfic.eecs.berkeley.edu/~niknejad/doc-05-26-02/asitic.html, 1 p. (document not dated, downloaded on Aug. 15, 2006).

"ASITIC Commands," downloaded from http://rfic.eecs.berkeley.edu/~niknejad/doc-05-26-02/commands.html, 1 p. (document not dated, downloaded on Aug. 15, 2006).

"ASITIC Documentation: Environmental Variables," downloaded from http://rfic.eecs.berkeley.edu/~niknejad/doc-05-26-02/env.html, 8 pp. (document not dated, downloaded on Aug. 15, 2006).

"ASITIC: Installing and Running," downloaded from http://rfic.eecs.berkeley.edu/~niknejad/doc-05-26-02/install.html, 2 pp. (document not dated, downloaded on Aug. 15, 2006).

"Technology File," downloaded from http://rfic.eecs.berkeley.edu/~niknejad/doc-05-26-02/techfile.html, 5 pp. (document not dated, downloaded on Aug. 15, 2006).

"ASITIC Quickstart," downloaded from http://rfic.eecs.berkeley.edu/~niknejad/doc-05-26-02/quickstart.html, 3 pp. (document not dated, downloaded on Aug. 15, 2006).

"Sample ASITIC Sessions," downloaded from http://rfic.eecs.berkeley.edu/~niknejad/doc-05-26-02/sample.html, 19 pp. (document not dated, downloaded on Aug. 15, 2006).

"ASITIC FAQ," downloaded from http://rfic.eecs.berkeley.edu/~niknejad/doc-05-26-02/faq.html, 7 pp. (document not dated, downloaded on Aug. 15, 2006).

Averill III et al., "Chip integration methodology for the IBM S/390 G5 and G6 custom microprocessors," *IBM J. Res. Develop.*, vol. 43, pp. 681-706 (Sep./Nov. 1999).

Banerjee et al., "Accurate Analysis of On-Chip Inductance Effects and Implications for Optimal Repeater Insertion and Technology Scaling," *IEEE Symposium on VLSI Circuits*, Kyoto, Japan, pp. 1-4 (Jun. 14-16, 2001).

Beattie et al., "Efficient Inductance Extraction via Windowing," *Proc. Design, Automation, and Test in Europe*, pp. 430-436 (2001).

Beattie et al., "Equipotential Shells for Efficient Inductance Extraction," *IEEE Trans. CAD of IC and Systems*, vol. 20, pp. 70-79 (2001).

Beattie et al., "Hierarchical Interconnect Circuit Models," 7 pp. (also published as Beattie et al., "Hierarchical Interconnect Circuit Models,"*Proc. ICCAD*, pp. 215-221 (Nov. 2000)).

Beattie et al., "Inductance 101: Modeling and Extraction," *Design Automation Conf.*, pp. 323-328 (2001).

Chang et al., "Clocktree RLC Extraction with Efficient Inductance Modeling," 5 pp. (also published as Chang et al., "Clocktree RLC Extraction with Efficient Inductance Modeling," *Proc. Design, Automation, and Test in Europe*, pp. 522-526 (2000)).

Chen et al., "INDUCTWISE: Inductance-Wise Interconnect Simuator and Extractor," *IEEE Trans. CAD of IC and Systems*, vol. 22, No. 7, pp. 884-894 (2003).

Davis et al., "Compact Distributed RLC Interconnect Models—Part I: Single Line Transient, Time Delay, and Overshoot Expressions," *IEEE Trans. on Electron Devices*, vol. 47, No. 11, pp. 2068-2077 (Nov. 2000).

Devgan et al., "How to Efficiently Capture On-Chip Inductance Effects: Introducing a New Circuit Element $K$," *IEEE*, pp. 150-155 (2000).

Escovar et al., "Mutual Inductance between Intentional Inductors: Closed Form Expressions," *IEEE*, pp. 2445-2448 (2006).

Escovar et al., "Mutual Inductance Extraction and the Dipole Approximation," *ACM*, pp. 162-169 (2004).

Escovar et al., "Transmission line design of Clock Trees," *IEEE*, pp. 334-340 (2002).

Gala et al., "Inductance 101: Analysis and Design Issues," *Design Automation Conf.*, pp. 329-334 (Jun. 2001).

Gieseke et al., "A 600 MHz Superscalar RISC Microprocessor with Out-Of-Order Execution," *IEEE International Solid-State Circuits Conf.*, pp. 176, 177, and 451 (Feb. 1997).

Golub et al., "The Differentiation of Pseudo-Inverses and Nonlinear Least Squares Problems Whose Variables Separate," *SIAM J. Numer. Anal.*, vol. 10, No. 2, pp. 413-432 (Apr. 1973).

Grover, *Inductance Calculations: Working Formulas and Tables*, pp. iii-xiv, 1, 31-61.

Gupta et al., "Hierarchical Modeling of Electrostatic and Magnetostatic Couplings," 4 pp. (also published as Gupta et al., "Hierarchical Modeling of Electrostatic and Magnetostatic Couplings," *SRC Techcon Conference* (Aug. 2003)).

Gupta, "Modeling Inductive Couplings in Traditional and Nanoscale Interconnects," Ph.D. Thesis, Carnegie Mellon University, 83 pp. (Jul. 2004).

Ismail et al., "Effects of Inductance on the Propagation Delay and Repeater Insertion in VLSI Circuits," *IEEE Trans. on VLSI Systems*, vol. 8, No. 2, pp. 195-206 (Apr. 2000).

Jackson et al., *Classical Electrodynamics*, pp. xi-xvii, 144-149 (1962).

Kamon, "Efficient Techniques for Inductance Extraction of Complex 3-D Geometries," Master Thesis—Massachusetts Institute of Technology, 80 pp. (Feb. 1994).

Kamon et al., "FASTHENRY: A Multipole-Accelerated 3-D Inductance Extraction Program," *IEEE Trans. Microwave Theory Tech.*, vol. 42, No. 9, pp. 1750-1758 (Sep. 1994).

Krauter et al., "Layout Based Frequency Dependent Inductance and Resistance Extraction for On-Chip Interconnect Timing Analyis," *ACM*, pp. 303-308 (1998).

Lee et al., "Interconnect Inductance Effects on Delay and Crosstalks for Long On-Chip Nets with Fast Input Slew Rates;" *IEEE*, pp. II-248 through II-251 (1998).

Lin et al., "On the Efficiency of Simplified 2D On-Chip Inductance Models," *Design Automation Conf.*, 6 pp. (2002).

Lu et al., "A Fast Analytical Technique for Estimating the Bounds of On-Chip Clock Wire Inductance," *IEEE CICC*, 4 pp. (2001).

Massoud et al., "Layout Techniques for Minimizing On-Chip Interconnect Self Inductance," *Design Automation Conf.*, pp. 566-571 (1998).

Niknejad et al., *Design, Simulation and Applications of Inductors and Transformers for Si RF ICs*, pp. 64-69 (2000).

Restle et al., "A Clock Distribution Network for Microprocessors," *IEEE Journal of Solid-State Circuits*, vol. 36, No. 5, pp. 792-799 (May 2001).

Rosa, "The Self and Mutual Inductances of Linear Conductors," *Bulletin of the Bureau of Standards*, vol. 4, No. 2, pp. 301-344 (1908).

Ruehli, "Inductance Calculations in a Complex Integrated Circuit Environment," *IBM J. Res. Develop.*, pp. 470-481 (1972).

Sakurai, "Closed-Form Expressions for Interconnection Delay, Coupling, and Crosstalk in VLSI's," *IEEE Trans. on Electron Devices*, vol. 40, No. 1, pp. 118-124 (Jan. 1993).

Office action dated Feb. 2, 2007, from U.S. Appl. No. 10/972,025 (published as U.S. Patent Application Publication 2005-0120316).

Notice of Allowance dated Jul. 26, 2007, from U.S. Appl. No. 10/972,025 (published as U.S. Patent Application Publication 2005-0120316).

Office action dated Jan. 11, 2008, from U.S. Appl. No. 10/972,025 (published as U.S. Patent Application Publication 2005-0120316).

Office action dated Jun. 2, 2008, from U.S. Appl. No. 10/972,025 (published as U.S. Patent Application Publication 2005-0120316).

Notice of Allowance dated Aug. 28, 2008, from U.S. Appl. No. 10/972,025 (published as U.S. Patent Application Publication 2005-0120316).

Afzali-Kusha et al., "Substrate Noise Coupling in SoC Design: Modeling, Avoidance, and Validation," *Proc. of the IEEE*, vol. 94, No. 12, pp. 2109-2138 (Dec. 2006).

Aksun, "A Robust Approach for the Derivation of Closed-Form Green's Functions," *IEEE Trans. on MicrowaveTheory and Tech.*, vol. 44, No. 5, pp. 651-658 (May 1996).

Aksun et al., "Clarification of Issues on the Closed-Form Green's Functions in Stratified Media," *IEEE Trans. on Antennas and Propagation*, vol. 53, No. 11, pp. 3644-3653 (Nov. 2005).

Bannister, "Summary of Image Theory Expressions for the Quasi-Static Fields of Antennas at or above the Earth's Surface," *IEEE Proc.*, vol. 67, No. 7, pp. 1001-1008 (Jul. 1979).

Charbon et al., *Substrate Noise: Analysis and Optimization for IC Design*, pp. 11-17 (Apr. 2001).

Chew, *Waves and Fields in Inhomogeneous Media*, pp. 70-76 (1995).

Chow et al., "Complex Images for Electrostatic Field Computation in Multilayered Media," *IEEE Trans. on Microwave Theory and Techniques*, vol. 39, No. 3, pp. 1120-1125 (Jul. 1991).

Coperich et al., "Systematic Development of Transmission-Line Models for Interconnects with Frequency-Dependent Losses," *IEEE Trans. on Microwave Theory and Techniques*, vol. 49, No. 10, pp. 1677-1685 (Oct. 2001).

Deutsch et al., "When are Transmission-Line Effects Important for On-Chip Interconnections?," *IEEE Trans. on Microwave Theory and Techniques*, vol. 45, No. 10, pp. 1836-1846 (Oct. 1997).

Dural et al, "Closed-Form Green's Functions for General Sources and Stratified Media," *IEEE Trans. on Microwave Theory and Techniques*, vol. 43, No. 7, pp. 1545-1552 (Jul. 1995).

Escovar et al., "An Improved Long Distance Treatment for Mutual Inductance," *IEEE Trans. on Computer-Aided Design of Integrated Circuits and Systems*, vol. 24, No. 5, pp. 783-793 (May 2005).

Fang et al., "Discrete Image Theory for Horizontal Electric Dipoles in a Multilayered Medium," *IEEE Proc. H: Microwaves, Antennas and Propagation*, vol. 135, No. 5, pp. 297-303 (Oct. 1988).

Golub et al., "Separable Nonlinear Least Squares: The Variable Projection Method and its Applications," *Inverse Problems*, vol. 19, pp. R1-R26 (2003).

Hu, "Full-Wave Analysis of Large Conductor Systems Over Substrate," Ph.D. Dissertation, University of California, Berkeley, 145 pp. (2006).

Jiang et al., "Epeec: Comprehensive Spice-Compatible Reluctance Extraction for High-Speed Interconnects Above Lossy Multilayer Substrates," *IEEE Trans. on Computer-Aided Design of Integrated Circuits and Systems*, vol. 24, No. 10, pp. 1562-1571 (Oct. 2005).

Ling et al., "Discrete Complex Image Method for Green's Functions of General Multilayer Media," *IEEE Microwave and Guided Wave Letters*, vol. 10, No. 10, pp. 400-402 (Oct. 2000).

Lu et al., "Min/Max On-Chip Inductance Models and Delay Metrics," *Design Automation Conf.*, pp. 341-346 (2001).

Moselhy et al., "pFFT in FastMaxwell: A Fast Impedance Extraction Solver for 3D Conductor Structures over Substrate," *Design, Automation and Test in Europe*, pp. 1-6 (2007).

Nabors et al., "Multipole-Accelerated Capacitance Extraction Algorithms for 3-d Structures with Multiple Dielectrics," *IEEE Trans. on Circuits and Systems*, vol. 39, No. 11, pp. 946-954 (1992).

Niknejad et al., "Analysis of Eddy-Current Losses over Conductive Substrates with Applications to Monolithic Inductors and Transformers," *IEEE Trans. on Microwave Theory and Techniques*, vol. 49, No. 1, pp. 166-176 (Jan. 2001).

Okhmatovski et al., "Evaluation of Layered Media Green's Functions via Rational Function Fitting," *IEEE Microwave and Wireless Components Letters*, vol. 14, No. 1, pp. 22-24 (Jan. 2004).

Qi et al., "On-Chip Inductance Modeling of VLSI Interconnects," *IEEE Solid-State Circuits Conf.*, 12 pp. (2000).

Ranjan et al., "Use of Symbolic Performance Models in Layout-Inclusive RF Low Noise Amplifier Synthesis," *IEEE*, pp. 130-134 (Sep. 2004).

Soitec, "Wafer Solutions by Application," downloaded from http://www.soitec.com/en/products/, 2 pp. (document marked 2009).

Srivastava et al., "Analytical Expressions for High-Frequency VLSI Interconnect Impedance Extraction in the Presence of a Multilayer Conductive Substrate," *IEEE Trans. on Computer-Aided Design of Integrated Circuits and Systems*, vol. 28, No. 7, pp. 1047-1060 (Jul. 2009).

Srivastava et al., "High-Frequency Mutual Impedance Extraction of VLSI Interconnects in the Presence of a Multi-Layer Conducting Substrate," *Design, Automation and Test in Europe*, pp. 426-431 (2008).

Suaya et al., "Modeling and Extraction of Nanometer Scale Interconnects: Challenges and Opportunities," *Proc. 23rd Advanced Metallization Conf.*, 11 pp. (2006).

Verghese et al., "Substrate Coupling in Mixed-Mode and RF Integrated Circuits," *IEEE*, pp. 297-303 (Sep. 1997).

Verghese et al., "SUBTRACT: A Program for the Efficient Evaluation of Substrate Parasitics in Integrated Circuits," *IEEE*, pp. 194-198 (Nov. 1995).

Verghese et al., "Verification of RF and Mixed-Signal Integrated Circuits for Substrate Coupling Effects," *IEEE Custom Integrated Circuits Conf.*, pp. 363-370 (May 1997).

Verghese et al., "Verification Technique for Substrate Coupling and Their Application to Mixed-Signal IC Design," *IEEE*, vol. 31, No. 3, pp. 354-365 (Mar. 1996).

Weisshaar et al., "Accurate Closed-Form Expressions for the Frequency-Dependent Line Parameters of On-Chip Interconnects on Lossy Silicon Substrate," *IEEE Trans. on Advanced Packaging*, vol. 25, No. 2, pp. 288-296 (May 2002).

Yang et al., "Discrete Complex Images of a Three-Dimensional Dipole Above and Within a Lossy Ground," *IEE Proc. H Microwaves, Antennas, and Propagation*, vol. 138, No. 4, pp. 319-326 (Aug. 1991).

Yavuz et al., "Critical Study of the Problems in Discrete Complex Image Method," *IEEE Int'l Symp. on Electromagnetic Compatability*, pp. 1281-1284 (2003).

Ymeri et al., "New Analytic Expressions for Mutual Inductance and Resistance of Coupled Interconnects on Lossy Silicon Substrate," *Topical Meeting on Silicon Monolithic Integrated Circuits in RF Systems*, pp. 192-200 (2001).

Yuan et al., "A Direct Discrete Complex Image Method from the Closed-Form Green's Functions in Multilayered Media," *IEEE Trans. on Microwave Theory and Techniques*, vol. 54, No. 3, pp. 1025-1032 (Mar. 2006).

\* cited by examiner

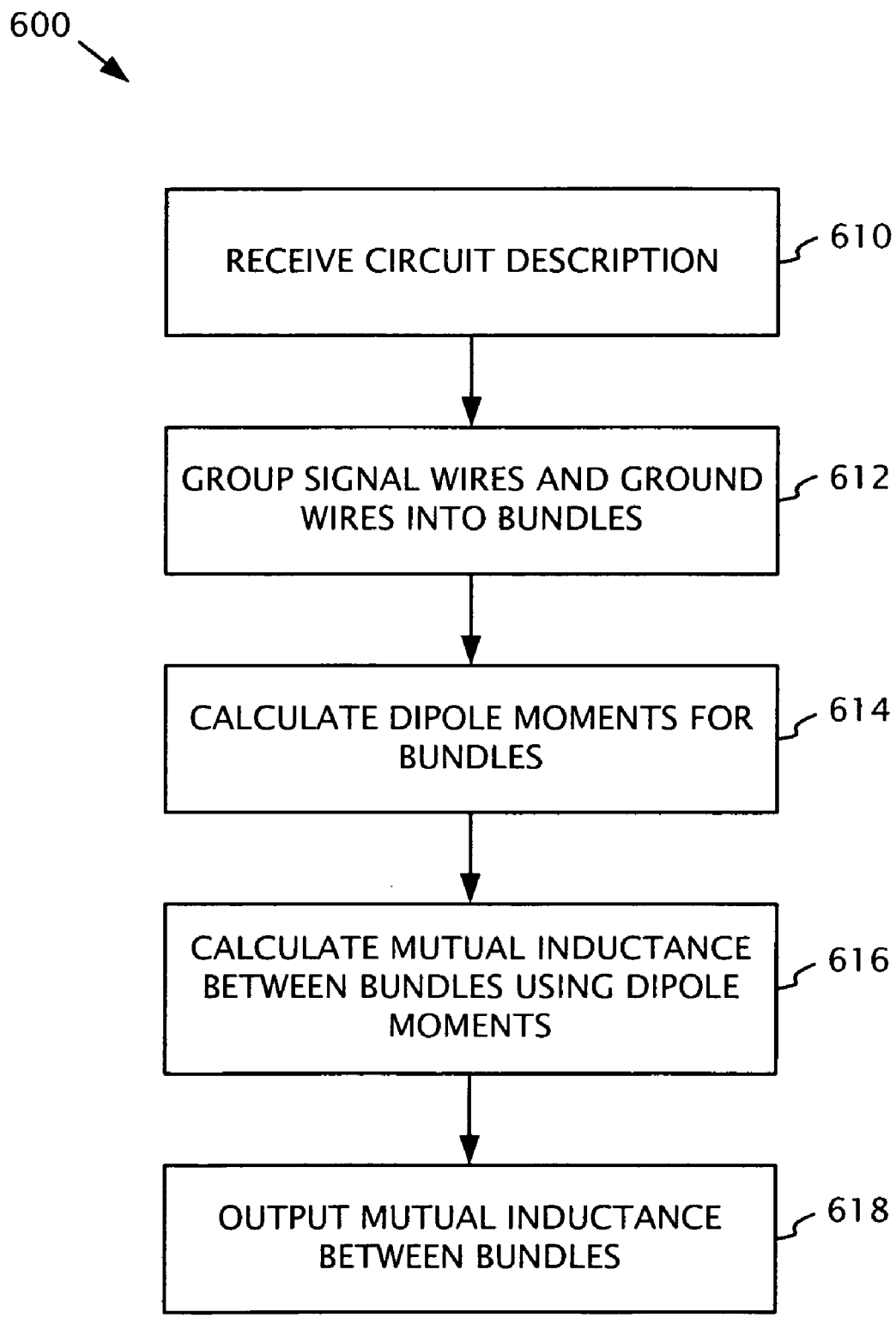

FIG. 28
2800
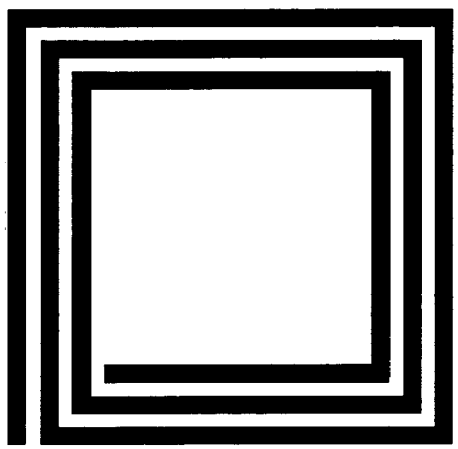
INDUCTOR *a*
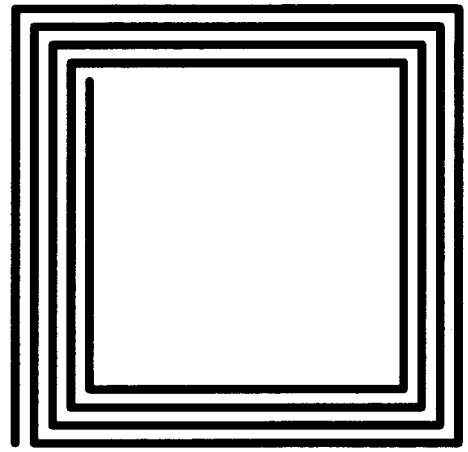
INDUCTOR *b*

INDUCTOR *a*

FIG. 30
3000
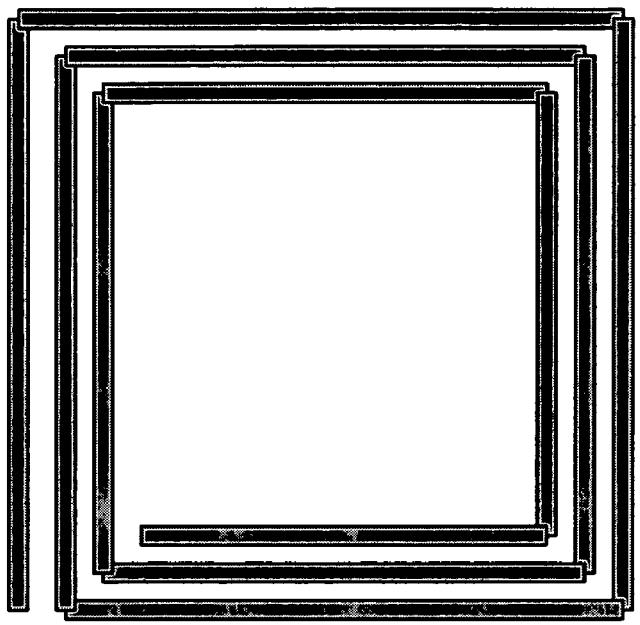
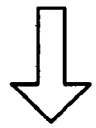
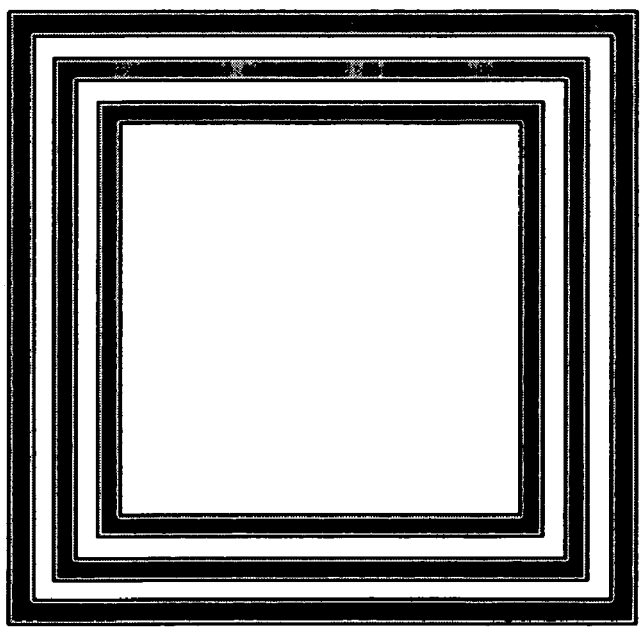

DETERMINING MUTUAL INDUCTANCE BETWEEN INTENTIONAL INDUCTORS

CROSS REFERENCE TO RELATED APPLICATIONS

This application is a continuation-in-part of U.S. patent application Ser. No. 10/972,025, filed on Oct. 21, 2004 now U.S. Pat. No. 7,496,871, entitled "MUTUAL INDUCTANCE EXTRACTION USING DIPOLE APPROXIMATIONS," which claims the benefit of U.S. Provisional Patent Application No. 60/513,343, filed on Oct. 21, 2003, entitled "MUTUAL INDUCTANCE EXTRACTION," both of which are hereby incorporated herein by reference. This application also claims the benefit of U.S. Provisional Patent Application No. 60/681,613, filed on May 16, 2005, and entitled "DETERMINING MUTUAL INDUCTANCE BETWEEN INTENTIONAL INDUCTORS," which is also hereby incorporated herein by reference.

BACKGROUND

As operating frequencies of integrated circuits continue to rise, the effects of inductance on circuit performance are becoming increasingly important. For example, for integrated circuits operating near or above the gigahertz frequency range, the mutual inductance with neighboring signal wires may create signal-integrity problems (such as noise and cross talk). Consequently, the effective modeling and analysis of mutual inductance has become an issue of great interest for high-speed circuit designers and for electronic design automation (EDA) software vendors that develop the tools used to create, simulate, verify, and optimize the designs of integrated circuits (e.g., RF circuits comprising intentional inductors) and to provide bounds for effects due to inductance.

Intentional inductors are often used as components in RF (radio frequency) analog designs, particularly in telecommunication applications. Design and manufacturing considerations usually favor spacing the different inductors closely together in order to minimize the occupied area. To be able to place the inductors safely, however, a designer desirably has a quantitative measure of the electromagnetic noise that one inductor induces on another. The noise figures can be evaluated, for example, in terms of the electrical parameter resistance, inductance, and capacitance matrices (PLC) for the system.

SUMMARY

Intentional inductors (sometimes referred to herein as "inductors") are often used as components in high frequency RF (radio frequency) analog and mixed-signal integrated circuit and SOC design. It is not uncommon in RF applications to design ICs containing a number of inductors. Typically, each inductor occupies a substantial amount of area on the integrated circuit. Manufacturing yield generally favors layout configurations that minimize the distance among the different inductors on the integrated circuit, while noise considerations favor larger configurations.

The mutual inductance between two intentional inductors is one parameter used for evaluating how close the user can place different inductors while still satisfying pre-specified or user-selected noise limits. For example, the inter-inductor noise can be determined in part by the mutual inductance and the mutual capacitance between the two inductors.

Disclosed herein are embodiments of techniques that can provide a reliable computation of the mutual inductance between two or more intentional inductors. Embodiments of the disclosed techniques can be used, for example, to perform highly efficient noise analysis or design exploration.

In certain embodiments, frequency-related effects are accounted for as necessary. For instance, one parameter that controls the onset of frequency dependent effects is the skin depth $\delta$. Thus, in one exemplary embodiment, when the smallest transverse dimension is smaller than about $2\delta$, corrections due to current crowding play a minimal role and uniform current distribution can be assumed. For higher frequencies, effects due to non-uniformity of the current distribution are desirably accounted for.

Thus, according to one embodiment of the disclosed technology, mutual inductance computations are performed using at least two different approaches, one approach for lower frequencies where current uniformity can be appropriate assumed (e.g., smaller than about 5-7 GHz) and another approach for higher frequencies where current uniformity is no longer assumed (e.g., greater than about 5-7 GHz). Such embodiments can be used, for example, to quickly estimate the noise parameter due to magnetic coupling in low- and high-frequency circuits.

Further, many of the disclosed embodiments are much less computationally complex than conventional methods. For example, the computation of mutual inductance $M_{ab}(s)$ between two inductors as a function of separation s typically has $N^2$ complexity for each datapoint, with N corresponding to the number of segments per inductor. This cost can be computationally expensive for design exploration. Accordingly, in some embodiments of the disclosed technology, this computational complexity is improved by using a dipole approximation technique as described herein. According to one implementation, for example, the complexity of such computations is linear with N.

Further, the disclosed embodiments are not constrained to being applied to a Manhattan layout, but may more generally be applied to layouts having other angular relationships (e.g., symmetrical inductors or spiral inductors, among others).

In one exemplary embodiment, a method for analyzing mutual inductance between inductors in a circuit layout is described. In this embodiment, for example, circuit design information indicative of at least a portion of the circuit layout is received. The circuit design information includes layout information about a first inductor and a second inductor. A value associated with the first inductor is determined, where the value is representative of plural magnetic fields generated by respective turns of the first inductor. A mutual inductance between the first inductor and the second inductor is determined as a function of the value. In certain implementations, the act of determining the value comprises computing a sum of areas enclosed by respective turns of the first inductor. In some implementations, the value corresponds to the magnitude of a vector (e.g., a dipole moment) having a location substantially in the center of the first inductor. In such implementations, the act of determining the mutual inductance can comprise determining the flux of a magnetic field through surfaces subtended by turns of the second inductor, wherein the magnetic field is represented as being generated at the location of the vector and having a strength proportional to the value (e.g., a strength proportional to the dipole moment). In some implementations, the value is a first value and the mutual inductance is a first mutual inductance. In these implementations, the method for analyzing mutual inductance can further comprise determining a second value associated with the second inductor (the second value being representative of plural magnetic fields generated by respective turns of the second inductor), determining a second mutual inductance between the first inductor and the second inductor as a function of the second value, and determining a final mutual inductance value, wherein the final mutual inductance value is based at least in part on the first mutual inductance and the second mutual inductance. For instance, the act of determining the final mutual inductance value can comprise averaging the first mutual inductance and the second mutual inductance. In certain embodiments, a noise parameter based at least in part on the mutual inductance is determined. Further, in some embodiments, a location of one of the first inductor or the second inductor in the layout is modified based at least in part on the mutual inductance. In certain embodiments, the self and/or mutual inductances are stored in a database of inductances associated with the circuit layout.

In another exemplary embodiment, another method for analyzing mutual inductance between inductors in a circuit layout is described. In this embodiment, for example, circuit design information indicative of a first inductor and a second inductor is received. A dipole moment associated with the first inductor is determined, where the magnetic field associated with the dipole moment is representative of magnetic fields created by respective turns in the first inductor. A mutual inductance between the first inductor and the second inductor is determined by determining a magnetic flux of the magnetic field of the dipole moment through surfaces bounded by respective wire segments of the second inductor. At high frequencies, the act of determining the dipole moment comprises discretizing at least one straight segment of the first inductor into a plurality of filaments. The act of determining the magnetic flux can also comprise discretizing at least one straight segment of the second inductor into a plurality of filaments. In certain instances, the first inductor is a symmetric inductor. In these instances, the act of determining the dipole moment for the symmetric inductor can include determining a sum of areas of concentric polygons that form the symmetric inductor. In some instances, the first inductor is a spiral inductor. In these instances, the act of determining the dipole moment for the spiral inductor includes determining a sum of areas of concentric turns that form the first inductor. In some implementations, the self and/or mutual inductances are stored in a database of inductances associated with the circuit layout.

Another exemplary embodiment disclosed herein is a method for performing physical verification of a circuit layout. In this embodiment, a noise parameter indicative of inductance effects between at least a first inductor and a second inductor in the circuit layout is determined. To determine the noise parameter, magnetic fields produced by a plurality of turns of the first inductor during circuit operation are represented as a single value (e.g., as a dipole moment). Further, the circuit layout is modified based at least in part on the noise parameter. In some implementations, the single value corresponds to a magnitude of a vector located substantially at the center of the first inductor. Further, the single value can be associated with a dipole moment representative of the first inductor. In some implementations, and in order to determine the noise parameter, the single value is used to compute a mutual inductance between the first inductor and the second inductor.

In another exemplary embodiment disclosed herein, another method for performing physical verification of a circuit layout is described. In this embodiment, a noise parameter indicative of inductance effects between at least a first inductor and a second inductor in a circuit layout is determined. To determine the noise parameter, a mutual inductance between the first inductor and the second inductor is determined using a dipole approximation technique. The circuit layout is modified based at least in part on the noise parameter. In particular implementations, the dipole approximation technique comprises representing plural magnetic fields produced by respective turns of the first inductor during circuit operation as a representative magnetic field produced by a representative magnetic dipole, and determining a flux of the representative magnetic field from the representative magnetic dipole through the second inductor. In some implementations, skin effects are accounted for in the magnetic dipole approximation technique by respectively representing individual segments of the first inductor, the second inductor, or both as a plurality of filaments. Further, in some instances, at least one of the first inductor or the second inductor is a symmetrical inductor or a spiral inductor.

Any of the disclosed methods may be performed by a computer program, such as an electronic-design-automation (EDA) software tool comprising computer-executable instructions stored on a computer-readable medium. Further, any of the disclosed methods can be used to modify or design a circuit represented as circuit design information stored on a computer-readable medium. The circuit design information can comprise, for example, a circuit design database (such as a GDSII or Oasis file) and may be created or modified on a single computer or via a network. Additionally, data structures or design databases storing mutual inductance information determined using any of the disclosed methods are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 3B shows the cross section of the exemplary bundle. FIGS. 3A and 3B further illustrate the magnetic dipole that is representative of the exemplary bundle.

FIG. 4B shows the cross section of the exemplary bundle. FIG. 4A and FIG. 4B further illustrate the individual magnetic dipoles formed between the signal wire and the respective ground wires.

FIG. 6 is a flowchart of an exemplary method for analyzing the mutual inductance between two bundles using an embodiment of the disclosed dipole approximation technique.

FIG. 28 is a block diagram showing an exemplary configuration consisting of two different inductors.

FIG. 30 is a block diagram showing an exemplary transformation of an inductor into concentric polygons in order to calculate its dipole moment according to the method of FIG. 27.

FIG. 31 also shows the results obtained from a field solver for the same configuration.

DETAILED DESCRIPTION

I. General Considerations

Figure 1:
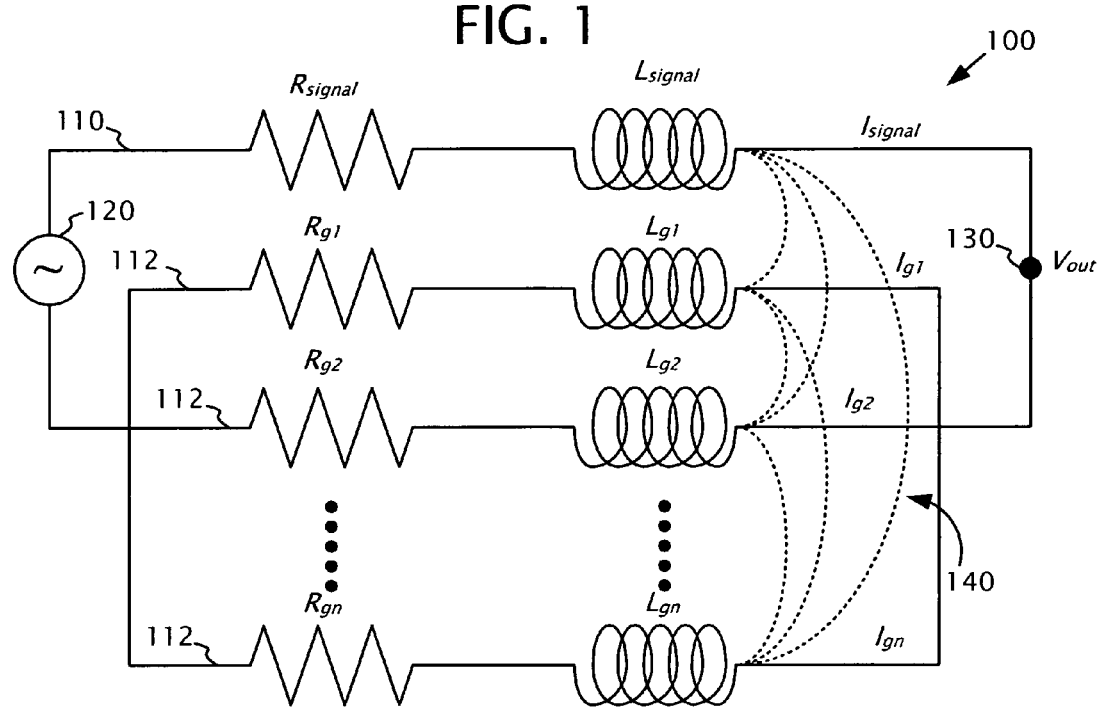
FIG. 1 is a block diagram of an exemplary wiring layout illustrating the various couplings between an exemplary signal wire and its multiple return paths.

As used in this application and in the claims, the singular forms "a," "an," and "the" include the plural forms unless the context clearly dictates otherwise. Additionally, the term "includes" means "comprises."

Disclosed below are representative embodiments of methods for determining mutual inductances between exemplary circuit structures, including intentional inductors. The disclosed methods should not be construed as limiting in any way. Instead, the present disclosure is directed toward all novel and nonobvious features and aspects of the various disclosed embodiments, alone and in various combinations and subcombinations with one another. The methods are not limited to any specific aspect or feature or combinations thereof, nor do the disclosed methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "compute" and "receive" to describe the disclosed methods. These terms are high-level abstractions of the actual operations that are performed. The actual operations that correspond to these terms will vary depending on the particular implementation and are readily discernible by one of ordinary skill in the art.

The disclosed technology can be used, for example, in the analysis of inductance noise among intentional inductors as are commonly used in RF analog or mixed-signal integrated circuits. The disclosed technology can be used, for example, to help minimize the noise due to mutual inductance by determining a placement of inductors that satisfies noise margins. It can also be used in the reverse sense (e.g., by grouping intentional inductors closer together to improve yield) while simultaneously satisfying noise limits.

The disclosed technology can generally be applied to any circuit or situation where inductance may affect signal delay or signal integrity. For example, the disclosed embodiments can be used to analyze inductance between a variety of electrical components on an integrated circuit (e.g., an application-specific integrated circuit (ASIC), a programmable logic device (PLDs) such as a field programmable gate arrays (FPGA), a system-on-a-chip (SoC), or a microprocessor) or in components at the board or package level (e.g., multilayered packages or printed circuit boards). For example, the disclosed embodiments can be used to analyze inductance between one or more intentional inductors on an RF circuit.

Any of the disclosed methods can be performed using software stored on one or more computer-readable media and executed on a computer. Such software can comprise, for example, an electronic-design-automation (EDA) software tool used, for instance, for physical verification or synthesis. For example, embodiments of the disclosed techniques may be utilized in an EDA synthesis tool and used to evaluate and determine placement strategies. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in detail.

Further, any of the disclosed methods can be used to modify or design a circuit represented as circuit design information stored on computer-readable media. The circuit design information can comprise, for example, a design database (such as a GDSII or Oasis file) and may be created or modified on a single computer or via a network. Additionally, mutual inductance information determined using any of the disclosed methods may be included in one or more data structures or design databases stored on computer-readable media (e.g., a SPICE file, a file for use with Eldo from Mentor Graphics Corporation, or the like).

The disclosed methods can be used at one or more stages of an overall synthesis scheme. For example, any of the inductance analysis methods disclosed can be used during physical synthesis (e.g., during the physical verification process) in order to evaluate and improve the layout of a circuit. The resulting circuit designs (e.g., circuit designs modified or evaluated using any of the disclosed techniques) can be used to implement a wide variety of electronic devices. For example, any of the embodiments described herein can be used as part of a synthesis scheme for designing and verifying circuits that use intentional inductors, such as cell phones, personal digital assistants, mobile media players, and laptop computers.

II. Introduction to the Disclosed Technology

A. The Partial-Inductance and Loop-Inductance Approaches in General

In general, there are two common approaches for analyzing inductance in the paths of an integrated circuit. These two approaches may be categorized as: (1) the loop-inductance approach; and (2) the partial-inductance approach (sometimes termed the partial-element-equivalent-circuits (PEEC) model). The disclosed embodiments generally concern methods for efficiently calculating mutual inductances using the loop-inductance approach. More specifically, certain embodiments of the disclosed technology concern calculating mutual inductances in terms of the magnetic fields generated by magnetic dipoles that are representative of current loops in the layout of signal wires and ground wires in an integrated circuit design. Before describing the disclosed methods, however, a brief discussion of the loop-inductance approach and the partial-inductance approach, as well as some of the problems of the partial-inductance approach (e.g., the high density of its inductance matrix (M)), is provided.

In both approaches, the energy W associated with a set of two currents $I_i$ and $I_j$ running along loops $C_i$ can be found as follows:

$$W = \frac{1}{2}\sum_i \sum_j W_{ij}, \quad (1)$$

and $$W_{ij} = I_i I_j M_{ij},$$

where $M_{ij}$ is the i,j element of the inductance matrix. The inductance matrix element $M_{ij}$ can be determined as follows:

$$\begin{aligned} M_{ij} &= \frac{\Psi_{i \to j}}{I_i} \\ &= \frac{1}{I_i}\int_{S_j} B^{(i)} \cdot dS_j \\ &= \frac{\mu_0}{4\pi}\left\{\oint_{C_i}\oint_{C_j}\frac{d\ell_i \cdot d\ell_j}{|r_i - r_j|}\right\}_{\substack{\text{conductors'}\\\text{cross-sections}}}, \end{aligned} \quad (2)$$

where $\Psi_{i \to j}$ is the magnetic flux due to the magnetic induction field $B^{(i)}$, $S_j$ is the surface bounded by $C_j$, generated by the time-varying current $I_i$ acting on $I_j$. In Equation (2), the quasi-magneto-static regime is assumed, so the currents $I_i$, $I_j$ are considered to be uniform over the transverse cross sections and it is possible to equalize the last two equations.

In the loop-inductance approach, the integrals in Equation (2) can be evaluated over closed loops. By contrast, in the partial-inductance approach, the loops are segmented, and each segment is assumed to form part of a loop that closes at infinity. Because the partial-inductance approach includes mutual inductances between every pair of conductors in the circuit design, the resulting matrix can be very dense.

The denseness of the partial-inductance matrix is primarily due to the long distance behavior of the partial inductance matrix M, which is essentially non-physical. In fact, for large wire separations r, the per unit length matrix element $m_{ij}$ behaves as:

$$m_{ij}(r) \equiv \frac{M_{ij}(r)}{L} \sim -\log(r), \quad (3)$$

where L is their common length.

The logarithmic decrease with distance manifests itself in two-dimensional as well as three-dimensional treatments. In the three-dimensional case, however, the constant coefficient log(2L) appears, which is absent in the two-dimensional case. Using Grover's equations (see F. Grover, *Inductance Calculations Working Formula and Tables*, New York: Instrument Society of America (1945)), it can be shown that the ratio of $M_{ij}$ between a filament i and its neighbors to the corresponding diagonal term $L_i$ has the following limit at large distances (for large r, r<L):

$$\frac{M}{L} \sim 1 - \frac{\log(r/w)}{\log(2L)} \to 1, \quad (4)$$

where w represents the cross section of the wire (e.g., the width of a square signal trace).

Equations (3) and (4) result in M being dense and not diagonally dominant. A strictly diagonally dominant real matrix is one in which the sum of the absolute values of off-diagonal elements for each row is strictly smaller than the absolute value of the diagonal counterparts. For a symmetric matrix with diagonal elements that are strictly positive, diagonal dominance is a sufficient condition for the matrix having real and strictly positive eigenvalues. Moreover, neglecting small off-diagonal terms in a matrix of this type does not change the sign of its eigenvalues. Matrices of this kind can be sparsified by neglecting small off-diagonal terms, without resulting in a possible passivity violation. Positive definite matrices that do not satisfy the requirement of being strictly diagonally dominant, on the other hand, can display unwanted instabilities of the following kind: setting to zero seemingly negligible off-diagonal contributions can alter the sign of the eigenvalues of M, a violation of passivity for linear systems. A system designer is then left with two unwanted choices when working with M (particularly with respect to the PEEC method): either sparsify and have passivity violations, or have very large matrices and rapidly increase the complexity of downstream circuit simulation.

To investigate the primary source of the denseness of the partial-inductance matrix, consider the following proposition: the asymptotic behavior of the partial-inductance model shown in Equation (3) results from the following large distance behavior of B:

$B(d) \sim 1/r^2$ in three dimensions, and $B(d) \sim 1/r$ in two dimensions. (5)

This first proposition can be verified by directly substituting Equation (5) into Equation (2), and counting powers in the integrand to estimate the asymptotic behavior.

The first proposition is based on a second proposition: the asymptotic behavior of Equation (5) results from the presence of unbounded current distributions. To show the basis for this second proposition, consider Ampere's law in the two-dimensional case for an infinitely long filament:

$$\oint B \cdot dl = \mu_0 I. \quad (6)$$

Extracting B gives:

$$B(r) = \frac{\mu_0 I}{2\pi r} \quad (7)$$

$$m(r) = \frac{\int B dr}{I} = \frac{\mu_0}{2\pi} \log\left(\frac{r}{w}\right),$$

which gives Equation (3).

In the three-dimensional case, consider the vector potential A:

$$A(r) = \frac{\mu_0}{4\pi} \int_V \frac{J(r')}{|r - r'|} d^3 r', \quad (8)$$

and carry out a multi-pole expansion of Green's Function:

$$\frac{1}{|r - r'|} = \frac{1}{|r|} + \frac{r \cdot r'}{|r|^3} + \ldots, \quad (9)$$

giving:

$$A_i(r) = \frac{\mu_0}{4\pi}\left(\frac{1}{|r|}\int_V J_i(r')d^3 r' + \frac{r}{|r|^3}\int_V r' J_i(r')d^3 r' + \ldots\right). \quad (10)$$

For $B(r) \sim 1/r^2$ (which is required from Equation (3)), the first terms in Equation (10) must be different than zero. On the other hand, it is known that for any bounded current distribution in the quasi-static regime where $$\frac{\partial \rho}{\partial t} = 0,$$

with ρ being the charge density, the integral in the first term of Equation (10) vanishes (the volume V of integration includes the entire current distribution). Thus, under quasi-static conditions and for bounded current distributions, the value of A will decrease for large distances at least as rapidly as $1/r^2$. Using $B = \nabla \times A$, it can be concluded for bounded physical systems that:

$B \sim 1/r^3$ (11)

This result suggests that Equations (3) and (5) are invalid and indicates that the partial-inductance method is in violation with the asymptotic behavior required by Maxwell's equations. Consequently, one of the underlying assumptions (bounded current distributions or quasi-static conditions) of the partial-inductance model needs to be removed. Dropping the assumption of bounded current distributions, however, suggests the presence of magnetic monopoles, but dropping the quasi-static assumption requires a complete reformulation of the approach. Thus, the behavior in Equation (5) within the partial-inductance model is only understood by accepting the existence of magnetic monopoles in violation of Maxwell's equations. In the partial-inductance model, the correct physical behavior of electromagnetic theory is recovered downstream during the circuit simulation phase of the flow. During this phase, circuits are necessarily closed by virtue of the Kirchoff Voltage Laws (KVL). An inherent result of the method is that large cancellations involving different length scales occur, mixing short distance with long distance. Although the correct physical theory is recovered, the size of the mutual inductance matrix needed for timing simulation is increased. Issues related to capacity and numerical accuracy are unavoidable in this model. By contrast, the loop-inductance model preserves the correct physical model for analyzing inductance throughout and utilizes an inductance matrix that is substantially less dense than in the partial-inductance model.

There have been numerous efforts made to improve the partial-inductance model. The underlying goal of many of these efforts has been to sparsify the dense M matrix while preserving the positive definiteness of the matrix. The behavior of magnetic fields within the partial-inductance formalism (magnetic fields being produced by magnetic monopoles) is formally equivalent to that of electrical fields being produced by point charges. This similarity has inspired some researchers to explore the notion of inverse methods. Generally speaking, these methods usually consist of first inverting locally the M matrix, then sparsifying the $K \equiv M^{-1}$ matrix. The analogy extends to C and K, which play similar roles in the electrostatic and magneto-static problems, respectively (that is, $Q=C\Delta V$, $j\omega I=K\Delta V$). However, there is an important difference between the two cases: for the C matrix, the local truncation prior to inversion is well justified due to the fact that C, in the Maxwell sense, is diagonally dominant by construction, and thus any truncation preserves positive definiteness.

At variance with C, the matrix K is not physical, and it is not obvious how to extend the concept of shielding that is present in the electrostatic case. The shielding of electrical fields by conductors causes the electrical field (E) to be localized in a dense-wire environment, thus making the C matrix sparse. In the magneto-quasi-static case, however, there is no physical equivalent to shielding, currents and the magnetic field (B) fully penetrate the conductors. Nonetheless, it can be empirically verified that K is sparse, indicating the strength of using the partial-inductance model followed by inverse methods. A loop inductance method, on the other hand, has inherent localization properties that can be derived while preserving the correct physical theory (as shown and discussed below with respect to Equation (29)).

B. Positive Definiteness of the Loop Inductance Matrix

Figure 12:
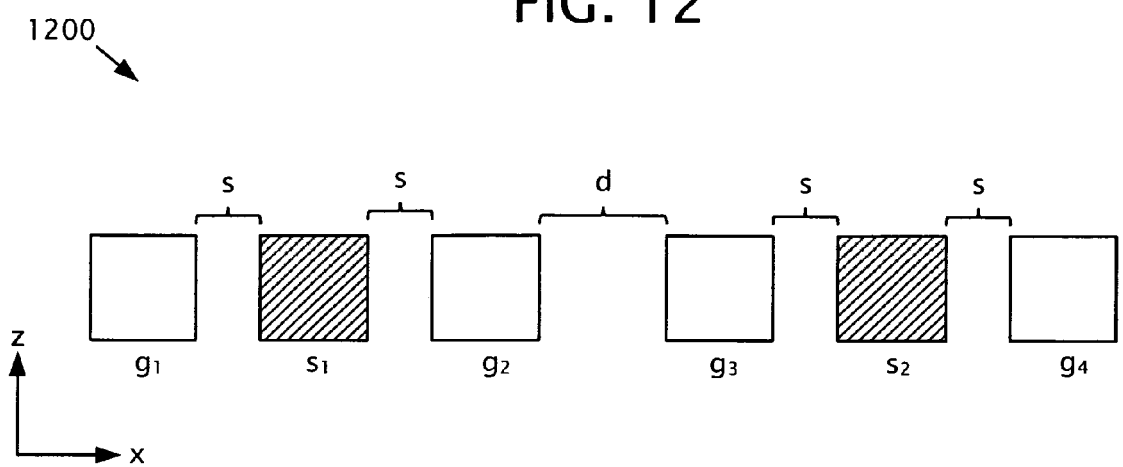
FIG. 12 is a block diagram illustrating a wiring layout having two symmetric signal-wire and ground-wire configurations.

A number of observations can be made that support the position that the loop inductance matrix M is diagonally dominant for configurations where there are no shared return paths. For example, consider an exemplary worst-case configuration, where values of the diagonal elements are as small as possible, and the corresponding values of the off-diagonal elements are as large as possible. FIG. 12 is a block diagram 1200 illustrating a representative worst-case configuration. In FIG. 12, the return path of signal wire $s_1$ consists of the parallel combination of ground wires $g_1$ and $g_2$, while for signal wire $s_2$, it consists of ground wires $g_3$ and $g_4$. To minimize loop self inductance of one signal wire, the corresponding return paths need to be as close as possible to the signal wire. Furthermore, to maximize the mutual loop inductance between the two signals, it is necessary to minimize the distance between the two circuits. The minimum distance for purposes of this example is selected as a value that is typical for 90 nm processes. In particular, the minimum value of inter-wire separation ($s_{min}$) is selected as 0.2 μm for representative wires of low resistance having a wire width (w) of about 1 μm. Assuming that $d=s=s_{min}$ and that the configuration 1400 has equal wire widths (w), the inductance-per-unit-length matrix is:

$$M = \begin{pmatrix} 2.96 & 0.07 \\ 0.07 & 2.96 \end{pmatrix} nh/cm.$$

The ratio δ of self to mutual inductance for this example is about 42. The above matrix is diagonally dominant. To violate the condition of diagonal dominance, at least δ worst-case circuits separated by $s_{min}$ are needed—an unfeasible configuration.

Consider now, a small increase of 1 μm in the separation (d) between the two initial circuits. As a result, δ climbs to 132. This fast climb reflects the power-law nature of the loop inductance variation with distance (which is discussed below with respect to Equation (29)). For feasible wire densities, the self inductance will be larger than the sum of the magnitudes of the mutual inductances with the other circuits. Therefore, for all practical purposes, the matrix M will be diagonally dominant.

Figure 13:
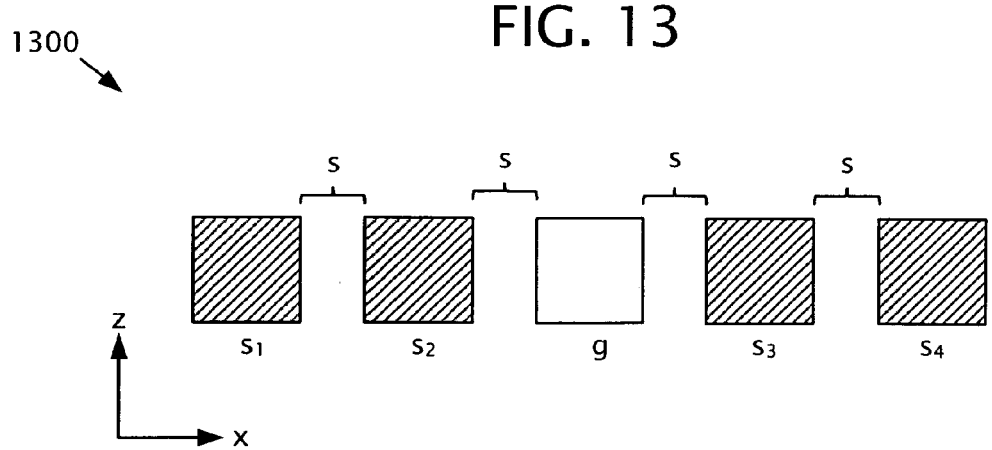
FIG. 13 is a block diagram illustrating a wiring layout having a shared ground wire.

When different signal wires share return grounds, however, the above argument is no longer valid. Consider, for example, the exemplary configuration shown in block diagram 1300 in FIG. 13. Using the same values for the wire separation ($s_{min}$) and width (w) as in the previous example, the following 4×4 matrix results:

$$M = \begin{pmatrix} 7.8 & 3.9 & 1.6 & 2.5 \\ 3.9 & 4.9 & 1 & 1.6 \\ 1.6 & 1 & 4.9 & 3.9 \\ 2.5 & 1.6 & 3.9 & 7.8 \end{pmatrix} nh/cm$$

This matrix M (calculated from Grover's expressions) is positive definite but not diagonally dominant. It can therefore be concluded that, in the absence of shared ground return paths, the inductance matrix will be diagonally dominant in the loop formalism. This is not the case in the partial inductance formalism, as can be concluded from Equation (4).

In this disclosure, the contributions to the inductance matrix arising from signal-wire segments which are separated by relatively long distances are analyzed and modeled. These wire configurations typically do not lead to shared ground configurations and the resulting diagonal dominance problems.

C. Return Path Selection

One difference between the partial-inductance model and the loop-inductance model is that the partial-inductance model does not require prior identification of the return paths that are followed by currents in the signal wires. Instead, the partial-inductance model defines each segment of a loop as having its own return loop at infinity. As more fully explained below, however, the uncertainties that may result in the loop-inductance model from this issue are limited to low frequencies, where inductance effects are unimportant.

Throughout this disclosure, the concept of a "bundle" is used. A bundle comprises a set of parallel wires of equal length comprising one signal-wire segment and its possible one or more return-path segments (sometimes referred to herein as "ground-wire segments"). The current loops within a bundle comprise the set of one or more closed loops formed between the return-path segments and one common segment (namely, the signal-wire segment). The set of closed loops may contain only one closed loop if there is only one return-path segment associated to the signal-wire segment. The small segments in the orthogonal direction that close the loops are usually neglected. By contrast, this neglecting is not done in the exemplary embodiment concerning intentional inductors.

According to one exemplary embodiment, bundles can be generated by fracturing a layout database. For example, the path of each signal wire can be decomposed into the union of a set of non-overlapping segments whose ends are identified by discontinuities (changes of layer or direction) either in the signal path or in the path of any of its neighboring return-path segments. Thus, for each signal-path segment, there is a set of one or more return-path (or ground-wire) segments that have the same length and form part of the bundle.

Bundles also have an orientation. For example, in a Manhattan layout, bundles are oriented along the x- and y-axes. Further, different bundles in the same path of a net typically have a different length. The process of selecting return paths can be performed independently for each bundle. When two bundles corresponding to different signals share one or multiple ground-wire segments (that is, have a shared return path or paths), the configuration is said to be a degenerate configuration. The concept of a degenerate configuration for a shared ground is generally applicable at the bundle level only. This means, for example, that two different signal segments of the same wire may belong to two different bundle configurations (e.g., one that is degenerate, one that is not). Bundles that are not degenerate can be treated independently from one another. The shared ground configuration discussed above with respect to FIG. 13 is a degenerate configuration and constitutes a very limited subset of all possible shared ground configurations. The criteria that may be used in selecting which ground-wire segments to choose during the bundle-formation process are discussed in more detail below.

Consider the resistance of a bundle (R) and the self inductance of a bundle (L). The frequency dependent impedance of the bundle is given by:

$$Z(\omega) = R + j\omega L. \quad (12)$$

In general, the return path for a particular signal-wire segment is the one that minimizes the impedance (Z). At low frequencies ($\omega$), impedance minimization corresponds to minimizing the resistance (R), whereas for high frequencies ($\omega$), impedance minimization requires minimizing the self inductance (L).

As an example, consider the exemplary wiring configuration shown in FIG. 1. FIG. 1 shows a wiring layout 100 comprising copper wires as may be used for clock signal routing in a 90 nm CMOS process. Assume for purposes of this example that the loop inductance per unit length (l) is $10^{-7}$ H/m, while the loop resistance per unit length (r) is 5000 $\Omega$/m. As illustrated in FIG. 1, wiring layout 100 comprises a signal path 110 (labeled as "signal") and n return paths 112 (labeled as "$g_1$," "$g_2$," ..., and "$g_n$," respectively). Together, the signal path 110 and the return paths 112 form a loop originating at a voltage source 120 and ending at the node 130 (labeled "$V_{out}$"). The number of possible return paths is not limited, as any number of return paths greater than or equal to one is possible. Each path 110, 112 further includes an associated current (labeled respectively as "$I_{signal}$," "$I_{g1}$," "$I_{g2}$," and "$I_{gn}$"), resistance (labeled respectively as "$R_{signal}$," "$R_{g1}$," "$R_{g2}$," and "$R_{gn}$") and self-inductance (labeled respectively as "$L_{signal}$," "$L_{g1}$," "$L_{g2}$," and "$L_{gn}$"). Each path 110, 112 additionally includes an associated mutual inductance between itself and every other path in the wiring layout 100. For purposes of simplifying the illustration in FIG. 1, these mutual inductances are shown as dotted lines 140 between the mutually coupled paths and are not individually labeled.

With reference to the wiring layout 100 illustrated in FIG. 1, four frequency regimes can be defined, the numbers correspond to IC applications: (1) low frequencies, where r>>$\omega$l (e.g., signal frequencies less than 1 GHz); (2) intermediate frequencies, where r≧$\omega$l (e.g., signal frequencies less than 8 GHz); (3) high frequencies, where r<$\omega$l and current distribution within the conductors is still uniform (e.g., signal frequencies between 8 and 15 GHz); and (4) very high frequencies, where r<<$\omega$l and current distribution is no longer uniform (e.g., signal frequencies greater than 15 GHz).

These exemplary frequency ranges should not be construed as limiting, as they are approximate ranges used to illustrate certain behavioral aspects of wiring layouts at various frequencies. In general, the first two regimes are resistance dominated. As the frequency increases into the third regime, however, significant inductance effects begin to appear and are desirably accounted for. To illustrate the impact of these frequency regimes on the return-path selection process, consider the self inductance of a wire configuration in the loop-inductance model having a signal wire and its (not necessarily coplanar) return paths. With reference to FIG. 1, the current $I_i$ running along each return path 112 when a unit amplitude voltage source 120 is connected between the signal and the n return paths of the bundle can be found by:

$$\Delta V = ZI, \quad (13)$$

where, $$\Delta V = \begin{pmatrix} 1 - V_{out} \\ -V_{out} \\ \vdots \\ -V_{out} \end{pmatrix}, I = \begin{pmatrix} I_{signal} \\ I_1 \\ \vdots \\ I_n \end{pmatrix}, \text{ such that } \sum_{i=0}^{n} I_i = 0. \quad (14)$$

These currents $I_i$ give the (complex) weight of each return path within each bundle. Normalized by the current $I_{signal}$, their sum is unity. Further, the value $\alpha_i$ can be defined as:

$$\alpha_i \equiv \frac{I_i}{I_{signal}}. \quad (15)$$

Solving Equation (13) can be computationally expensive when there are a large number of return paths in a bundle because it requires the calculation of the inverse of an (n+1)×(n+1) matrix. Generally, a large number of return paths is needed only for layouts operating in the first regime, where currents can go relatively far from the signal path to find low-resistivity return paths. In this low-frequency regime, however, the inductance component can be neglected in the computation of $I_i$. Thus, for the first regime, $\alpha_i \propto R_i^{-1}$.

For a signal wire operating in the first regime (e.g., less than 1 GHz), the dominant term $R_{loop}$ can be minimized by including as return paths all parallel ground wires ordered by their resistance. For layouts operating in this regime, the distance between signal and ground(s) is typically not important. Return paths that are relatively far away contribute to make the overall inductance large, but the impact of Z is still small since the frequency is relatively low. This balance explains the large possible spread of return path choices. Given two signal wires operating in the first regime, the chances that they have degenerate configurations is relatively high.

For a signal operating in the second regime, where resistance and inductance contributions are of the same order of magnitude but where resistance still dominates, the choice of return path(s) involves a balance between minimizing resistance and minimizing inductance (thus impacting the length of the overall path as well as the separation (d) from the signal wire). According to one exemplary embodiment, a compromise can be obtained by including as return paths wires organized according to resistance up to a maximum distance for the signal wire. This maximum distance may depend on the particular wire configuration and the relevant operating frequency. A weighted function that accounts for both resistances and distances, for example, may be used.

For signals operating in the third regime (e.g., between 8 and 15 GHz), inductance becomes much more important. Further, the set of coefficients $\alpha_i$ computed in Equation (15) and having appreciable contributions will correspond to close-by neighbors, which have a minimal contribution to the loop inductance. In this regime, mutual inductance can be particularly important in signal noise calculations. According to one exemplary embodiment, a predetermined number of the closest neighbors within a certain distance are selected for return paths (e.g., one or two). Alternatively, a weighted function, such as the one described above, may be used with different coefficients. Other functional relationship may also be used to select the return paths.

Finally, for signals in the fourth regime (e.g., greater than 15 GHz), resistance effects become insignificant and desirably may be ignored. In this case, any close neighbor ground or signal can act as a valid return path. Because the number of close ground neighbors is small, full inversion methods are used in one exemplary embodiment to compute $\alpha_i$.

It can be observed from these regimes that, in general, when the current distribution is uniform, loop self inductance decreases with frequency in going from the first regime onwards. In the fourth regime, however, currents cease to be uniform, and there are manifestations of the proximity effect (associated with the skin effect). Selecting a return path configuration from a pool of ground wires is relatively uncomplicated for signals operating in the second, third, and even in the fourth frequency regimes. By using a loop-inductance approach in these regimes, mutual inductance extraction can be performed more efficiently than conventional partial-inductance techniques. Further, by using a loop-inductance approach, the size of the underlying inductance matrix can be decreased because several resistances and inductances in the equivalent circuit representation may be combined together. For example, the method described in R. Escovar and R. Suaya, "Transmission Line Design of Clock Trees," in *Proc. IEEE/ACM International Conference on CAD*, November 2002, pp. 334-340, may be utilized to combine the resistances and the inductances.

D. Mutual Inductance Analysis Using a Representative Magnetic Dipole

Exemplary embodiments of a method for analyzing mutual inductances utilizing the concept of "bundles" introduced above are described below. To develop a method to compute the mutual inductance between bundles $M_{ab}$ (i.e., the off-diagonal terms in the Z matrix), it is desirable to arrive at an expression for mutual inductance analogous to Equation (1), but for bundles ($M_{ab}=W_{ab}/(I_a I_b)$ for currents $I_a$ and $I_b$ running along the respective signal wires of bundles a and b). For this purpose, consider again Equation (1), where subindexes i and j now represent the wires in bundles a and b, respectively. The current $I_b$ can be divided among the return paths according to the coefficients $\alpha_j$:

$$I_j = \alpha_{b,j} I_b \text{ with } \alpha_{b,0} = 1, \sum_{j\geq 1} \alpha_{b,j} = -1. \tag{16}$$

Consequently, $W_{ab}$ in Equation (1) can be factored as:

$$W_{ab} = \frac{I_b}{2} \sum_{j\geq 1} \alpha_{b,j} \Psi_{a\to j}. \tag{17}$$

Figure 2:
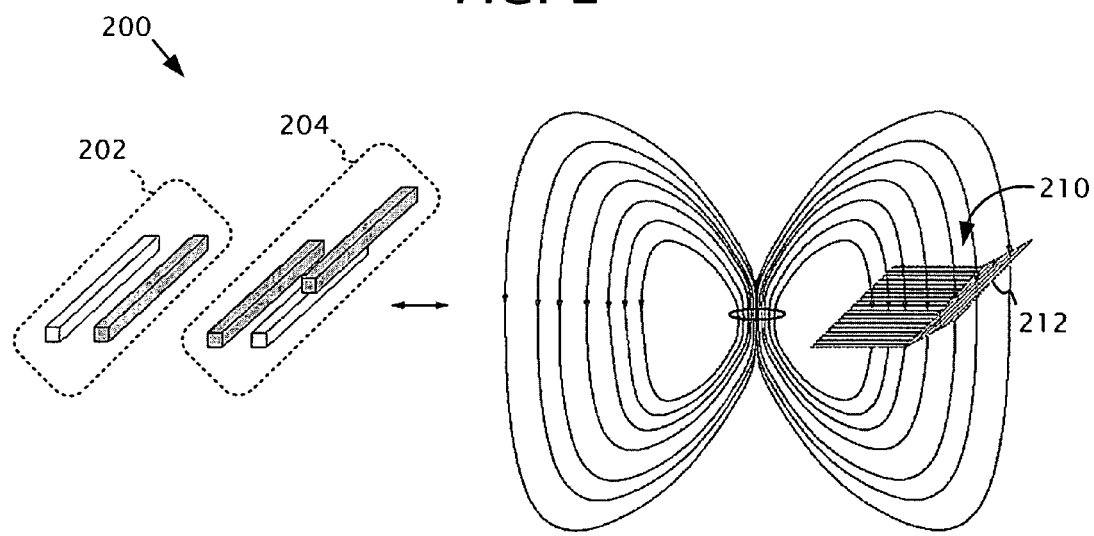
FIG. 2 is a block diagram illustrating the magnetic flux of a first group of current loops through a second group of current loops.

Here, $\Psi_{a\to j}$ is the magnetic flux of all wires in bundle a through the surface of an elementary closed loop $S_j$ of bundle b formed between the signal-wire segment of bundle b and respective return-path segments j. For example, FIG. 2 is a block diagram 200 illustrating the magnetic flux 210 of a first exemplary bundle 202 (bundle a in the equations) through the surface 212 of the closed loop $S_j$ of a second exemplary bundle 204 (bundle b in the equations). In Equation (17), the fact that the loops in the second bundle 204 are not really closed (they are missing the perpendicular segments at the ends) can be ignored in certain embodiments because the error introduced by the absence of the segments is small so long as the transverse dimensions (the lengths of the missing segments) are small compared to the length of the bundle and the separation between the bundles.

The fluxes can be computed using Stokes' theorem as follows:

$$\Psi_{a\to j} = \int\int_{S_j} (\nabla \times A^{(a)}) \cdot dS_j = \oint_{\partial S_j} A^{(a)} \cdot d\ell_j, \tag{18}$$

where $A^{(a)}$ is the vector potential due to all wires in bundle a, and $\partial S_j$ is the boundary of the surface of the closed loop $S_j$.

To split the closed curvilinear integral in Equation (18) into two rectilinear integrals (one over the signal wire, the other over the return path j), the contribution from the last integral should be multiplied by −1 because the closed integral is circulated in one definite sense. Summing up all the terms, expression (18) becomes:

$$W_{ab} = \frac{I_b}{2} \sum_{j\geq 0} \alpha'_{b,j} \int_{C_j} A^{(a)} \cdot d\ell_j, \tag{19}$$

where $C_j$ is the conductor $j\geq 0$, and $\alpha'_{b,j}=-\alpha_{b,j} \forall j\geq 1$.

As explained below, a technique utilizing magnetic dipole calculations can be used to efficiently calculate the interaction between the two bundles. For example, in certain embodiments of the disclosed technology, the field due to all the current loops in bundle a can be considered as the one generated by a representative dipole moment $p_a$. The mutual inductance between two bundles can then be found by calculating the magnetic flux due to the representative dipole moment of bundle a through surfaces in the bundle b formed between the respective signal-wire segment of bundle b and its corresponding ground-wire segments, and performing a weighted average of the individual contributions of all such surfaces in bundle b.

Figure 3A:
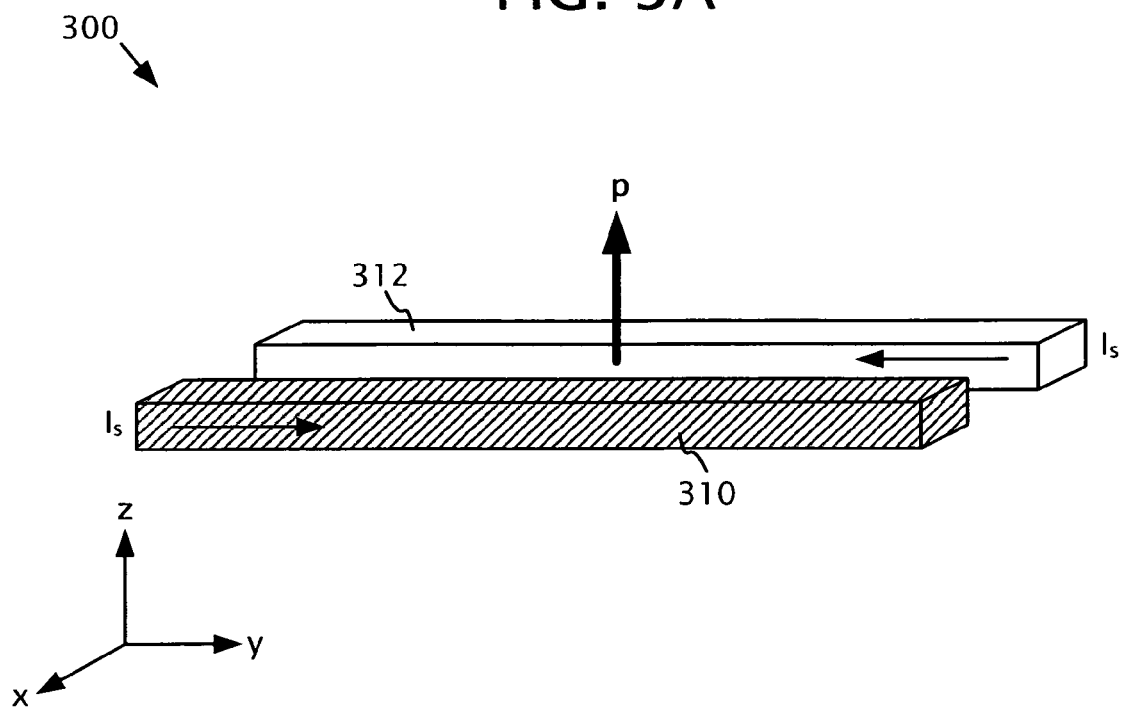
FIGS. 3A and 3B are block diagrams illustrating an exemplary bundle comprising a signal wire and a single associated ground wire.
Figure 3B:
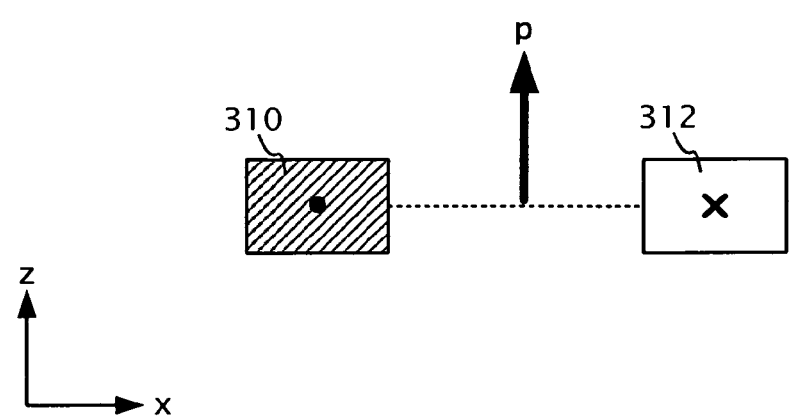

To compute the value of $p_a$, consider the dipole of an exemplary bundle configuration as shown in FIG. 3A. FIG. 3A is a block diagram 300 showing a perspective view of a signal-wire segment 310 that is parallel to a return-path segment 312 with segments 310, 312 both lying in a common x-y plane. FIG. 3B is a block diagram 350 showing a cross-sectional view of the configuration shown in FIG. 3A. In this simple case:

$$p_a = \frac{\mu_0}{8\pi} \int r \times J(r) d^3 r \qquad (20)$$
$$= \frac{\mu_0}{8\pi} ILs\hat{z},$$

where L is the common length of the two wires 310, 312, and s is the separation between them (note that $p_a$ is proportional to the area spanned by the circuit and points in the direction $\hat{z}$ normal to the plane containing them).

Figure 4A:
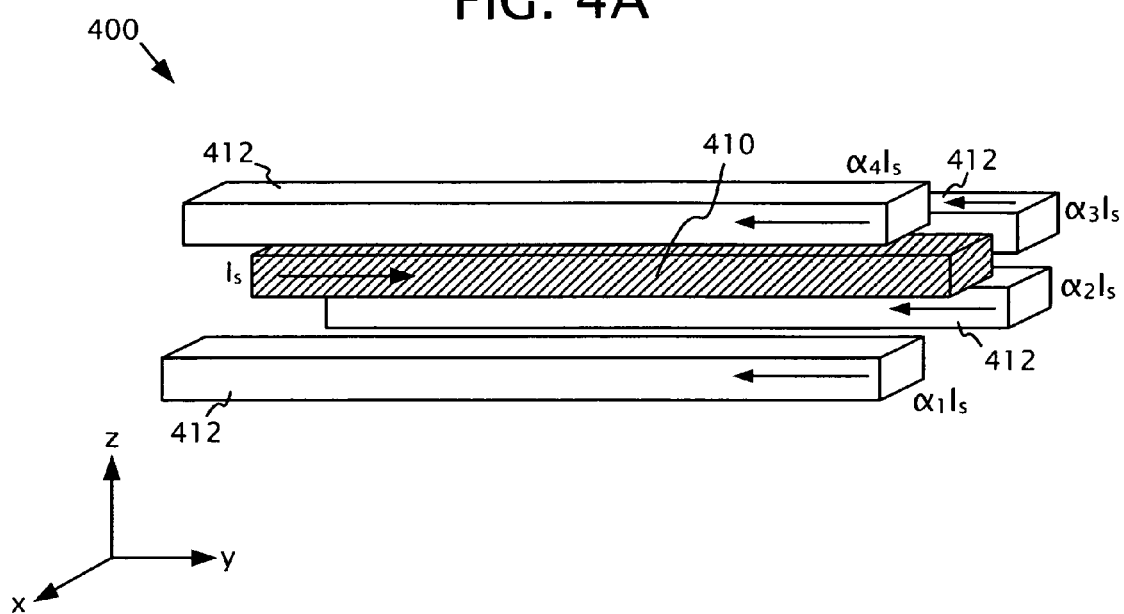
FIGS. 4A and 4B are block diagrams illustrating an exemplary bundle comprising a signal wire and multiple associated ground wires.
Figure 4B:
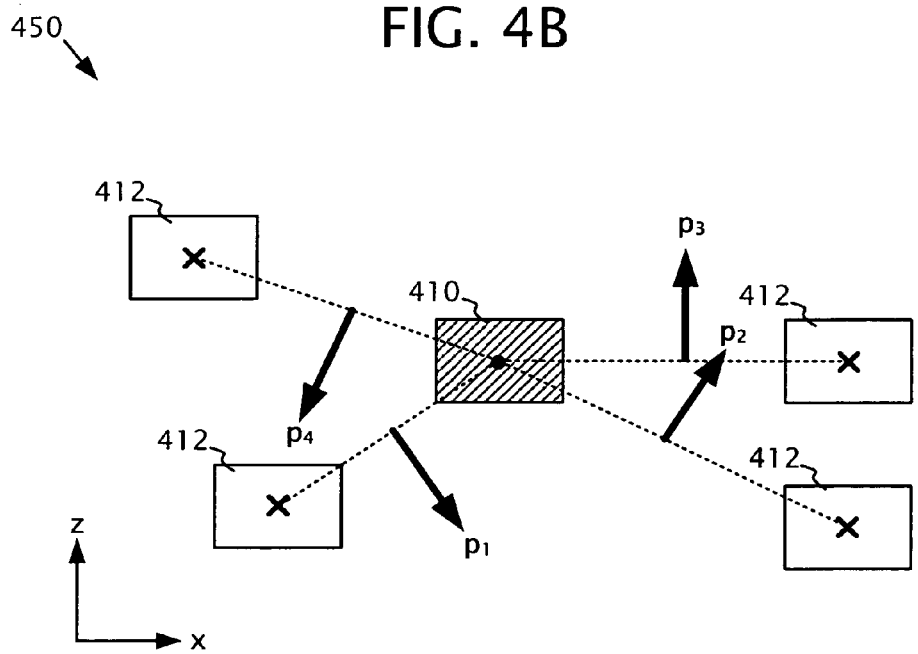

An example of the case where bundles have multiple return paths is shown in FIGS. 4A-B. FIG. 4A is a block diagram 400 showing a perspective view of a signal wire 410 having return paths along four neighboring wires 412 (labeled "$\alpha_1 I_s$," "$\alpha_2 I_s$," "$\alpha_3 I_s$," and "$\alpha_4 I_s$," respectively). FIG. 4B is a block diagram 450 showing a cross-sectional view of the configuration shown in FIG. 4A. For bundles having multiple return paths (here, oriented along the y axis), the integral in the first line of Equation (20) can be decomposed into several terms like the one in the second line of the equation. Because each of those terms is proportional to the current it carries, the terms can be weighed by geometrical coefficients $\alpha_i$, i ∈ a as in Equation (17). The expression for the magnetic dipole moment in this case becomes:

$$p_a = \frac{\mu_0}{8\pi} I_a \sum_{i \geq 0} \alpha_{a,i} (\hat{y} \times r_i), \qquad (21)$$

where $r_i$ is the position of the return path i with respect to the signal wire and a identifies the bundle.

Because the total current in a bundle adds up to zero, the value obtained by equation (21) is independent of where the origin of coordinates is located. In one exemplary embodiment of the disclosed technology, the origin is chosen as the position of the "center of mass" of bundle a. Specifically, the center-of-mass position $r_{cm,a}$ can be found as follows:

$$r_{cm,a} = \frac{1}{2} \sum_{i \geq 1} \alpha_{a,i} r_i. \qquad (22)$$

Thus, according to Equation (22), the center-of-mass position is the weighted average of the position of all the constituent dipole moments of the form shown in Equation (20) above.

The expression for the vector potential A at position r due to a dipole $p_a$ at this respective origin is:

$$A^{(a)} = \frac{p_a \times r}{r^3}. \qquad (23)$$

The $1/r^2$ behavior of A corresponds to the $1/r^3$ behavior for B indicated by Equation (11).

By inserting Equation (23) into Equation (19), an expression can be obtained which provides a closed expression of the mutual inductance ($M_{ab}$) between bundles a and b using the representative dipole $p_a$:

$$M_{ab} = \frac{1}{I_a} \sum_{j \geq 0} \alpha'_{b,j} \int_{C_j} \frac{(p_a \times r_j)}{r_j^3} \cdot d\ell_j. \qquad (24)$$

In general, the resulting inductance matrix M is complex, with the real part of Equation (24) contributing to the mutual inductance. The imaginary part of M modifies the resistance, and is effectively negligible in all the examples presented herein.

Inspection of Equations (21) and (24) shows that dipole moment $p_a$ is proportional to $I_a$; hence, $M_{ab}$ does not depend on the currents, but is instead a geometric coefficient. For the ease of presentation, the term $p_a/I_a$ is hereafter denoted: $\tilde{p}_a$.

As noted above, conductors in a bundle typically run along the same direction (say $\hat{y}$); thus, $p_a$ is perpendicular to all the wires. According to one exemplary form, the $\hat{z}$ axis is chosen to be parallel to the dipole moment $p_a$. Equation (24) therefore becomes:

$$M_{ab} = \tilde{p}'_a \sum_{j \geq 0} \alpha'_{b,j} x_j \int_{y_{0,j}}^{y_{1,j}} \frac{dy}{(x_j^2 + y_j^2 + z_j^2)^{3/2}}, \qquad (25)$$

where $y_{0,j}$ and $y_{1,j}$ are the extremes of conductor j, in a coordinate system having an origin at $r_{cm,a}$. The expression in Equation (25) can be integrated as follows:

$$M_{ab} = \tilde{p}_a \sum_{j \geq 0} \frac{\alpha'_{b,j} x_j y_j}{(x_j^2 + z_j^2)(x_j^2 + y_j^2 + z_j^2)^{1/2}} \Bigg|_{y_j = y_{0,j}}^{y_j = y_{1,j}}. \qquad (26)$$

Thus, according to one exemplary embodiment, the mutual inductance between a first bundle (bundle a) and a second bundle (bundle b) can be performed by calculating the dipole moment and the position of the first bundle using Equations (21) and (22), then evaluating the expression (26) for each of the wires in the second bundle. An expression for the dipole moment $p_a$ for wires laid out along other axes (e.g., the x-axis) can similarly be constructed.

Note that Equation (24) does not strictly comply with the expected symmetry $M_{ab} = M_{ba}$. This results from the assumption that bundle a is an ideal point-like dipole, whereas this is not assumed for bundle b. As explained in the discussion accompanying the examples below, this asymmetry is rarely significant. In certain embodiments, the expected physical symmetry can be enforced by identifying M with $$\tilde{M}_{ab} = \frac{M_{ab} + M_{ba}}{2} \qquad (27)$$

E. Comparison to Classical Equations

To evaluate the disclosed mutual inductance extraction technique using dipole approximations, an embodiment of the disclosed technology is compared with the classic Grover expressions. The embodiment of the disclosed technology used in the comparison comprises calculating the dipole moment and the position of a first bundle using Equations (21) and (22), then evaluating Equation (26) for each of the wires in the second bundle. For purposes of this comparison, Equation (26) is used to replace the Grover equation for analyzing the combination of filament-to-filament interactions (see F. Grover, *Inductance Calculations Working Formula and Tables*, New York:

Instrument Society of America (1945)). The classic Grover expression provides:

$$M_{ab} = \frac{\mu_0 L}{4\pi} \sum_{i \geq 0} \sum_{j \geq 0} \alpha_i \alpha_j M_{ij} \qquad (28)$$

where $$M_{ij} = \log\left(\frac{L}{r_{ij}} + \sqrt{1 + \frac{L^2}{r_{ij}^2}}\right) + \frac{r_{ij}}{L} - \sqrt{1 + \frac{r_{ij}^2}{L^2}}$$

Figure 5A:
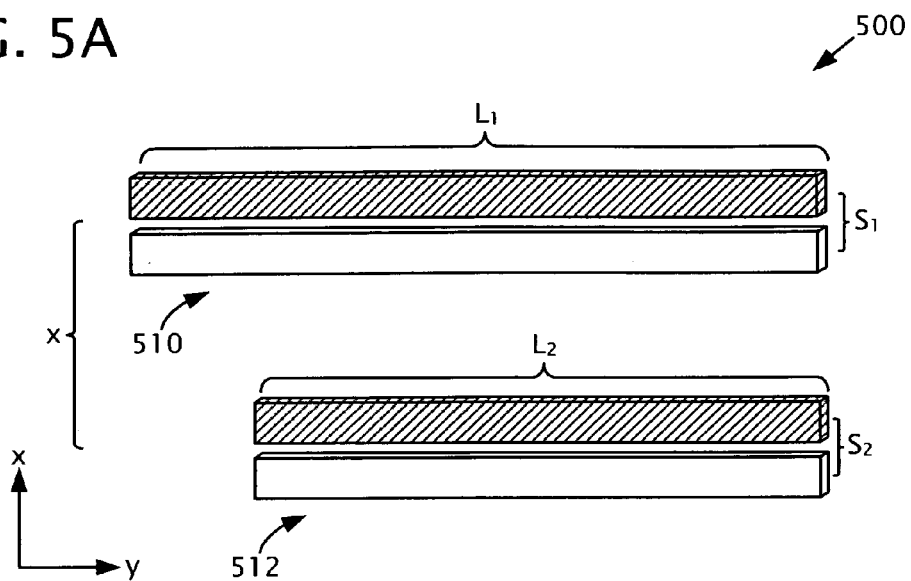
FIGS. 5A and 5B are block diagrams showing two bundles transversely coupled (FIG. 5A) and forward coupled (FIG. 5B).

To perform the comparison, consider the simple exemplary configuration shown in FIG. 5A, which illustrates two bundles that are transversely coupled. In particular, FIG. 5A is a block diagram 500 showing a first bundle 510 (or bundle a) separated by a distance x from a second bundle 512 (or bundle b). Further, the respective wires in each bundle are separated from each other by respective distances $s_1$ and $s_2$. The length of each bundle is $L_1$ and $L_2$, respectively. For the configuration shown in FIG. 5A, Equation (25) and Equation (26) give the same limit for x, L>>$s_1$, $s_2$; namely, $$M_{ab} \simeq \frac{\mu_0}{4\pi} s_1 s_2 L_1 L_2 \frac{2x^2 + L_2^2/4}{x^2(x^2 + L_2^2)^{3/2}} \qquad (29)$$

In the loop-inductance model, once all terms are accounted for, the asymptotic behavior of M is unlike that related to the partial-inductance model and stated in Equation (3). In fact, Equation (29) reveals two types of regimes for the transverse coupling shown in FIG. 5A:

$$M_{ab} \simeq \begin{cases} \dfrac{\mu_0}{2\pi} \dfrac{s^2 L^2}{x^3} \sim \dfrac{1}{r^3} & \text{for } x \gg L (3d \text{ case}) \\ \dfrac{\mu_0}{16\pi} \dfrac{s^2 L}{x^2} \sim \dfrac{1}{r^2} & \text{for } x \ll L (2d \text{ case}) \end{cases} \qquad (30)$$

Figure 5B:
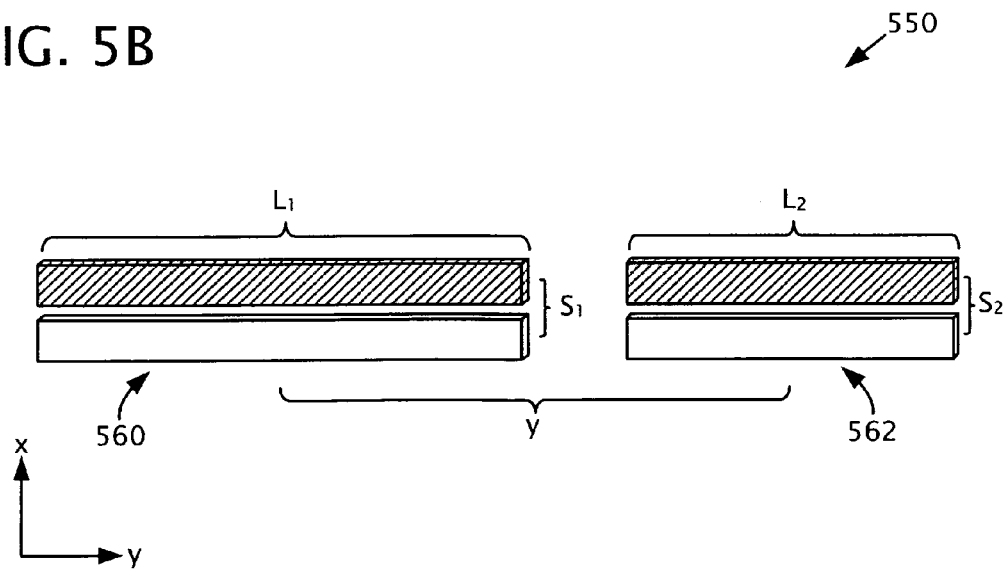

FIG. 5B illustrates two exemplary bundles 560, 562 coupled through forward coupling. In particular, FIG. 5B is a block diagram 550 showing a first bundle 560 (bundle a) having a center separated from the center of a second bundle 562 (bundle b) by a distance y along the y-axis. Further, the respective wires in each bundle are separated from each other by distances $s_1$ and $s_2$, and the length of each respective bundle is $L_1$ and $L_2$.

For the configuration illustrated in FIG. 5B, a comparison with the Grover expression, where $L_1$, $L_2$, $\Delta y \gg s_1 = s_2 \equiv s$, gives:

$$M_{ab}^{dipoles} \simeq \frac{16\mu_0}{\pi} \frac{s^2 L_1 L_2 \Delta_y}{(4\Delta_y^2 - L_2^2)^2}, \qquad (31)$$

and $$M_{ab}^{grover} \simeq \frac{16\mu_0}{\pi} \frac{s^2 L_1 L_2 \Delta_y}{(4\Delta_y^2 - L_1^2 - L_2^2)^2 - (2L_1 L_2)^2},$$

where both of the expressions have the same asymptotic behavior.

III. General Applications of the Disclosed Mutual Inductance Extraction Techniques In this section, general techniques for analyzing mutual inductance in a circuit layout using dipole approximations are described. Specialized techniques for analyzing mutual inductance in inductors using the disclosed technology are presented in a separate section below.

A. Exemplary Extraction Techniques FIG. 6 is a flowchart of a general method 600 for analyzing the mutual inductance in a circuit layout using embodiments of the disclosed technology. The general method 600 may be used, for example, as part of an overall inductance extraction scheme. The method 600 can be performed, for example, in an EDA software tool, such as a physical verification tool. Because the general method 600 concerns mutual inductance, any corresponding self inductance calculations are not described, but it is to be understood that such calculations may be performed at least partially concurrent with or prior to the mutual inductance calculations. In certain embodiments, the method 600 is applied only for a layout operating above a certain selected frequency (e.g., frequencies above 1 GHz in IC applications.).

At process block 610, a circuit description is received (e.g., a circuit design file, such as a GDSII or Oasis file). The circuit description generally comprises data indicative of the physical layout of the signal wires, power wires, and ground wires in an integrated circuit.

At process block 612, the signal wires and grounds wires are grouped into bundles according to any of the techniques described above. In general, the ground-wire segments that are grouped into a bundle with a respective signal-wire segment correspond to the return paths for currents on the associated signal-wire segment. The selection of return paths for a particular signal-wire segment can be performed using a variety of different methodologies. According to one exemplary embodiment, for instance, neighboring wire segments are organized according to their resistance up to a maximum distance from the relevant signal-wire segment. In another embodiment, a weighted function of both resistance and distance is used. In other embodiments, however, other criteria may be considered. In certain implementations, only a portion of the layout is grouped into bundles (e.g., a portion selected by the user or a portion operating in a high-frequency clock regime).

At process block 614, dipole moments representative of one or more of the bundles are calculated. In one particular implementation, for example, dipole moments are computed according to Equation (21). The representative dipole moment of a particular bundle can comprise, for example, the weighted average of the individual dipole moments between the signal-wire segment in the bundle and each corresponding ground-wire segment in the bundle (as indicated in Equation (22), for instance). In certain embodiments, dipole calculations are made for every bundle formed at process block 612. In other embodiments, however, only a portion of the bundles have their associated magnetic dipole computed. For example, certain bundles may not have their associated magnetic dipole computed because of a user-defined criteria or because the bundles meet one or more criteria indicating that they exhibit little or no mutual inductance (e.g., using one or more of the dipole selection rules described below).

At process block 616, the mutual inductance between two or more of the bundles is calculated using the dipole moment(s). In certain exemplary embodiments, the mutual inductance calculation involves calculating the magnetic flux of a magnetic field due to one of the representative dipole moments through one or more closed surfaces between a distant signal wire and its neighboring ground wire. This calculation may be performed, for example, between the dipole moment of a first bundle and each ground-wire-segment/signal-wire-segment pair of a second bundle (e.g., the flux through all surfaces formed between the signal-wire segment of the second bundle and its associated ground-wire segments). These surfaces might comprise, for example, rectangular surfaces between a signal-wire segment and its associated ground-wire segments (e.g., as shown in FIG. 2). The respective contributions of each of these surfaces can be calculated as a weighted average. In one particular implementation, for example, the mutual inductance between two bundles is computed according to Equation (26). In certain implementations, mutual inductance between two bundles is calculated in this manner only if the distance between the bundles is greater than or equal to some threshold value (e.g., ~20 μm at 130 nm technology; this value can scale with the technology parameter λ, where λ is the ratio of the minimum dimensions of a new generation of technology relative to a previous generation, and is typically about 0.75 from generation to generation). Further, in certain embodiments, the magnetic flux of a first bundle's dipole moment through a second bundle is computed, as well as the magnetic flux of the second bundle's dipole moment through the first bundle. The resulting mutual inductances can be averaged to arrive at a single mutual inductance value for the pair of bundles.

Process blocks 614 and 616 (in their various embodiments) are sometimes collectively referred to herein as the "dipole approximation technique."

At process block 618, the calculated mutual inductance is output. The manner in which the mutual inductance is output may vary widely depending on the implementation and the environment in which the method is performed. For example, it may be displayed to the user (e.g., as part of a graphic user interface displaying at least a portion of the layout) or it may be included in one or more data structures or databases stored on computer-readable media. Such data structures and databases may be utilized later in an overall synthesis scheme.

Figure 7:
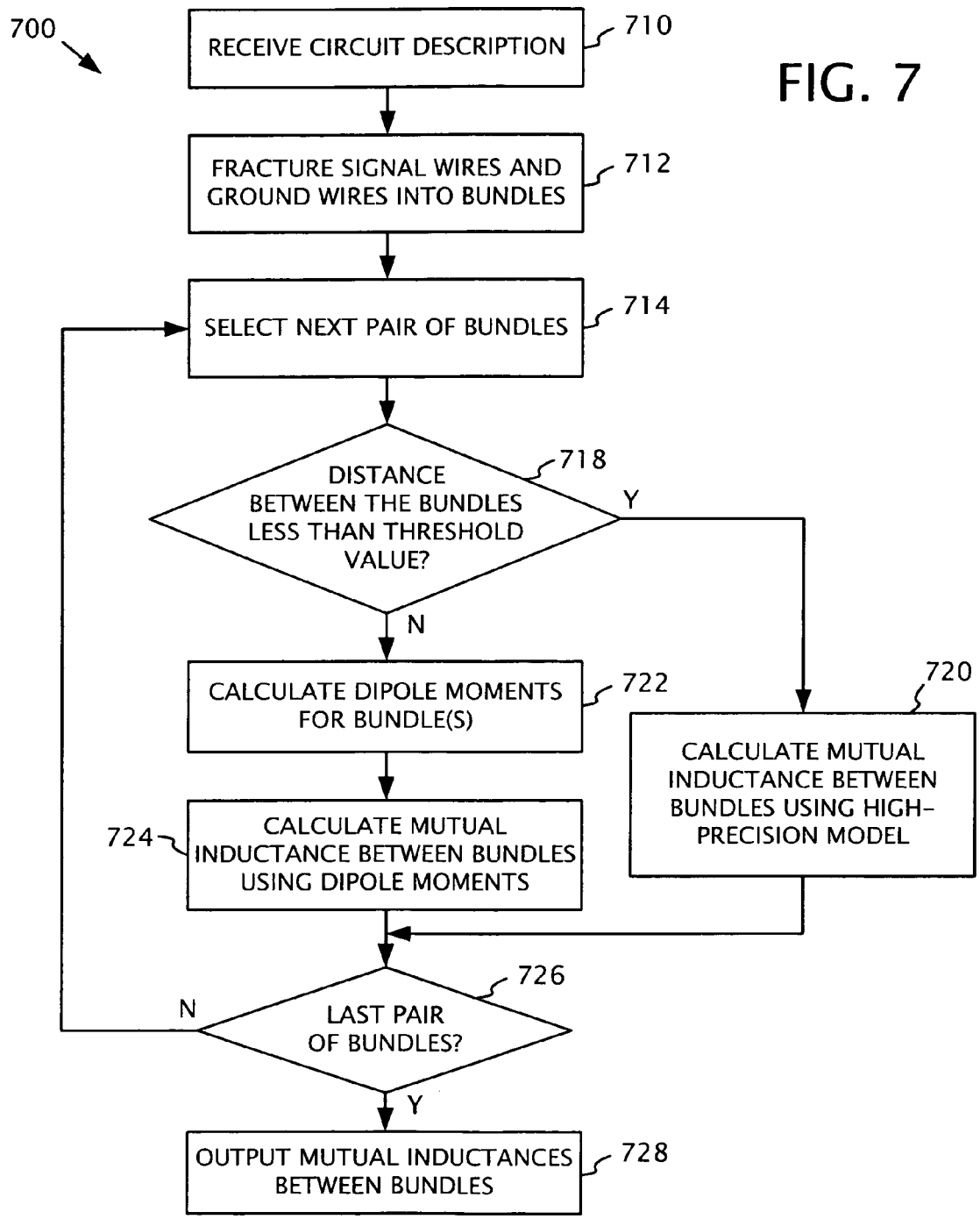
FIG. 7 is a flowchart of a more general exemplary method for analyzing mutual inductance utilizing an embodiment of the disclosed dipole approximation technique.

FIG. 7 is a flowchart of a more general exemplary scheme 700 for computing mutual inductance in a circuit design. As more fully explained below, the scheme 700 can utilize embodiments of the dipole approximation technique described above, as well as known partial-inductance models or mutual inductance calculations using Grover's equations or extensions thereof. In certain embodiments, for example, the dipole approximation technique is not used to analyze the interaction between degenerate bundles that share at least one return path. In these embodiments, the dipole approximation technique may still desirably be used to compute the coupling among different bundles separated by relatively large distances. In certain embodiments, the method 700 is desirably applied only for a layout operating above a certain selected frequency (e.g., frequencies above 1 GHz on IC's).

At process block 710, a circuit description is received. The circuit description typically comprises information concerning the physical layout of the signal wires, power wires, and ground wires in an integrated circuit. At process block 712, the signal wires and grounds wires are grouped into (or fractured into) bundles as explained above. At process block 714, a pair of bundles is selected for mutual-inductance analysis. This selection process may be performed in a variety of different ways (e.g., according to geometric location, size of the bundles, and/or other criteria).

At process block 718, a determination is made as to whether the distance between the bundles is less than a threshold value. In one exemplary embodiment, for example, this threshold value is equal to 20 μm. This value may vary, however, from implementation to implementation (e.g., 40 μm, 45 μm, or 50 μm) and may generally be viewed as the distance at which the possible error from the dipole approximation technique exceeds a desired limit. If the bundles are separated from one another by a distance that is greater than or equal to a threshold value, then an efficient (faster) mutual inductance extraction technique, which may not be precise at small distances, is desirably used. In the illustrated embodiment, for example, the dipole approximation technique described above is performed at process blocks 722, 724. (As described above in the discussion concerning degenerate configurations, however, there are instances when the dipole approximation technique may not be used because of the particular geometries of the bundle configurations.) Thus, the dipole moment for at least one of the bundles in the pair is calculated at process block 722 (e.g., using Equation (21)) and the mutual inductance between the bundles is calculated at process block 724 (e.g., using Equation (26)). In certain implementations, the efficient (faster) mutual inductance extraction technique is only used if the distance separating the bundles is within a certain range (e.g., 20-50 μm, or 20-100 μm for 130 nm technology; this range can scale down approximately linearly with the technology parameter λ). If the distance separating the bundles is beyond this range, no mutual inductance calculation is performed. Thus, a second threshold distance between bundles may exist, which, if exceeded, means that the mutual inductance between the bundles can be ignored.

If it is determined at process block 718 that the bundles are separated by a distance that is less than the threshold value, then the loop mutual inductances desirably are calculated using other means. In general, the mutual inductance calculation in this case is desirably performed by a technique that has greater precision at small distances than the technique used for the larger distances. The mutual inductance between the two bundles separated by less than the threshold distance (sometimes referred to as the "near-field solution") can be computed using the Grover equation shown in Equation (28) or an extended version thereof.

For example, in one specific implementation, the extension to Equation (28) may consist of averaging Equation (28) over the transverse dimensions of the participating wires. The end result can be obtained by substituting the values of $r_{ij}$ in Equation (28) with the geometric mean distance (GMD) among the respective cross-sections. The technique for calculating the GMD of two rectangular cross-sections described, for example, in R. Escovar and R. Suaya, "Transmission Line Design of Clock Trees," in *Proc. IEEE/ACM International Conference on CAD*, November 2002, pp. 334-340 and U.S. Patent Application Publication No. 2003/0131334, which is incorporated herein by reference, can be used. The resulting mutual inductance coefficients (using the values $\alpha_i$ computed using Equation (15)) and value obtained from Equation (28) (with the $r_{ij}$ reinterpreted as GMDs) agree well with results obtained from FastHenry. Moreover, the representative results shown in FIGS. 8-10 show that the analytical expressions derived from the dipole approximation technique converge to the near-field solution within distances of about 20 μm (at 130 nm) in the worst case. This scheme is consistent with the long-distance behavior, as the only modification to Equation (28) is the appearance of the partial self inductance, which replaces the partial mutual inductance between two ground wires. In certain embodiments, this scheme can be used for cases that have shared return paths that are not in a degenerate configuration. For cases that involve degenerate configurations, Grover-like expressions may be used.

At process block 726, a determination is made as to whether there are any more pairs of bundles to be considered. If so, then the method 700 returns to process block 714; otherwise, the mutual inductances between the bundles are output at process block 728. For example, as explained above, the mutual inductances may be displayed to the user or may be included in one or more data structures or databases stored on computer-readable media.

It should be understood that the general methods 600 and 700 illustrated in FIGS. 6 and 7, respectively, comprise exemplary embodiments only and are not to be construed as limiting in any way. For example, the particular, sequential order shown in FIGS. 6 and 7 is not limiting, as the operations performed therein may, in certain implementations, be rearranged, performed concurrently, or not performed at all. For instance, in one exemplary embodiment, if the bundles are separated by a distance greater than or equal to the threshold value, no mutual inductance calculation is performed at all. Thus, only the high-precision calculation is used. Moreover, additional method acts may be interleaved within the methods 600 and 700. For example, according to one exemplary embodiment, after multiple bundles have been determined, one or more dipole selection rules (as explained below) may be applied to determine whether any particular bundles or pairs of bundles can be excluded from the mutual inductance calculation. Further, the operations performed in FIGS. 6 and 7 may be performed concurrently with other operations not directly related to the computation of mutual inductance (e.g., the analysis of self inductance or other physical parameters of the integrated circuit layout (such as, resistance, conductance, and signal integrity)).

B. Experimental Results and Exemplary Selection Rules for Applying the Disclosed Techniques In this section, the accuracy and application of the exemplary dipole approximation techniques are discussed in greater detail. To examine the accuracy of the disclosed technology, a comparison is made between the results obtained by Equation (26) and by the FastHenry field solver. FastHenry is an inductance extraction program that is publicly available from the Massachusetts Institute of Technology website. In general, FastHenry performs accurate detailed calculations of inductance for simple geometries, but is not suited for inductance extraction of large-scale topologies. In comparison to FastHenry, for example, the method of calculating mutual inductance using the dipole approximation is much more computationally efficient (faster).

The simulations in FastHenry were carried out assuming an operating frequency of 10 Ghz. To obtain good convergence with FastHenry, a 9×9 filament partitioning was used, though other partitioning may be accurate enough in some situations (e.g., 5×5 partitioning). A good criterion to be used in considering the errors introduced in a mutual inductance extraction method is the comparison to the (typically larger) self inductances of the two bundles, $L_a$, $L_b$. For this reason, the comparisons are plotted using the dimensionless magnitude $\zeta \equiv M_{ab}/\sqrt{L_a L_b}$.

Figure 8A:
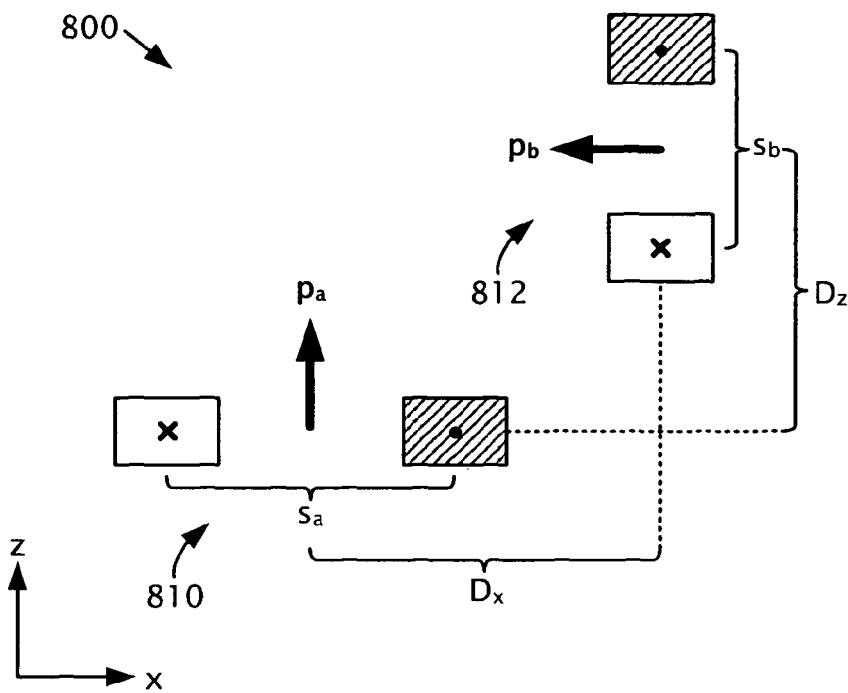
FIG. 8A is a block diagram showing two exemplary bundles having respective dipoles that are oriented perpendicular to one another.
Figure 8B:
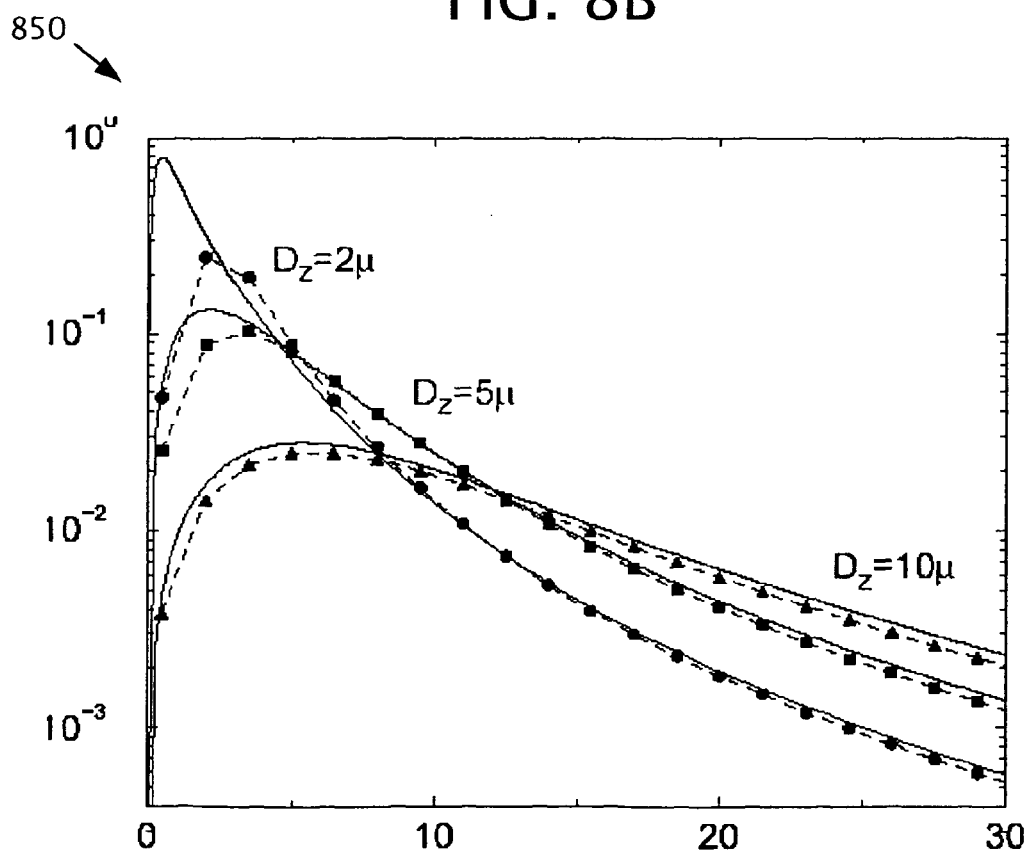
FIG. 8B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 8A.

FIGS. 8A and 8B show the first case considered: a simple coupling between two exemplary bundles positioned with respective dipole $p_a$ and $p_b$ that are perpendicular to one another. FIG. 8A is a block diagram 800 showing a cross-sectional view of the relative positioning of the bundles considered. In particular, FIG. 8A shows a first bundle 810 and a second bundle 812 separated from one another by a center-to-center distance $D_x$ along the x-axis and by a center-to-center distance $D_z$ along the z-axis. Bundles 810, 812 in this example each comprise a signal-wire segment and a ground-wire segment separated from one another by center-to-center distances $s_a$, $s_b$, respectively. Notice that in this example, the signal-wire segment and the ground-wire segment of one bundle are offset from each other in a first direction, and the signal-wire segment and ground-wire segment of the other bundle are offset from each other in a second direction. In this case, the first direction is perpendicular to the direction. In a specific example corresponding to FIG. 8A, the length of the wires (L) is 500 µm, the center-to-center separation between the wires in each bundle ($s_a$ and $s_b$, respectively) is 5 µm, the height of the wires (h) is 0.5 µm, and the width of the wires (w) is 0.5 µm.

FIG. 8B is a graph 850 showing a comparison between results obtained by an embodiment of the dipole approximation technique described above with respect to FIG. 6 using Equations (21) and (26) and results obtained from FastHenry for the configuration shown in FIG. 8A and for bundles having the specific exemplary dimensions and spacing mentioned above. In particular, graph 850 shows several plots for different values of $D_x$ as a function of $D_z$. The results obtained from FastHenry are shown in dashed lines with symbols, whereas the results obtained from the dipole approximation technique described above are shown in solid lines. As can be seen from FIG. 8B, the discrepancy between results obtained from FastHenry and the dipole approximation is relatively small (the difference has an upper bound of 10%).

Figure 9A:
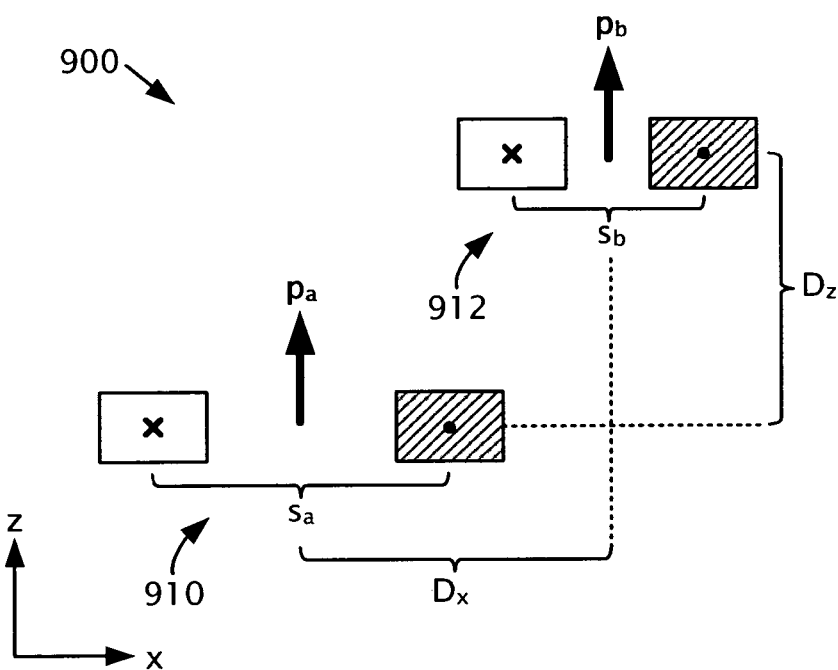
FIG. 9A is a block diagram showing two exemplary bundles having respective dipoles that are oriented parallel to one another.
Figure 9B:
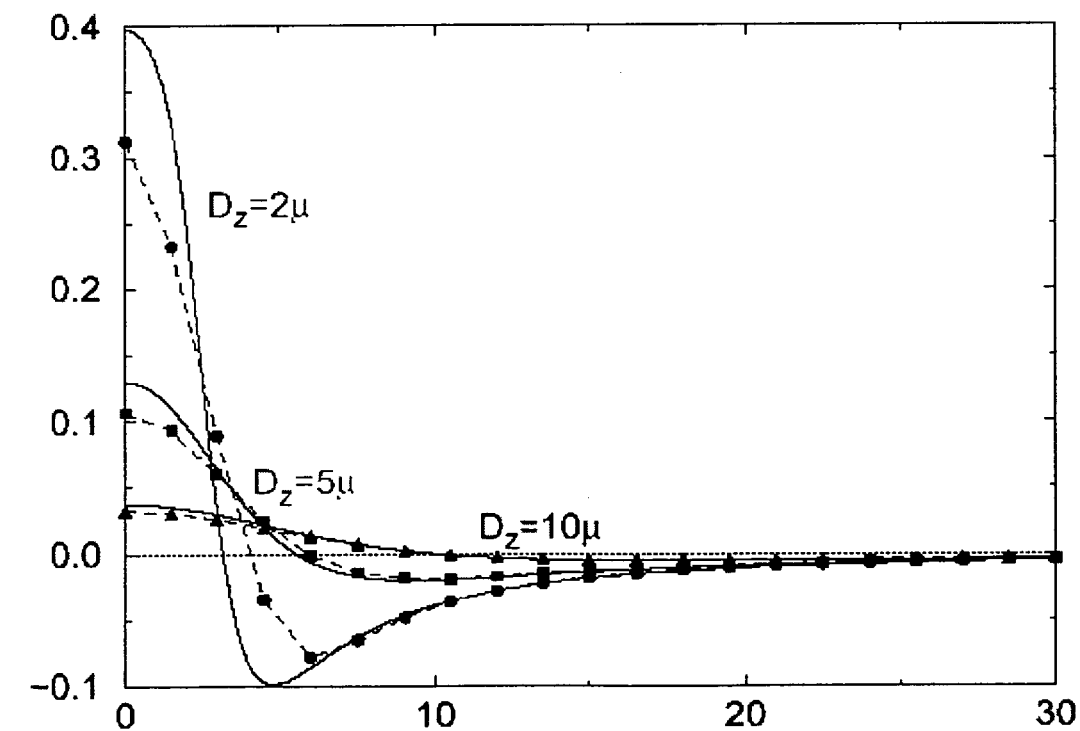
FIG. 9B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 9A.

FIGS. 9A and 9B show the second case considered: a coupling between two exemplary bundles (each having one respective return path) positioned with respective dipoles $p_a$ and $p_b$ that are parallel to one another. FIG. 9A is a block diagram 900 showing schematically the geometry considered. In particular, FIG. 9A is a cross-sectional view similar to FIG. 8A showing a first bundle 910 and a second bundle 912. In FIG. 9A, the signal-wire segment and ground-wire segment of one bundle are offset from one another in a first direction, and the signal-wire segment and ground-wire segment of the other bundle are offset from one another in a second direction that is parallel to and spaced from the first direction. In a specific example corresponding to FIG. 9A, the length of the wires (L) is 500 µm, the center-to-center separation between the wires in each bundle ($s_a$ and $s_b$, respectively) is 5 µm, the height of the wires (h) is 0.5 µm, and the width of the wires (w) is 0.5 µm.

FIG. 9B is a graph 950 showing a comparison between results obtained by an embodiment of the dipole approximation technique described above with respect to FIG. 6 using Equations (21) and (26) and results obtained from FastHenry for the configuration shown in FIG. 9A and for bundles having the specific exemplary dimensions and spacing mentioned above. In particular, graph 950 shows several plots for different values of $D_x$ as a function of $D_z$ with the results obtained from FastHenry shown in dashed lines with symbols and the results obtained from the dipole approximation technique shown in solid lines. Again, the discrepancy between the two techniques is very small and is upper bounded by 10%. It can be seen from FIGS. 8B and 9B that the dipole approximation technique works well for mutual inductances between bundles having single return paths, irrespective of the orientation of their dipole moments.

Figure 10A:
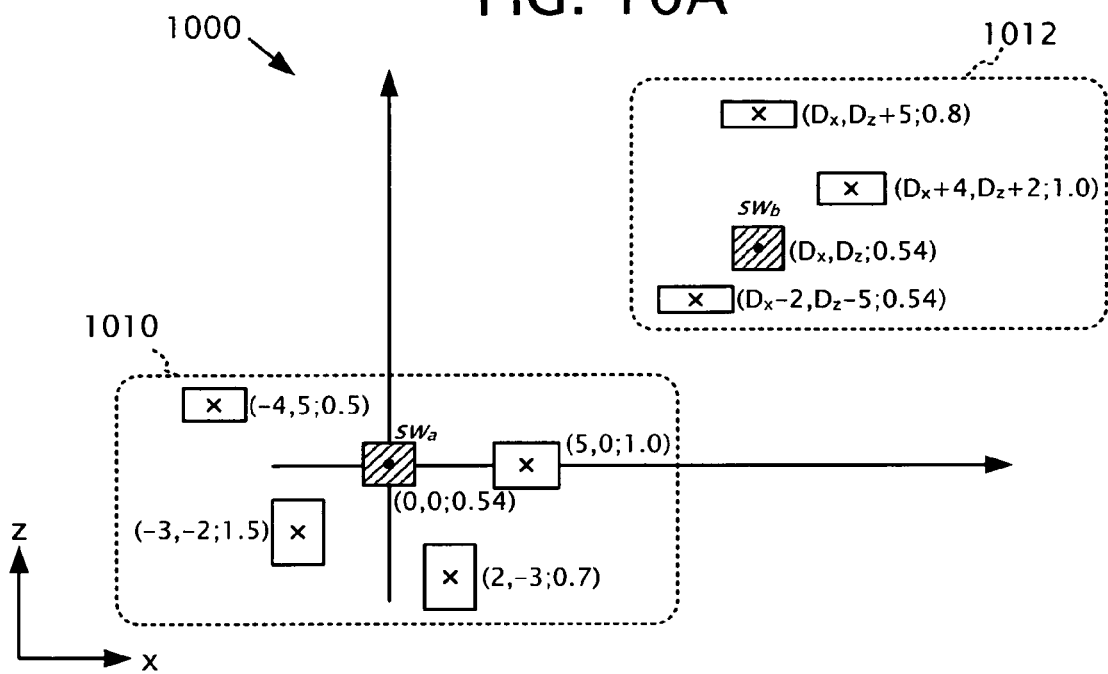
FIG. 10A is a block diagram showing two exemplary complex bundles having multiple return paths.
Figure 10B:
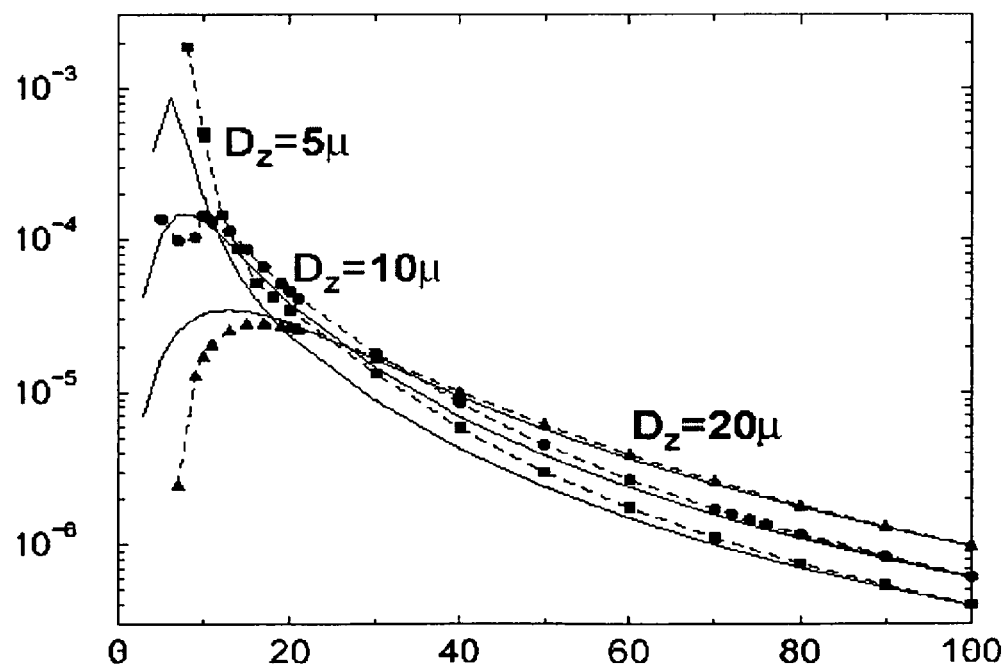
FIG. 10B is a graph showing a comparison between results of $\zeta$ as a function of $D_x$, and for the indicated values of $D_z$, obtained by an embodiment of the disclosed dipole approximation technique (solid lines) and results obtained from a field solver (dashed lines with symbols) for the configuration shown in FIG. 10A.

FIGS. 10A and 10B show a slightly more complex geometry comprising two bundles, each having multiple return paths. In particular, FIG. 10A schematically shows a first bundle 1010 relative to a second bundle 1012. Each wire in the configuration is labeled with a respective triplet indicating the wire's x-axis position and z-axis position as measured from the center of the wire, and the wire's width. Further, the signal wires for each bundle are labeled $sw_a$ and $sw_b$, respectively. The ground wires for the signal wire $sw_b$ are labeled according to their relative position from the signal wire $sw_b$ (as measured in micrometers from the center of the ground wire to the center of the signal wire). For example, the ground wire labeled ("$D_x$-2, $D_z$-5; 0.8") has a center that is positioned 2 μm closer to the x-axis and 5 μm closer to the z-axis than the center of signal wire $sw_b$. Both of the bundles 1010, 1012 are asymmetric in terms of the widths of their return paths as well as their positions with respect to the signal wire. Each of the exemplary wires has a length (L) of 1000 μm and height (h) of 0.54 μm.

FIG. 10B is a graph 1050 showing a comparison between results obtained by an embodiment of the dipole approximation technique described above with respect to FIG. 6 using Equations (21) and (26) and results obtained from FastHenry for the specific exemplary configuration shown in FIG. 10A. In particular, graph 1050 shows several plots for different values of $D_x$ as a function of $D_z$ with the results obtained from FastHenry shown in dashed lines with various symbols (triangle, circles, or squares) along the respective plots, and the results obtained from the dipole approximation technique shown in solid lines. In this example, it can be seen that for the closest configurations (e.g., distances less than about 30 μm), there is a substantial difference between the two results. Even in those cases, however, the value of ζ is very small, thus rending these errors relatively insignificant when compared to the self inductances $L_a$, $L_b$.

C. Exemplary Selection Rules

From FIGS. 8-10, it can generally be observed that for arbitrary configurations, as long as the distance between bundles is not too small (e.g., 30 μm or larger at 130 nm technology; this distance can scale approximately linearly with the technology parameter λ), then the dipole approximation technique described above provides a good representation of the mutual inductance.

Experiments with the dipole approximation technique (such as the ones illustrated in FIGS. 8-10) have resulted in the development of a number of situation-dependent rules that can be used to determine when the mutual inductance between two bundles can be automatically neglected, thereby avoid unnecessary calculations. These rules are sometimes referred to as "selection rules" or "dipole selection rules."

A first rule is that for symmetric bundles, the mutual inductance is null. An exemplary wiring configuration that is symmetric is a sandwich configuration (comprising a symmetric coplanar ground-signal-ground bundle) as is used in many clock-signal layouts. Such a configuration has no dipole moment, meaning that in the dipole approximation technique, its signal voltage is insensitive to external noise. This rule was confirmed using FastHenry, wherein the mutual inductance between two of these structures was calculated and resulted in values of ζ below $10^{-5}$, even for bundles separated by as little as 5 μm. Thus, a determination can be made in any of the mutual inductance extraction techniques described herein as to whether the ground-wire segments are positioned symmetrically or substantially symmetrically (determined, for example, by a fixed or user-selected tolerance, e.g., ±5%) about a respective signal-wire segment. If so, the mutual inductance calculation for the signal wire can be foregone.

Figure 11A:
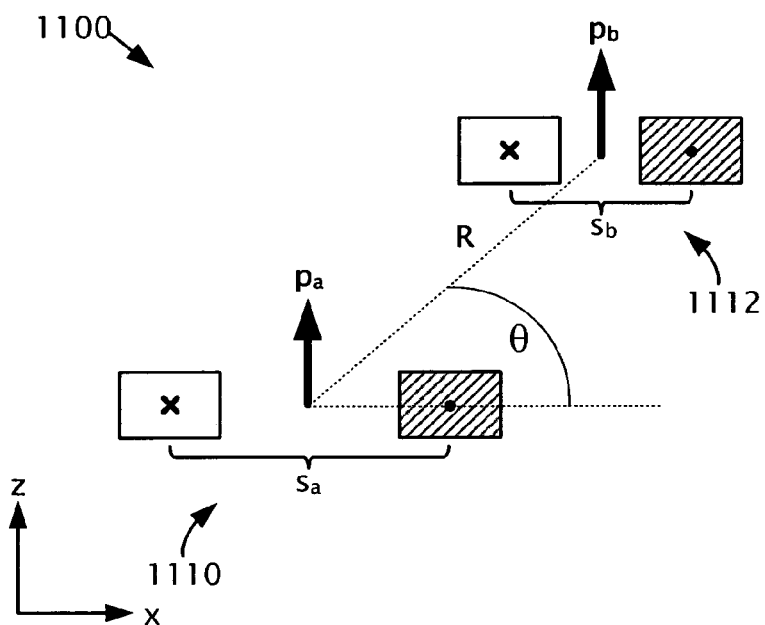
FIG. 11A is a block diagram showing two parallel bundles having a particular angular orientation from one another.

A second rule is that for two parallel bundles (such as those shown in FIG. 9A), the mutual inductance between them is minimized when their relative position to one another (measured from their center-of-mass positions (e.g., Equation (22)) forms a certain angle or substantially a certain angle (determined, for example, by a fixed or user-selected tolerance, e.g., ±5%) with the direction perpendicular to that of their common dipole moment directions (θ in FIG. 11A.) For example, this angle is about 45° when the bundles are much longer than their transverse dimensions and to about 35° when this is not the case. As with the first rule, the second rule can be utilized as part of any of the disclosed mutual extraction techniques. This second rule can also be used as a criterion by designers wishing to minimize the mutual inductance in a circuit layout.

The second rule can be verified by considering that the two bundles have aligned dipole moments. Thus, the flux of magnetic field through the second bundle due to the first one is proportional to the perpendicular field of the first one. Consequently, the angle where the perpendicular component for the field vanishes should be analyzed. In the situation where bundles are short, the perpendicular component ($B_\perp$) for the field of a dipole (found using the equation below) is null for $\theta = 0.5 \cos^{-1}(1/3) \approx 35°$. The perpendicular component ($B_{195}$) and the parallel component ($B_\parallel$) of the representative dipole can be found as follows:

$$B(r) = \frac{3(p \cdot \hat{r})\hat{r} - p}{r^3}, \tag{32}$$

$$B_\perp = \frac{1}{2}(3\cos 2\theta + 1)\frac{p}{r^3},$$

$$B_\parallel = \frac{3}{2}\sin 2\theta \frac{p}{r^3}.$$

Figure 11B:
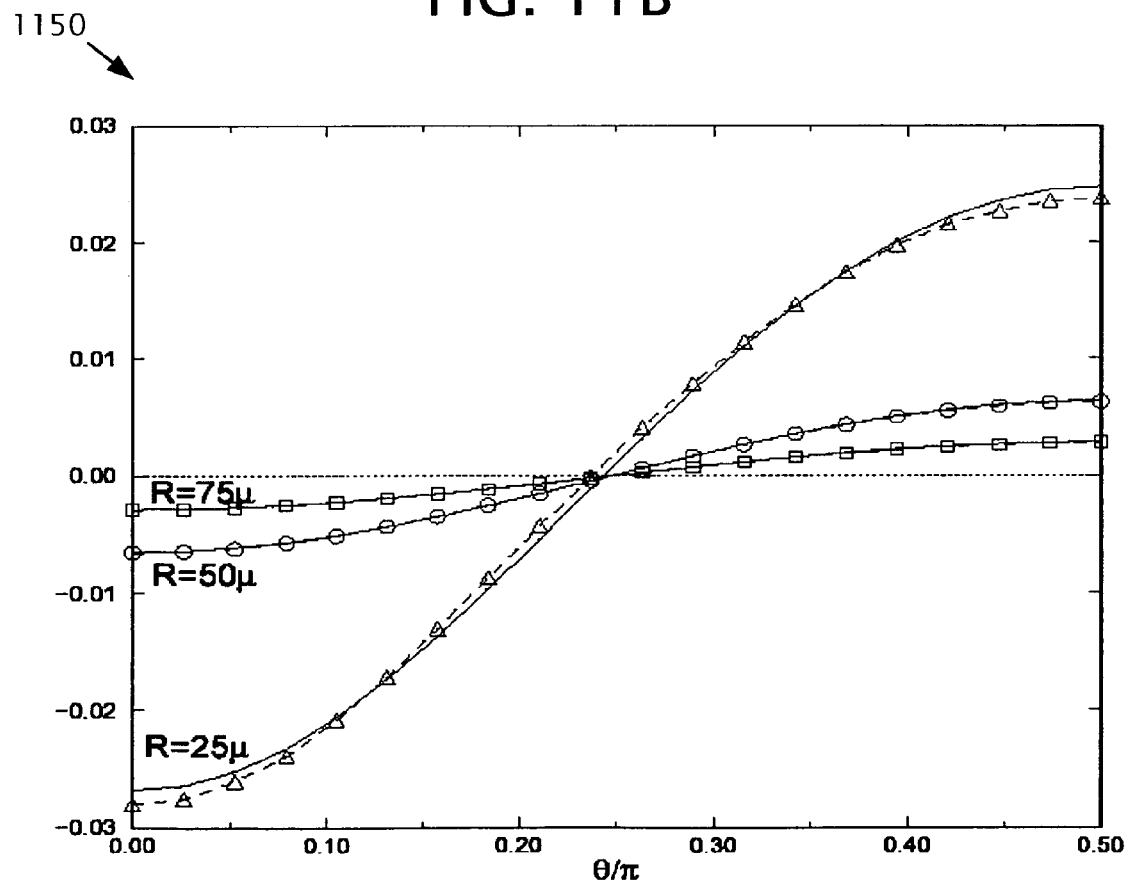
FIG. 11B is a graph showing a comparison between results obtained by an embodiment of the disclosed dipole approximation technique (solid lines) and results obtained from a field solver (dashed lines with symbols) for the configuration shown in FIG. 11B.

FIGS. 11A-B illustrate a numerical example of the second rule using the disclosed dipole approximation technique and FastHenry. In particular, FIG. 11A is a block diagram 1100 showing schematically an exemplary geometry of the type considered. FIG. 11A is a cross-sectional view similar to FIG. 9A showing a first bundle 1110 and a second bundle 1112. In FIG. 11A, the distance (R) between the respective center of the two bundles is assumed to be constant, whereas the angular orientation of the second bundle relative to the first (θ) is assumed to be variable. In FIG. 11A, the length of the wires (L) is 500 μm, the separation between the wires in each bundle ($s_a$ and $s_b$, respectively) is 5 μm, the height of the wires (h) is 0.1 μm, and the width of the wires (w) is 0.1 μm.

FIG. 11B is a graph 1150 showing a comparison between results obtained by using an embodiment of the dipole approximation technique described above with respect to FIG. 6 using Equations (21) and (26) and results obtained from FastHenry for the configuration shown in FIG. 11A and with the above dimensions. In particular, graph 1150 shows several plots for different values of R as a function of θ/π. In FIG. 11B, the results obtained from FastHenry are shown in dashed lines with symbols, and the results obtained from the dipole approximation technique are shown in solid lines. Note that a horizontal dashed line also appears in FIG. 11B and represents the point where ζ is null.

A third rule is that for two perpendicular or substantially perpendicular bundles (such as those shown in FIG. 8A), mutual inductance is negligible for situations where the perpendicular axis of one bundle passes through the center or substantially near the center (determined, for example, by a fixed or user-selected tolerance, e.g., ±5%) of the other. In one particular implementation, the center of the bundle comprises the center-of-mass position as determined by Equation (22). This third rule is a consequence of the fact that the parallel component ($B_\parallel$) of a dipole field vanishes when θ is 0° and when θ is 90°. This behavior can be observed in the configuration shown in FIG. 8A and the numerical results presented in FIG. 8B. In particular, this rule manifests itself in the results presented in FIG. 8B where the mutual inductance drops for small values of $D_z$ and where the magnitude of $\zeta$ decreases with decreasing $D_x$ for large values of $D_z$. As with the first and second rules, the third rule can be utilized as part of any of the disclosed mutual extraction techniques. The second and third rules can be particularly useful for pruning large layouts.

D. Efficiency Analysis of the Disclosed Dipole Approximation Technique

In order to analyze the efficiency of the disclosed dipole approximation technique, the runtimes for extracting mutual inductance using the dipole approximation technique and the runtimes for extracting mutual inductance using Grover's expression were compared. Grover's expressions give nearly the same results as FastHenry, meaning that the errors between the dipole approximation technique and Grover's expressions are as small as the errors discussed above with reference to FIGS. 8B, 9B, 10B, and 11B.

Assuming a simple, general configuration, with N wires broken up into $n_b$ bundles, Grover's expressions require $N^2/2$ computations of terms in the second line of Equation (28). On the other hand, the embodiment of the disclosed dipole approximation technique described above with reference to FIG. 6 and using Equations (21) and (26) requires a total of $Nn_b$ calculations. Thus, if there are usually multiple return paths per bundle in a layout (i.e., if $n_b \ll N/2$), then the dipole approximation technique involves a much smaller number of computations. Moreover, each computation of Grover's expression involves a transcendental function. By contrast, for the exemplary embodiment of the dipole approximation technique using Equations (21) and (26), there are N computations arising from the calculation of the dipole moment. This merely involves sums and multiplications plus $(n_b-1)N$ computations (for the argument in the sum of Equation (26), where the most expensive (time consuming) operation is a half power).

Table 1 below presents a comparison between the two methods using an exemplary configuration involving two bundles having the same number of return paths. Runtimes are expressed in microseconds per mutual inductance computation. Approximately $10^8$ similar computations were averaged for each entry of the table. All runs were carried out on a desktop PC running at 2.0 GHz under identical situations.

TABLE 1

Comparative Runtimes Between an Embodiment of Dipole Approximation Technique and Grover's Expressions

| $N_{rp}$ | DA | GE | Ratio GE/DA |
|---|---|---|---|
| 1 | 0.412 | 1.586 | 3.85 |
| 2 | 0.544 | 3.343 | 6.14 |
| 3 | 0.697 | 5.817 | 8.34 |
| 4 | 0.784 | 9.052 | 11.54 |
| 5 | 1.000 | 13.002 | 13.00 |
| 6 | 1.092 | 17.902 | 16.39 |

The first column in Table 1 shows the number of return paths ($N_{rp}$) per bundle. The second column shows the runtime (in microseconds per computation) for an exemplary embodiment of the dipole approximation method (DA). The exemplary method utilized was the method discussed above with reference to FIG. 6 utilizing Equations (21) and (26). The third column shows the runtime using Grover's expression (GE). The fourth column shows the ratio between the runtime for Grover's expression and the exemplary dipole approximation technique (Ratio GE/DA). As can be seen in Table 1, the runtime ratio (Ratio GE/DA) increases in an approximately linear fashion as the number of return paths in the bundles increases. This indicates that the exemplary embodiment of the dipole approximation technique is about an order of magnitude faster than using Grover's expression.

IV. Analyzing Mutual Inductance Between Inductors

A. General Considerations for Calculating Inductance in Inductors

A typical inductor can be considered a circuit path consisting of a concatenation of N straight segments, connecting a number of ports, in one or multiple metal planes. The loop self inductance of an inductor can be decomposed into:

$$L_{loop} = \sum_{i=1}^{N} L_i + 2 \sum_{i=1}^{N} \sum_{j=i+1}^{N} M_{ij}, \quad (33)$$

where $M_{ij}$ is the partial mutual inductance between segment i and j, and $L_i$ corresponds to the partial self inductance of segment i and the sum extends over $\frac{1}{2}N(N+1)$ terms.

The mutual inductance M between two inductors, can similarly be computed in terms of a list of partial mutual inductances among the respective constituent segments:

$$M_{ab} = \sum_{i=1}^{N_a} \sum_{j=1}^{N_b} M_{ij}, \quad (34)$$

where $N_a$ and $N_b$ correspond to the number of wire segments in each inductor, and $M_{ij}$ corresponds to the partial mutual inductance between segment i in the first inductor and segment j in the second inductor.

The classical Grover expressions for computing partial self and mutual inductances can be used in the above equations, provided that the current distributions are uniform across the transverse area of the conductors. As a starting point, consider the mutual inductance between two parallel filaments of equal length L:

$$M_{ij} = \frac{\mu L}{2\pi} \left[ \ln\left(\frac{L}{d} + \sqrt{1 + \frac{L^2}{d^2}}\right) - \sqrt{1 + \frac{d^2}{L^2}} + \frac{d}{L} \right], \quad (35)$$

where d is the distance between the filaments, and $\mu$ is the magnetic permeability of the conductors.

To perform a two-dimensional approximation, it can be assumed that $L \gg d$ in the above expression. Furthermore, for substantially uniform current distributions, the above treatment can be extended to finite cross sections by averaging the resulting expression over the transverse dimensions, resulting in:

$$M_{ij} = \frac{\mu L}{2\pi} \left[ \ln\left(\frac{2L}{d_g}\right) + \frac{d_a}{L} - 1 \right], \quad (36)$$

where $d_g$ is the geometric mean distance between the conductors' cross-sections, and $d_a$ is the arithmetic mean distance between the conductors' cross-sections.

Figure 14:
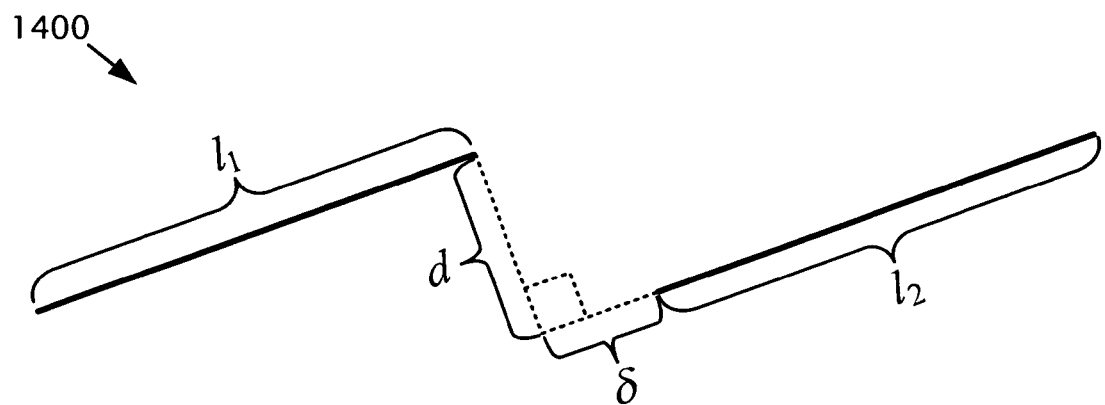
FIG. 14 is a block diagram illustrating mutual inductance between two exemplary parallel filaments.

To extend the analysis to 3-D configurations, the following equation relating the mutual inductance of unequal length segments to that of equal length segments can be used. For example, the mutual inductance between two parallel filaments of different lengths (as shown, for instance, in the block diagram 1400 of FIG. 14) can be computed according to:

$$M_{ij} = \frac{1}{2}(M_{l_1+l_2+\delta} + M_\delta - (M_{l_1+\delta} + M_{l_2+\delta})), \quad (37)$$

where the value $M_l$ corresponds to the partial mutual inductance between two parallel filaments of equal length l separated by a distance d (see Equation (35)). For overlapping filaments, where $\delta<0$, the same expression applies taking the absolute value of the filament's length.

The well-known general expressions for arbitrarily oriented filaments are provided in F. Grover, Inductance Calculations Working Formula and Tables, pgs. 56-57, New York: Instrument Society of America (1945).

For nonparallel wires of finite cross sections, a numerical average over the transverse dimensions of the filamentary equations can be performed. In contrast to the Manhattan case where the average is amenable to direct quadrature, calculation of non-Manhattan geometries is ordinarily performed numerically.

B. Exemplary Embodiments of the Dipole Approximation Approach Applied to Inductors As explained above, the dipole approximation can be used in quasi-magnetostatic problems to provide a general method for computing the magnetic field for an arbitrary current distribution as a function of distance keeping only the leading term in 1/r. For example, in the loop treatment (which concerns closed current loops), the leading term of the magnetic field can be considered that of a dipole. This is not the case in the PEEC dipole approximation, however, which contains monopole contributions.

According to exemplary embodiments of the disclosed loop inductance approach, the field of each of the elementary current filaments within an inductor can be replaced with one of a representative point-like dipole at or substantially at the center of the inductor. The computation can then proceed following first principles in electromagnetic theory.

For example, the mutual inductance between two inductors a and b is given by:

$$M_{ab} = \frac{\Psi_{a\to b}}{I_a} = \sum_{S_j \in b} \int_{S_j} B^{(a)} \cdot dS_j = \frac{1}{I_a} \oint_C A^{(a)} \cdot dl, \quad (38)$$

with $\Psi_{a\to b}$ the magnetic flux resulting from the field generated by inductor a over the area sustained by inductor b. In addition, $S_j$ are the surfaces subtended by the turns of inductor b, C is the union of all segments of inductor b, $B^{(a)}$ is the magnetic induction field generated by inductor a, and $A^{(a)}$ is its vector potential that satisfies $B^{(a)} = \nabla \times A^{(a)}$.

To calculate the mutual inductance, and in certain embodiments of the disclosed technology, a dipole approximation technique can be used. For instance, an exemplary embodiment of the dipole approximation technique involves the following:

computing the vector potential $A^{(a)}$ for the magnetic dipole in terms of the magnetic dipole moment $p^{(a)}$. For example:

$$A^{(a)} = \frac{p^{(a)} \times r}{r^3}. \quad (39)$$

computing the dipole moment of inductor a, divided by its current. For example:

$$\tilde{p}^{(a)} \equiv \frac{p^{(a)}}{I} = \frac{\mu}{8\pi I}\int r \times J(r)d^3 r. \quad (40)$$

computing the magnetic flux $\Psi_{a\to b}$ of the field produced by the magnetic dipole of inductor a on the area sustained by inductor b.

In certain embodiments, inductor a can be replaced with inductor b in the above method acts. A final mutual inductance can then be computed from both of the mutual inductance values obtained. For example, the final value can be the average $M=(M_{ab} \pm M_{ba})/2$, which helps ensure that the inductance matrix is symmetric.

In other exemplary embodiments, any subset of these method acts can be performed. In still other embodiments, any one or more of the method acts are performed individually or in various other combinations and subcombinations with one another.

Figure 15:
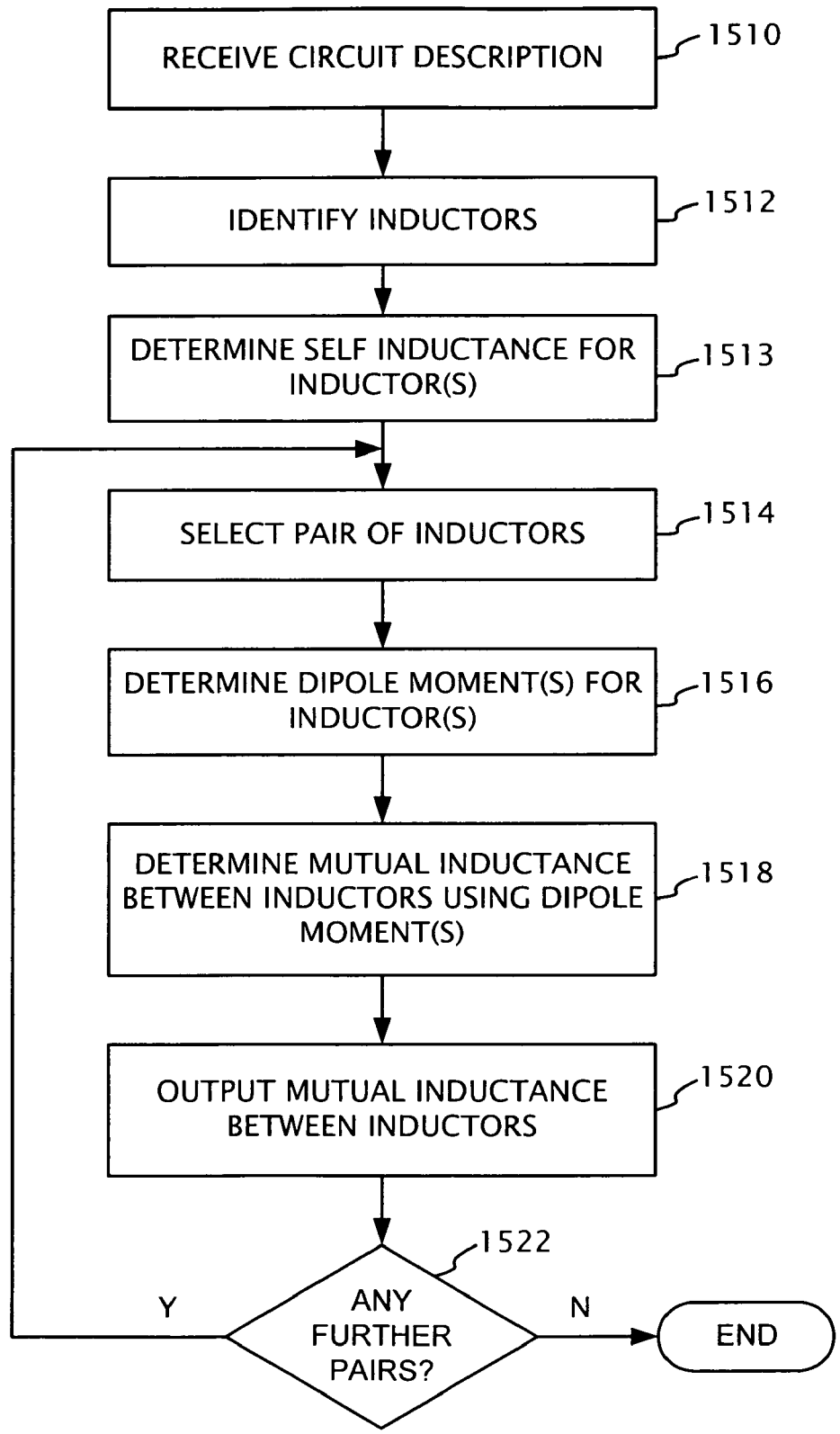
FIG. 15 is a flowchart of a general method for analyzing the mutual inductance between two inductors in a circuit layout using an embodiment of a dipole approximation technique.

FIG. 15 is a flowchart of a general method 1500 for analyzing the mutual inductance between two inductors in a circuit layout using embodiments of the disclosed technology. The general method 1500 may be used, for example, as part of an overall inductance extraction scheme. The method 1500 can be performed, for example, in an EDA software tool, such as a physical verification tool. Because the general method 1500 concerns mutual inductance, any corresponding self inductance calculations are not described, but it is to be understood that such calculations are desirably performed at least partially concurrent with, prior to, or after the mutual inductance calculations. For example, the self inductance calculation can be performed only once per inductor (e.g., according to equation (33)), independent of the inductor's location. In certain embodiments, the method 1500 is applied only for a layout operating above a certain selected frequency (e.g., frequencies above 1 GHz). Furthermore, in certain exemplary embodiments, the method 1500 is applied only to pairs of inductors where the border-to-separation between inductors is larger than some threshold value (e.g., when the separation is larger than 1/10 of the radius of one of the inductors).

At process block 1510, a circuit description is received (e.g., a circuit design file, such as a GDSII or Oasis file). The circuit description generally comprises data indicative of the physical layout of the signal wires, power wires, and ground wires in an integrated circuit.

At process block 1512, two or more inductors are identified from the circuit description. The two or more inductors can be identified from the circuit description by using a layout versus schematic checking procedure, by discriminating the inductors based on their geometric configuration, by user selection, by referring to a stored list of locations of such inductors, or other such techniques or methods.

At process block 1513, self inductances are determined for one or more of the inductors identified at process block 1512. For example, according to one particular embodiment, self inductances are determined for all inductors identified. The self inductance computation can be performed using a variety of techniques, but in one embodiment is performed using Equation (33).

At process block 1514, a respective pair of inductors is selected for mutual inductance analysis. This pair can be selected via user input, by virtue of their relative position to one another (e.g., in order of their edge-to-edge separation), or by some other method or technique.

Figure 17:
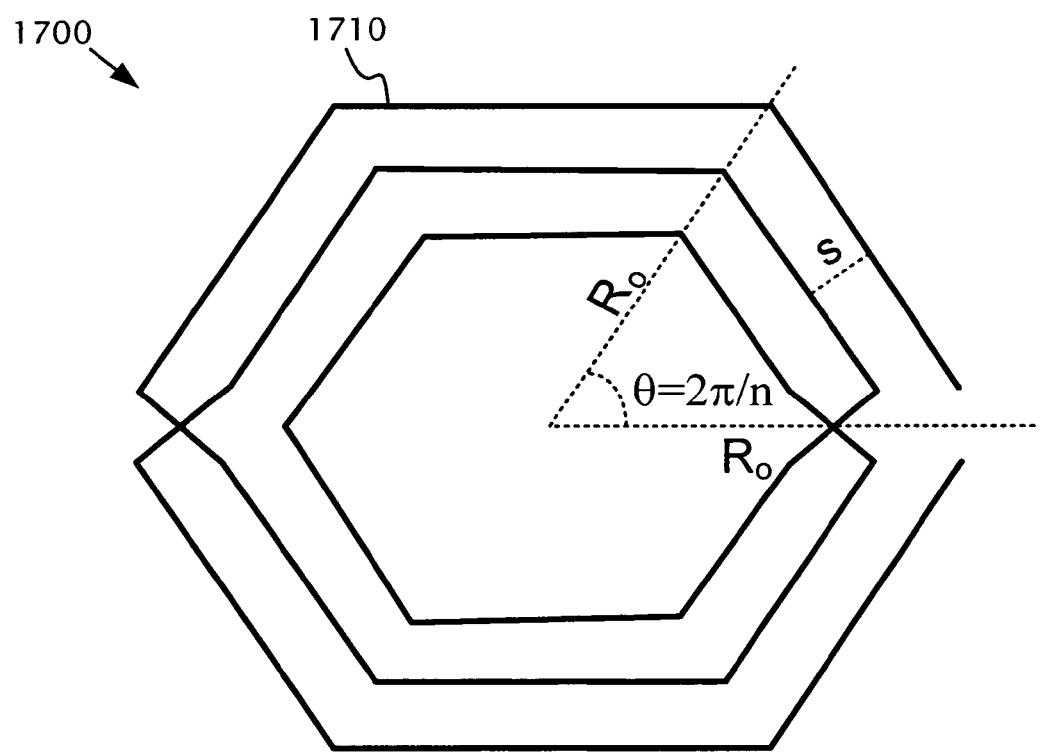
FIG. 17 is a schematic block diagram of a symmetric inductor as may be considered in the method illustrated in FIG. 15.

At process block 1516, respective dipole moments representative of the inductors in the pair are determined. Exemplary methods for determining the dipole moments of various inductors are described below with respect to FIGS. 17-19. In certain embodiments, only one of the dipole moments is computed. Furthermore, if the dipole moment of an inductor has already been computed as part of an earlier computation, the previously calculated value can be used, thereby reducing the computational complexity of the procedure.

At process block 1518, the mutual inductance between the inductors is calculated using the dipole moment(s). In certain exemplary embodiments, the mutual inductance calculation involves calculating the magnetic flux of a magnetic field generated from the representative dipole moment of a first of the inductors through the surfaces bounded by the wiring of the second inductor. For example, the magnetic flux of a magnetic field produced by the first inductor's representative dipole through the surfaces bounded by the wiring of a second inductor can be determined.

In certain embodiments, the magnetic flux of the magnetic field from a first inductor's dipole moment through a second inductor is determined, as well as the magnetic flux of the magnetic field from the second inductor's dipole moment through the first inductor. The resulting mutual inductances are then averaged (or combined according to some other formula) to arrive at a single mutual inductance value for the pair of bundles. For example, for the mutual inductance between an inductor a and an inductor b, the mutual inductance value can be computed as follows:

$$\tilde{M}_{ab} = \frac{M_{ab} + M_{ba}}{2} \qquad (41)$$

Process blocks 1516 and 1518 (in their various embodiments) are sometimes collectively referred to herein as the "dipole approximation technique for inductors."

At process block 1520, the mutual inductance is output. The manner in which the mutual inductance is output may vary widely depending on the implementation and the environment in which the method is performed. For example, it may be displayed to the user (e.g., as part of a graphical user interface displaying at least a portion of the layout) or it may be included in one or more data structures or databases stored on computer-readable media. For example, it can be included as part of a database or data structure storing transistor-level parasitic data, which may be used in another EDA tool (e.g., a simulation tool, such as a full-chip simulation tool). Such data structures and databases may be utilized later in an overall synthesis scheme. For example, and as illustrated below with respect to FIG. 16, the mutual inductance value may be used as part of a technique for analyzing and reducing a noise parameter between the two inductors in the selected pair.

At process block 1522, a determination is made as to whether any additional pairs of inductors are to be analyzed. For example, in certain implementations, mutual inductance computations are performed for every pair of inductors identified at process block 1512. In other embodiments, however, only some of the remaining pairs of inductors identified have their mutual inductance computed using a dipole approximation technique. For example, certain inductors may not have their mutual inductances computed because of a preset or user-defined criteria or because the inductors meet one or more criteria indicating that they exhibit little or no mutual inductance (e.g., the edge-to-edge separation between an inductor and another inductor is greater than a threshold value or the two inductors are shielded from one another). If additional pairs of inductors are to be analyzed, the next pair of inductors is selected at process block 1514.

Figure 16:
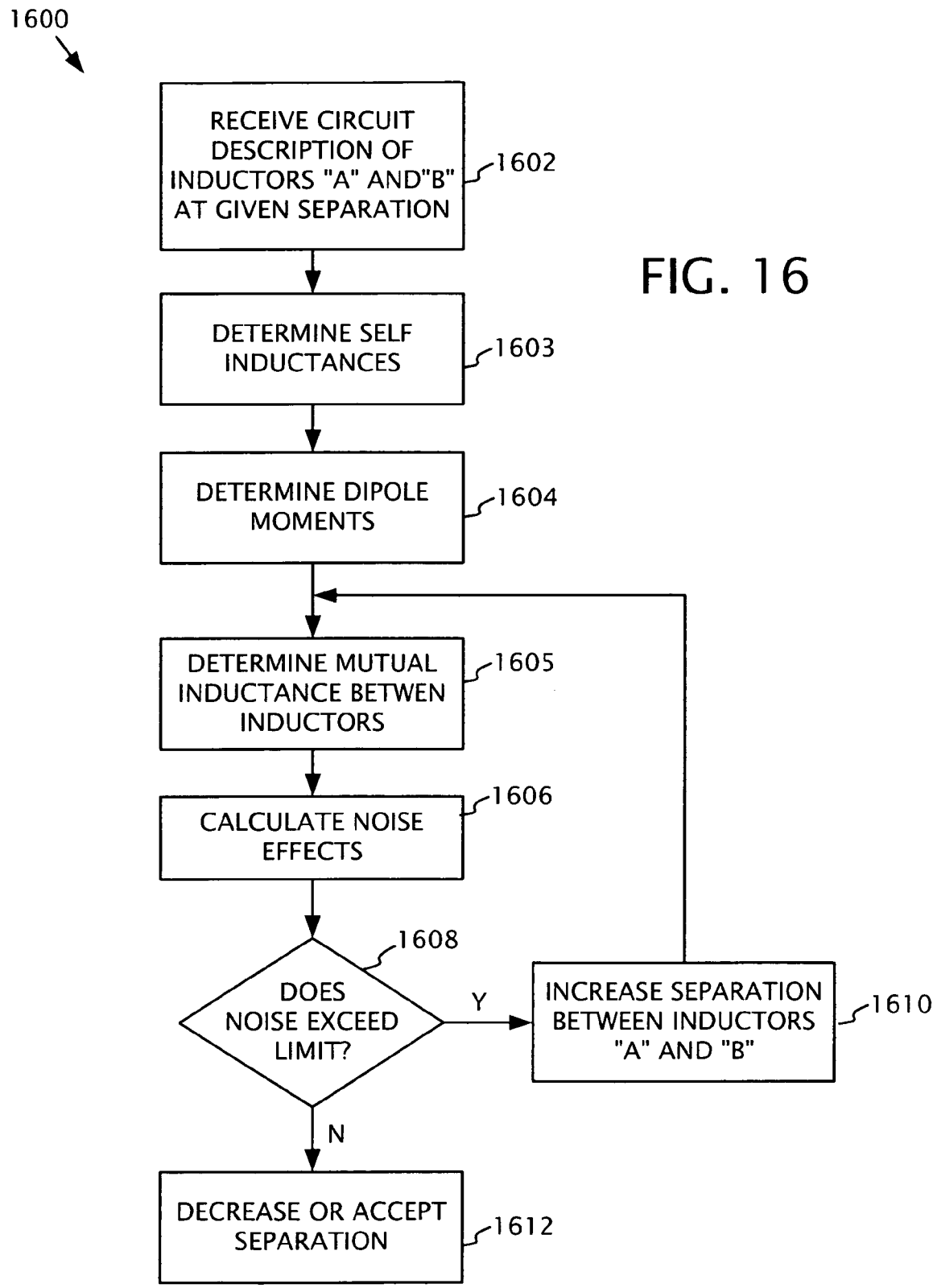
FIG. 16 is a flowchart of an exemplary method for evaluating and modifying the configuration of two inductors using as parameters the prescribed noise limits, and varying the separations among inductors.

FIG. 16 is a flowchart of an exemplary method for evaluating and modifying the configuration of two intentional inductors using a noise parameter. At process block 1602, a circuit description is received having a description of a first inductor (inductor a) and a second inductor (inductor b).

At process block 1603, self inductances are determined for the first inductor and the second inductor. The self inductance determination can be made using a variety of techniques, but in one exemplary embodiment is performed using Equation (33).

At process block 1604, dipole moments for inductors a and b are determined. For example, any of the dipole moment computation techniques described herein can be used. In particular implementations, one of equations (42) through (47) is used.

At process block 1605, the mutual inductance between the inductors is determined. For example, any of the implementations described herein can be used (e.g., the method illustrated in 1500). In particular implementations, equations (41) and (49) are used.

At process block 1606, noise effects between the inductors are calculated. For instance, simulators (such as Eldo from Mentor Graphics Corporation or SPICE) can be used. In particular embodiments, the noise parameter $\zeta$ is calculated, where $\zeta$ equals or is substantially equal to $M_{ab}/\sqrt{L_a L_b}$ where $L_a$, $L_b$ are the self inductances for inductors a and b, respectively, and can be calculated, for instance, using equation (33).

At process block 1608, a determination is made as to whether the noise exceeds a noise limit. The noise limit can be a user setting or value calculated for the particular design being evaluated (e.g., 0.2).

If the noise exceeds the limit, then at process block 1610, the separation between inductors a and b can be increased (e.g., by a fixed increment, by an increment selected by the user, or by an increment computed to result in the desired noise performance). The procedure can then be repeated (e.g., by returning to process block 1605 as shown in FIG. 16). If the noise does not exceed the limit, then the separation is accepted, or, in some implementations, decreased and tested again. In particular embodiments, during each iteration, only the calculation of the flux is repeated, as the dipole moment of the inductor does not change with the change in separation. In this manner, a minimum separation between inductors can be quickly and efficiently found while helping to ensure that the separation will not create impermissible noise in the circuit.

It should be understood that the general methods 1500 and 1600 illustrated in FIGS. 15 and 16, respectively, comprise exemplary embodiments only and are not to be construed as limiting in any way. For example, the particular, sequential order shown in FIGS. 15 and 16 is not limiting, as the operations performed therein may, in certain implementations, be rearranged, performed concurrently, or not performed at all. For instance, in one exemplary embodiment, if the inductors are separated by a distance greater than or equal to the threshold value, no mutual inductance calculation is performed at all. Moreover, additional method acts may be interleaved within the methods 1500 and 1600. Further, the operations performed in FIGS. 15 and 16 may be performed concurrently with other operations not directly related to the computation of mutual inductance (e.g., the analysis of self inductance or other physical parameters of the integrated circuit layout (such as, resistance, conductance, and signal integrity)).

1. Determining the Dipole Moment

In this section, exemplary methods for determining the dipole moment of an inductor are described. Such methods can be used, for instance, to determine the dipole moment at process block 1516.

In general, for a single planar current distribution, the dipole moment of expression (40) can be reduced to:

$$\vec{p}^{(a)} = \frac{\mu}{8\pi} S \hat{z}, \quad (42)$$

where S is the total area bounded by the wire loop, and $\hat{z}$ is an unitary vector perpendicular to the plane containing the loop.

Consequently, and according to one exemplary embodiment, the dipole moment of an inductor (p) can be determined by summing the dipole moments of each filament loop in the inductor. In other words, the computation of the dipole moment for an inductor a ($p^{(a)}$) can be reduced to computing the sum of the areas inside each turn of the inductor a.

In the discussion below, the following definitions are used:
t=number of turns
n=number of sides per turn
N=total number of segments (n×t)
d=separation between vertices on successive turns $$s = d\cos\left(\frac{2\pi}{n}\right) \equiv \text{separation between sides on successive turns}$$

In the following paragraphs, exemplary techniques for calculating the area of various types of inductors are provided. These exemplary techniques should not be construed as limiting, however, as the principles from which the techniques are derived are extendable to other geometries and configurations of inductors. Furthermore, it should be understood that the following discussion assumes that the actual inductor in a layout is made of straight segments connected to one another at respective vertices. The inductor segments are typically straight because of lithographic limitations. The disclosed methods, however, are readily extendable to inductors having curved segments by dividing such inductors into a number of small straight segments such that the inductors approach their original design.

The exemplary techniques concern the following types of inductors:

Symmetric inductors. Symmetric inductors can be generally described as being constructed as concentric rings of regular polygons joined at every half turn. An exemplary symmetric inductor 1710 is shown in schematic block diagram 1700 in FIG. 17.

Spiral inductors. Spiral inductors can be generally described as being constructed such that the vertices of the inductor segments are situated along (or substantially along) a linear spiral, such as a curve defined by r(θ)=R₀−θd/2π, where R₀ is the distance from the center to the farthermost vertex of the inductor, and d is the separation between corresponding vertices on two successive turns of the inductor. An exemplary spiral inductor 1810 is shown in schematic block diagram 1800 of FIG. 18.

Square inductors. Square inductors can be generally described as being constructed as concentric squares, with the last side of each square being reduced by the separation s. An exemplary square inductor 1910 is shown in schematic block diagram 1900 of FIG. 19.

Arbitrary planar inductors. In the case of an arbitrary inductor that does not fit into any of the above characterizations, the dipole moment can be computed as a sum of the individual contributions of each segment to the area of the inductor. For example, according to one embodiment, the inductor can be partitioned into straight-wire segments, and the area subtended by each straight-wire segment about the center of the inductor computed. The resulting areas can then be summed to determine the total area of the inductor, and this sum can be used in Equation (42) above to determine the magnetic dipole moment of the inductor under consideration.

For a symmetric inductor (such as symmetric inductor 1710 in FIG. 17), the sum of the areas of all the concentric polygons can be defined as S and, in one exemplary implementation, is computed as follows:

$$S = \frac{n}{2}\sin\left(\frac{2\pi}{n}\right) \sum_{polygon_i}^{t} R_i^2 \quad (43)$$

$$= \frac{N}{2}\sin\left(\frac{2\pi}{n}\right)\left[R_0^2 + \left(R_0 + \frac{s}{6}\right)s - \left(R_0 + \frac{s}{2}\right)st + \frac{1}{3}(st)^2\right].$$

Figure 18:
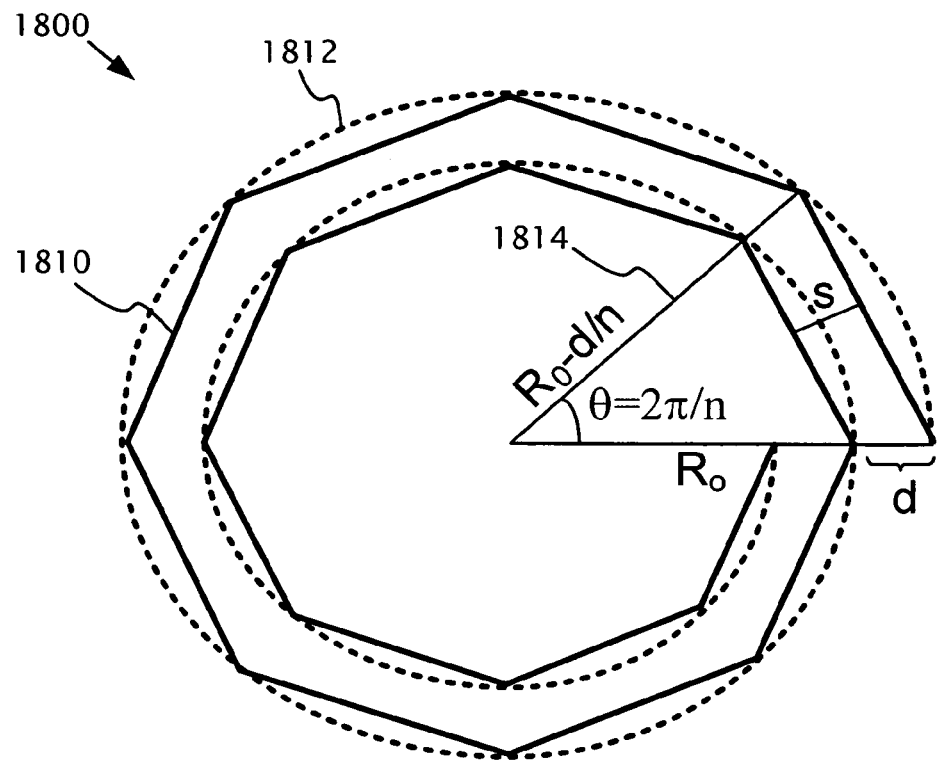
FIG. 18 is a schematic block diagram of a spiral inductor as may be considered in the method illustrated in FIG. 15.
Figure 19:
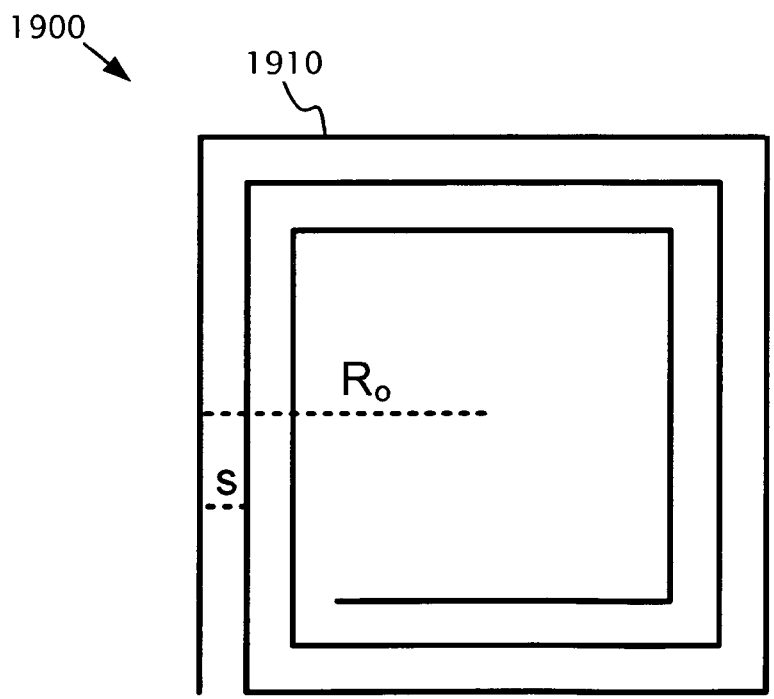
FIG. 19 is a schematic block diagram of a square inductor as may be considered in the method illustrated in FIG. 15.

In order to compute the area subtended by a spiral inductor (such as spiral inductor 1810 shown in FIG. 18, where the "pure" spiral inductor 1812 is shown in dotted lines), and according to one exemplary implementation, the inductor 1810 can be divided into triangles centered within the inductor, such as triangles 1814 illustrated in FIG. 18. The individual contributions of the triangles 1814 can be summed to find the total area of the inductor 1810. For example, $$S = \frac{1}{2}\sin\left(\frac{2\pi}{n}\right) \sum_{triangle_i}^{N} R_i\left(Ri - \frac{d}{n}\right) \quad (44)$$

$$= \frac{N}{2}\sin\left(\frac{2\pi}{n}\right)\left[R_0^2 - \frac{s^2}{3n^2} - st\left(R_0 - \frac{st}{3}\right)\right].$$

In general, Equations (43) and (44) can be extended so that the wires of the inductors are treated as filaments. To extend the equations to finite cross sections for uniform current distribution within each wire, averaging can be performed over the dimensions of the wires (e.g., for both polygons and triangles). For example, $$\tilde{S} = \frac{1}{wh}\int_{R-w}^{R}\int_{0}^{h} S(R', h')\,dR'\,dh' \quad (45)$$

Where h and w are the segments' height and width, respectively. Exemplary equations that result for finite cross sections that can be used during the dipole approximation technique for inductors include:

$$\tilde{S}^{(sym)} = \frac{N}{2}\sin\left(\frac{2\pi}{n}\right) \quad (46)$$

$$\left[R_0^2 + \left(R_0 - \frac{s}{6}\right)s - \left(R_0 - \frac{w}{3} + \frac{s}{2}\right)(st + w) + \frac{1}{3}(st)^2\right]$$

for symmetric inductors, and $$\tilde{S}^{(spiral)} = \frac{N}{2}\sin\left(\frac{2\pi}{n}\right) \quad (47)$$

$$\left[R_0^2 - \frac{s^2}{3n^2} - \left(R_0 - \frac{w}{3}\right)w - \left(R_0 - \frac{w}{2}\right)st - \frac{1}{3}(st)^2\right]$$

for spiral inductors.

Further, for square inductors (such as square inductor 1910 in FIG. 19), and according to one exemplary implementation, the n=4 version of Equations (43) and (46) can be used.

2. Determining the Magnetic Flux

An exemplary procedure for computing the magnetic flux of the field produced by the point-like dipole representing inductor a through the surfaces bounded by the wiring of inductor b is described below. The exemplary procedure can be used, for example, at process block 1518 of FIG. 15.

According to one exemplary technique for determining the magnetic flux, consider that expressions (38) and (39) can be combined to obtain the following expression for a dipole located at r=0:

$$M_{ab} = \tilde{p}^{(a)} \sum_{j=1}^{N_b} \int_{segment\,j} \frac{-y_j dx_j + x_j dy_j}{(x_j^2 + y_j^2 + z_j^2)^{3/2}}. \quad (48)$$

Expression (48) can be integrated as follows:

$$M_{ab} = \tilde{p}^{(a)} \sum_{j=1}^{N_b-1} \frac{c_j}{b_j^2 - a_j^2}\left(\frac{L_j + a_j}{(b_j^2 + a_j L_j + L_j^2)^{1/2}} - \frac{a_j}{b_j}\right), \quad (49)$$

where, for each segment j starting at $(x_0, y_0)$ and ending at $(x_1, y_1)$, the coefficients correspond to:

$$L_j \equiv \sqrt{(x_1 - x_0)^2 + (y_1 - y_0)^2},$$

$$a_j \equiv \frac{2}{L_j}(x_0(x_1 - x_0) + y_0(y_1 - y_0)),$$

$$b_j \equiv \sqrt{x_0^2 + y_0^2 + z_b^2}, \text{ and}$$

$$c_j \equiv \frac{1}{L_j}(x_0 y_1 - x_1 y_0).$$

Note that Expressions (48) and (49) show the computation for the mutual inductance $M_{ab}$ and not just for the magnetic flux, as the relationships $$M_{ab} = \frac{\Psi_{a \to b}}{I_a} \text{ and } \tilde{p}^{(a)} \equiv \frac{p^{(a)}}{I}$$

have been incorporated into the expressions. In one embodiment of the disclosed technology, for example, Expression (49) is used to determine the mutual inductance between two inductors (where a first of the inductors is represented as the magnetic dipole $\tilde{p}^{(a)}$). As noted above with respect to FIG. 15, the procedure can be repeated by representing magnetic fields produced by the second inductor as a magnetic field produced by a dipole moment and considering its flux through the area of the first inductor. The two resulting mutual inductance values can then be averaged to produce a final mutual inductance value for the inductors.

Expression (49), together with Expressions (46) and (47) symmetrized by replacing a with b and averaging, comprise the exemplary dipole approximation technique that is tested below and further expanded in the following sections. Generally speaking, the resulting expression for mutual inductance scales linearly with the dimensions if the inductor (e.g., if the dimensions of an inductoar are multiplied by a factor 1, then the mutual inductance undergoes about the same change).

3. Extending the Expressions to High Frequencies

Figure 20:
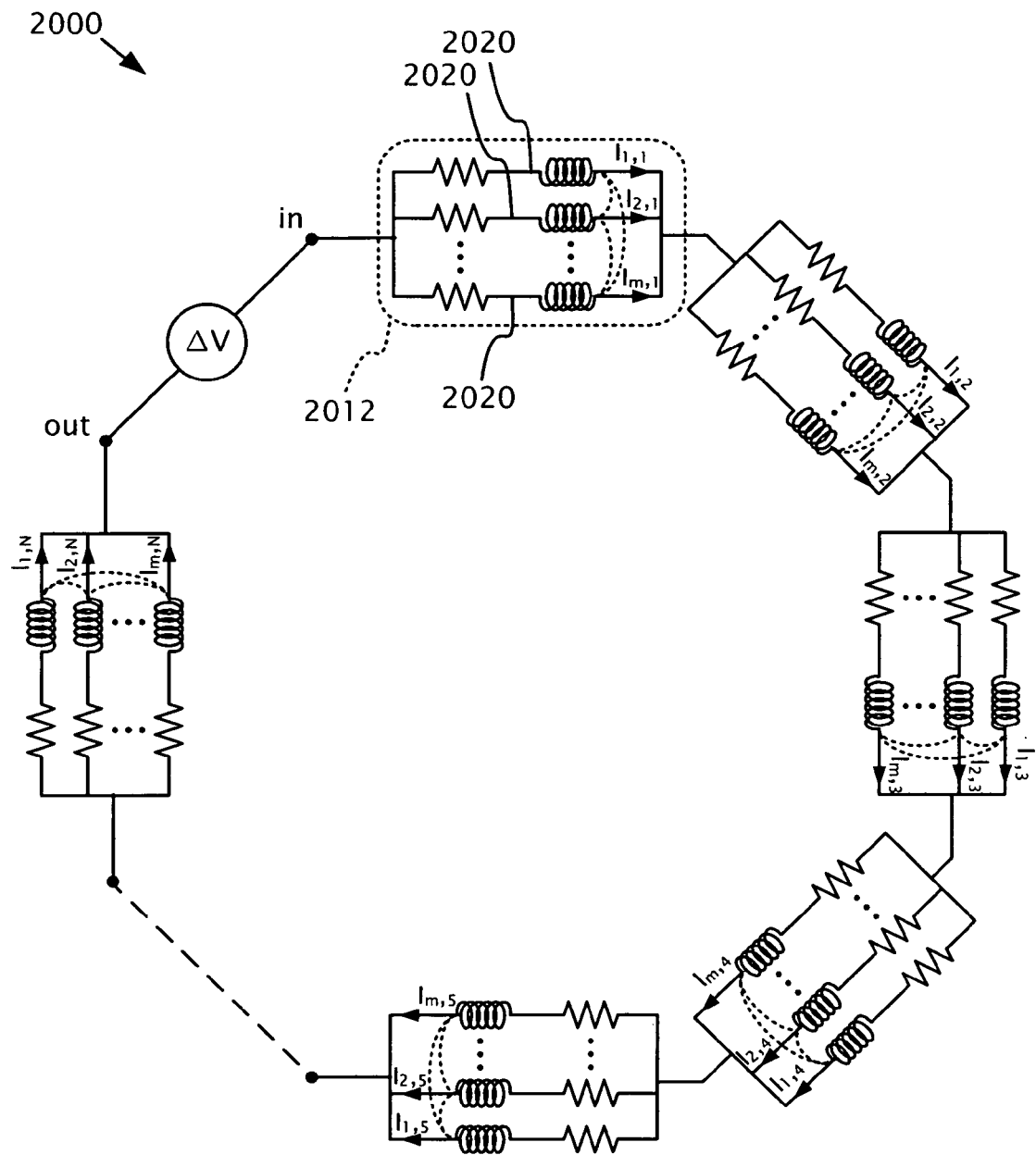
FIG. 20 is a schematic diagram showing an exemplary discretized inductor represented in terms of multiple filaments; partial mutual inductances between different segments are present but not shown.

The previous equations assume that the current is uniform across a wire's cross-section. This approximation, however, ceases to be valid at higher frequencies (e.g., above about 5, 6, or 7 GHz for IC's), where skin and proximity effects begin to noticeably modify the current distribution inside the wires. At higher frequencies, the distribution of currents across the cross section is desirably computed for each wire segment. One exemplary method for performing this computation is to discretize the wire segments into m filaments, with each filament carrying uniform current. FIG. 20 is a schematic diagram showing a discretized inductor 2000, represented in terms of multiple filaments 2020. In particular, FIG. 20 shows the inductor 2000 separated into multiple segments 2012, each of which comprises the circuit equivalent of multiple filaments 2020. (For clarity purpose, only one segment and corresponding set of filaments is shown in FIG. 20. Further, for the sake of clarity in the illustration, the inductive interaction between filaments of different segments are not shown, but are included in the calculation.)

Solving for the filament currents, from the Kirchoff equations for one inductor, the following coefficients can be obtained:

$$\alpha_{j,k} \equiv \frac{I_{j,k}}{I}, 1 \leq j \leq m, 1 \leq k \leq N, \quad (50)$$

where, $$I = \sum_{i=1}^{m} I_{i,k} \quad (51)$$

and corresponds to the total inductor current common to all segments. Notice that the values in Equation (51) are frequency-dependent complex numbers. For example, the dependence of $\alpha_{j,k}$ on the second subindex k indicates that current redistribution is allowed while going from segment to segment.

According to one exemplary embodiment, the discretization procedure described above is carried out only once per frequency and per inductor. The procedure provides the high-frequency self impedance of the inductor, which is defined as ΔV/I, with ΔV corresponding to the difference of potential between the input and output nodes and I given in Equation (50).

In some embodiments, an implicit assumption is made that the current distribution in one inductor is unaffected by the presence of the other inductor. This assumption can be made for cases in which inductors are physically separated by more than a few microns, as has been verified with FastHenry (which does not incorporate this assumption).

At least two different mutual inductance computation techniques can be derived based on this approximation. A first technique corresponds to the classical formulation, whereas a second technique corresponds to the dipole approximation formulation. Within the classical formulation, for example, the following expression can be obtained for mutual inductance according to the filament decomposition approach:

$$M_{ab} = \text{Re}\left(\sum_{k_a=1}^{N_a}\sum_{k_b=1}^{N_b}\sum_{i_a=1}^{m_a}\sum_{i_b=1}^{m_b} \alpha_{i_a,k_a}\alpha_{i_b,k_b} M_{i_a k_a, i_b k_b}\right). \quad (52)$$

The imaginary part of this expression corresponds to the mutual resistance between the inductors divided by $2\pi f$, where f is the frequency. Simulations have been performed that verify that the mutual resistance is generally negligible. In other words, in certain embodiments involving filament decomposition, Equation (34) can be replaced by Equation (51). Experiments using the FastHenry simulation tool have been performed that verify that the results obtained in this fashion are accurate and computationally less expensive than FastHenry for non-negligible separations.

In the second exemplary technique, the extension of the dipole moment in Equation (40) can be performed by computing a weighted sum over the filaments:

$$\tilde{p}^{(a)} = \sum_{k=1}^{N_a}\sum_{i=1}^{m_a} \alpha_{i,k}\tilde{p}_{i,k}, \quad (53)$$

where $I\alpha_{i,k}\tilde{p}_{i,k}$ is the contribution of filament i in the k-th segment to the total dipole moment, and $\tilde{p}_{i,k}$ is proportional to the area spanned by the filament.

The total magnetic flux through the victim inductor can be computed as the weighted sum of the fluxes through the surfaces spanned by each filament. For example, $$M_{ab}^{(HF)} = \text{Re}\left(\sum_{k=1}^{N_b}\sum_{j=1}^{m_b}\alpha_{j,k}M_{a,jk}\right), \quad (54)$$

where $M_{a,jk}$ is calculated as in Equation (49) for segments.

4. Validation

Figure 21:
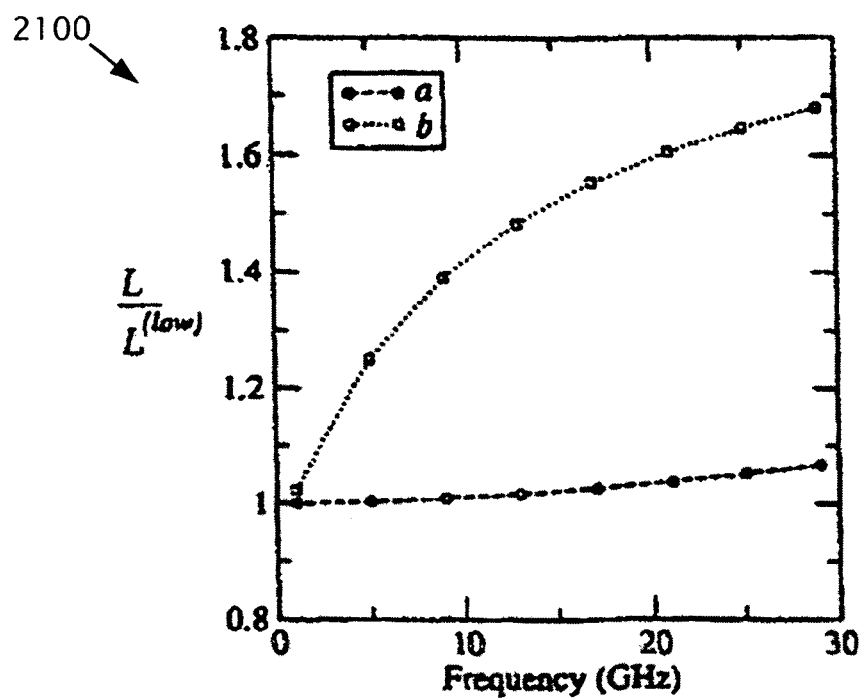
FIG. 21 is a graph illustrating the frequency dependence of resistance for an exemplary square inductor a and spiral inductor b in FIG. 21.

To verify embodiments of the exemplary approach described above, FastHenry and ASITIC were used to first verify that the variations in self and mutual inductance as a function of frequency were small (less than 3% for frequencies up to about 30 GHz). FIG. 21, for example, shows the frequency dependence of resistance, and FIG. 22, for example, shows the frequency dependence of self inductance and mutual inductance.

Figure 22:
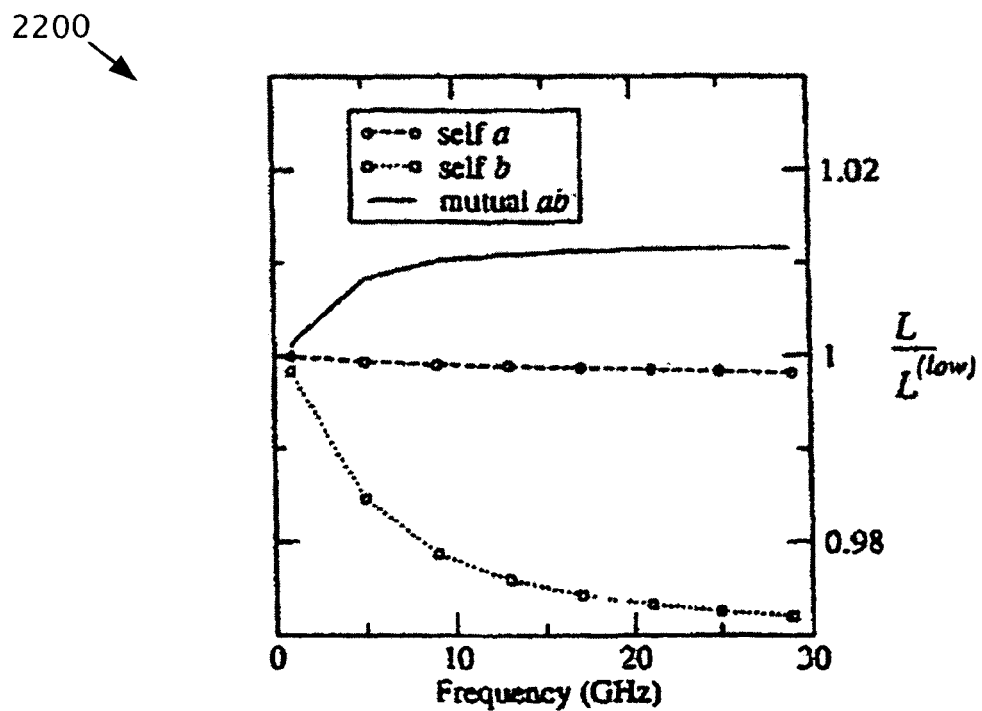
FIG. 22 is a graph illustrating the frequency dependence of self inductance and mutual inductance for the exemplary square inductor a and spiral inductor b.

In FIGS. 21 and 22, a square inductor a ($R_0$=100 μm, s=1 μm, w=1 μm, t=0.65 μm) and a spiral conductor b ($R_0$=100 μm, s=1 μm, w=10 μm, t=0.65 μm) were considered with a border-to-border separation of 50 μm between them. FIGS. 21 and 22 show the ratio of the frequency dependent values to the low frequency values. FIGS. 21 and 22 indicate that for frequencies up to a certain value (e.g., about 30 GHz) the substantially more expensive filament method can be omitted.

Results obtained from an exemplary dipole approximation embodiment (modeled according to the exemplary approach described above with respect to Equation (49) and referred to in the discussion below as the "the dipole approximation test embodiment") were compared with those obtained through conventional techniques (Grover equations and FastHenry). The parameter for noise analysis that was analyzed in these comparisons was the ratio ζ, defined as:

$$\zeta = M_{ab}/\sqrt{L_a L_b} \quad (55)$$

where $L_a$, $L_b$ are the self inductances of inductors a and b, respectively. The self inductance parameters $L_a$, $L_b$ provide a normalization for noise estimates and ordinarily need to be computed just once.

Figure 23:
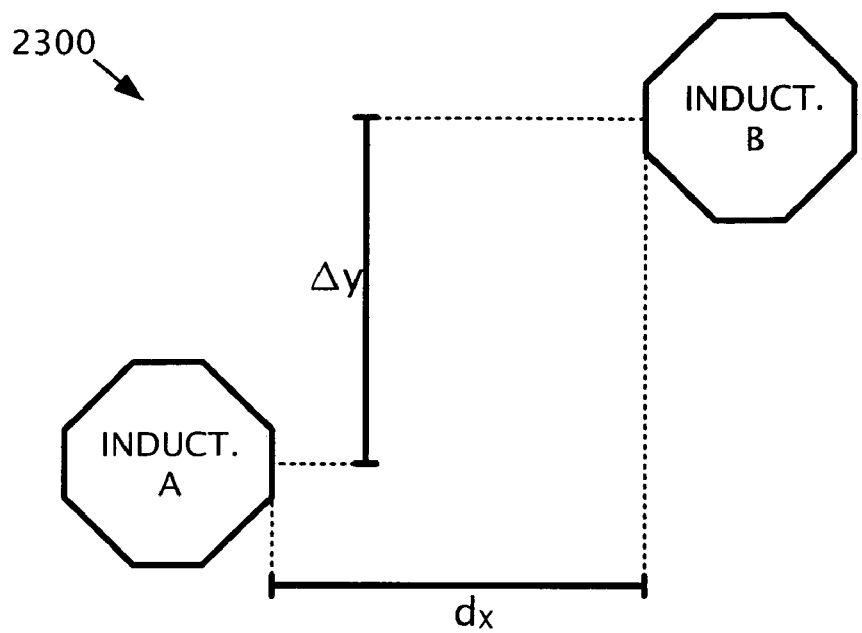
FIG. 23 is a schematic block diagram showing the cross-sectional geometry of two inductors considered during experiments with an embodiment of the disclosed dipole approximation technique.

FIG. 23 is a schematic block diagram showing the geometry of the two inductors ("inductor a" and "inductor b") considered, including the horizontal border-to-border separation $d_x$ and the vertical center-to-center separations Δy. In graphs 2400 and 2500 of FIGS. 24 and 25, respectively, results from the dipole approximation test embodiment are compared against the Classical Grover (CG) equations and the FastHenry inductance simulation engine (available from Massachusetts Institute of Technology). The FastHenry tool splits the cross section of each wire segment into $n_w \times n_h$ filaments and uses precorrection methods to solve iteratively the linear system that represents the circuit consisting of these filaments.

Figure 24:
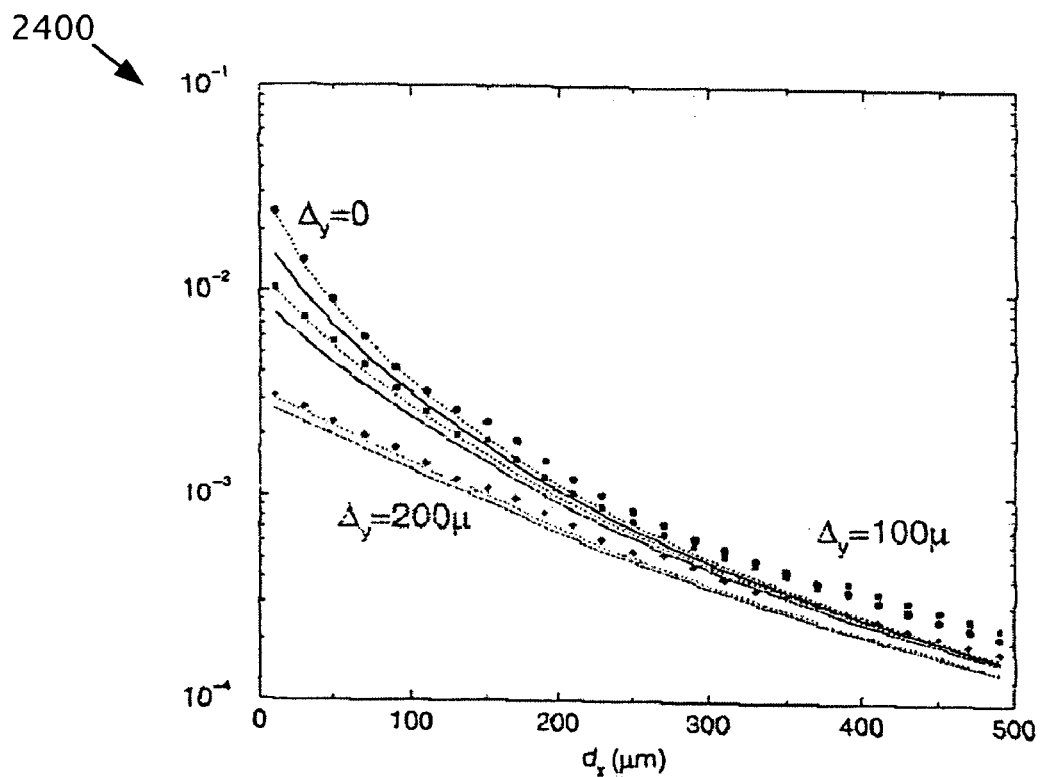
FIG. 24 is a graph of the ratio $\zeta$ plotted as a function of $d_x$ for inductor configurations as shown in FIG. 23 for an embodiment of the disclosed dipole approximation technique, a FastHenry simulation, and a classical approach using Grover's equations.

In FIG. 24, the ratio ζ is plotted as a function of $d_x$ for inductor configurations as shown in FIG. 23 for different values of Δy. The solid lines in FIG. 24 show results from the dipole approximation test embodiment, the dashed lines show the CG results, and the symbols show the results from FastHenry. The exemplary inductor configuration considered in FIG. 24 consisted of one 6-turn hexagonal symmetric inductor ($R_0$=50 μm, s=1 μm) and one 5-turn octagonal symmetric inductor ($R_0$=80 μm, s=0.5 μm). A totally asymmetric configuration was used in FIG. 24 to emphasize certain geometric effects. The calculations with FastHenry were made at 5 GHz and several choices of filament decompositions were made, from a single filament per segment, to up to 49 (7×7) filaments per segment. At this frequency, the results for FastHenry were substantially insensitive to the number of filaments.

As can be seen in FIG. 24, the results from FastHenry and the CG approach are substantially identical at this frequency, except for large separations where the CG approach and the dipole approximation test embodiment tend to agree with each other, but not with FastHenry. Simulations were also performed with the ASITIC tool (available from the Meyer/Niknejad Research Group at the University of California, Berkeley (see, e.g., ASITIC: Analysis and Simulation of Spiral Inductors and Transformers for ICs, http://rfic.eecs.berkeley.edu/~niknejad/asitic.html)). The results from ASITIC agreed with the CG approach and the dipole approximation test embodiment, but not with FastHenry. Given that the numbers are quite small, the difference might be attributable to possible numerical instabilities within FastHenry. Even at short distances, the dipole approximation test embodiment provides sufficiently high accuracy for the noise figures.

Figure 25:
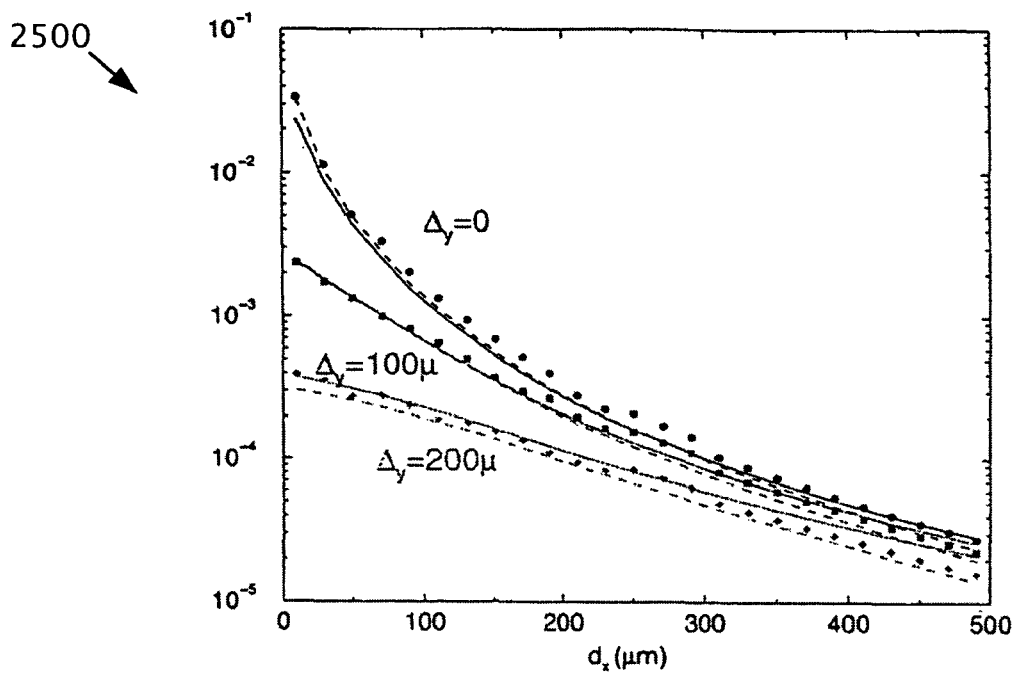
FIG. 25 is a graph showing a similar comparison as FIG. 25 of the same mutual inductance computation techniques for multi-turn square inductors consisting of six and two turns, respectively

FIG. 25 is a graph 2500 showing a similar comparison of the same mutual inductance computation techniques for multi-turn square inductors consisting of six and two turns, respectively. In particular, a first square inductor had $R_0=30$ μm, s=0.5 μm, w=1 μm, and t=6, whereas a second square inductor had $R_0=20$ μm, s=1 μm, w=1 μm, and t=2.

5. Performance Analysis

One property of the dipole approximation test embodiment for computing the mutual inductance between two intentional devices is its linear growth with the number of segments. By contrast, the classical Grover expression used in FastHenry grows quadratically with the number of segments.

For two inductors with $N_a$ and $N_b$ segments, the linear behavior of the dipole approximation test embodiment is a result of the computation of Equation (40) using one of Equations (43), (44), (46), or (47) (or a worst case of $N_a$ evaluations of the areas of triangles if no specific formula for the total area can be obtained) plus $N_b$ evaluations of Equation (49). Given two inductors with $N_t=N_a+N_b$ total segments, the dipole approximation test embodiment described above requires a maximum of $2N_t$ operations. The factor of two can be attributed to the symmetrization consideration, as opposed to the $\frac{1}{2}N_t^2$ operations that are performed in the classical approach (see, for example, Equation (34)).

Figure 26:
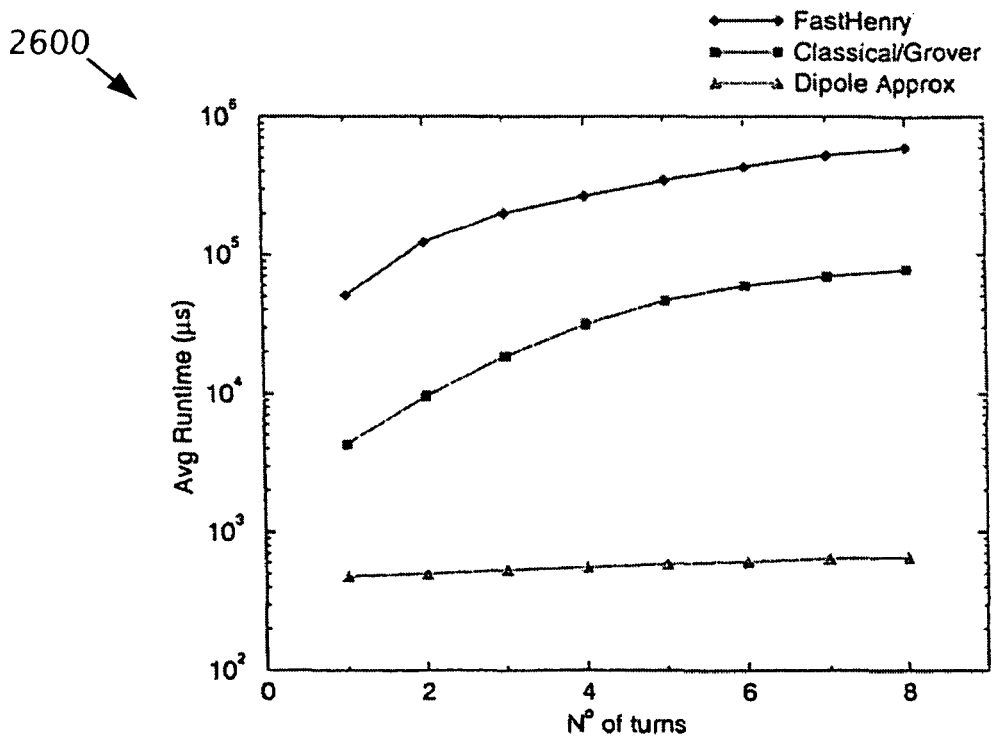
FIG. 26 is a graph showing the total average runtime for the three methods compared in FIG. 25 of two symmetrical octagonal inductors as a function of the number of turns in one of the inductors and for a fixed separation.

Furthermore, the terms appearing in the $M_{ab}$ computation of the dipole approximation test embodiment involve simple functions. For example, there is a single transcendental function to evaluate: the $\sin(2\pi/n)$ function in the equations for the area, which is evaluated once per inductor irrespectively of the separation. Additionally, in the dipole approximation test embodiment, there are no further integrals to be computed for finite cross sections In FIG. 26 the total average runtime for the three methods is compared for two symmetrical octagonal inductors as a function of the number of turns in one of the inductors and for a fixed separation. Additionally, in Table 2 below, the runtime comparison between the methods is evaluated according to the following criteria: (a) for the CG approach and the dipole approximation test embodiment ("DA"), the computation is broken down into a setup portion common to both (reading input files, memory allocation, and the like) and a calculation portion; (b) for FastHenry ("FH"), only the total runtimes are displayed; (c) for each datapoint, 1000 samples were run, all of them on a SunBlade 2500 at 2.39 GHz with SunOS 5.8 and 4 GB of physical memory; and (d) to avoid the influence of outliers, the highest and lowest 1% of runtimes for each configuration were discarded. The calculations for the CG approach and the DA approach were carried out, respectively, using the one-filament-per-segment methods discussed above. The FastHenry runs were done at 5 GHz. The times expressed in Table 2 are in microseconds per calculation.

TABLE 2

Comparative runtimes

| $N_{turns}$ | CG\|DA (setup) $10^2\times$ | CG (calc) $10^3\times$ | DA (calc) | FH $10^5\times$ |
| --- | --- | --- | --- | --- |
| 1 | 4.68 ± 0.52 | 3.8 ± 0.2 | 13.5 ± 2.6 | 5.1 ± 0.1 |
| 2 | 4.82 ± 0.54 | 9.1 ± 0.5 | 18.9 ± 1.8 | 12.4 ± 0.3 |
| 3 | 5.09 ± 0.43 | 18.2 ± 0.5 | 25.2 ± 2.9 | 20.2 ± 0.2 |
| 4 | 5.29 ± 0.50 | 31.1 ± 0.6 | 31.6 ± 4.1 | 26.9 ± 0.3 |
| 5 | 5.54 ± 0.55 | 46.3 ± 0.7 | 38.9 ± 4.4 | 34.9 ± 2.2 |
| 6 | 5.68 ± 0.47 | 59.6 ± 0.8 | 42.8 ± 4.4 | 43.3 ± 0.5 |
| 7 | 5.93 ± 0.59 | 69.6 ± 0.8 | 51.1 ± 4.9 | 52.9 ± 0.9 |
| 8 | 5.98 ± 0.49 | 78.1 ± 0.9 | 56.8 ± 6.6 | 59.8 ± 0.5 |

As can be seen from Table 2, the dipole approximation test embodiment ("DA") is two and one half orders of magnitude faster than the Classical Grover ("CG") approach. The setup times for the DA and CG approaches are roughly one order of magnitude longer than the calculation time of the DA approach. Thus, the total runtime using the DA approach is dominated by the set up time. The opposite is true for the CG approach. The overall effect is that the total runtime of the DA approach is two orders of magnitude faster than the runtime using CG.

The results in Table 2 correspond to a single separation. For noise-driven synthesis applications, the computational cost for calculating inductances for a number of possible separations is of interest. In such applications, further gains can be obtained using the DA method. For example, in embodiments of the DA approach, the dipole moment and the self inductance are computed only once for each component of interest.

At higher frequencies, a comparison between FastHenry and a version of the dipole approximation method using Equation (20) or its equivalent can be made. In contrast to FastHenry, for example, the two exemplary high-frequency methods using embodiment of the dipole approximate technique discussed above separate the calculation of self inductance from the calculation of the mutual inductance. FastHenry iteratively solves a system with $N_t$ unknowns in at best $O(N_t^2)$ operations and, for each separation and frequency, the full calculation needs to be redone. In the two exemplary approaches discussed above (both based on filaments—one using Grover-like expressions for the filaments, the other using dipoles), the separation of the self from the mutual inductance can provide significant gains. For example, in the dipole approximation equations (53) and (54), the complexity associated with the computation of the mutual inductance is linear with mN.

C. Alternative Embodiments

In this subsection, possible alternative techniques for using dipole approximations in the computation of the mutual inductance between inductors are discussed. The following discussion proceeds with reference to inductor a and inductor b. Further, for discussion purposes, it is assumed that the dipole approximation technique is applied to inductor a, such that a representative dipole moment is determined for inductor a and that the mutual inductance is computed by determining the magnetic flux of the representative dipole over the surface of inductor b. It should of course be understood that the exemplary technique can be applied in the opposite manner (where the representative dipole of inductor b is found) and that the final mutual inductance value can be computed as the average of the two mutual inductance computations.

According to one exemplary alternative embodiment, the determination of mutual inductance between a first inductor and a second inductor proceeds as follows. Inductor a can be represented as one or more closed polygons. For example, in the case of a symmetric or spiral inductor, each constituent current loop can be represented as a closed polygon approximating the geometry of a turn. Bundles can be formed of respective opposite segments in the closed polygons (which are representative of the turns of the inductor). Thus, in this exemplary embodiment, a loop consists of as many bundles as one half the number of segments per closed polygon (that is, per turn). In this situation, there is a single value of alpha (α) per bundle that is equal to one. The dipole moment of inductor a is computed by adding the dipole moments of its constituent bundles. In one particular implementation, for example, the dipole of inductor a is the sum of the dipole moments of each constituent loop in inductor a.

The flux of the field generated by the single dipole moment of inductor a on each closed surface of inductor b can be computed. For example, equation (18) may be used. In the case of a Manhattan layout, this results in a sum of terms like equation (26) for each segment oriented in the y direction, and an analogous term with y exchanged for x for segments oriented in the x direction. This procedure can be more generally applied to non-Manhattan multiple turn inductors using Equation (49).

The complexity of the exemplary procedure can be estimated as follows. The total number of operations is given by ($N_a+N_b+2$), with $N_a$=N× number of sides of the a polygon, and $N_b$=M× number of sides of the b polygon. The value of "2" that is added comes from the computation of the two dipole moments. The overall computation has been reduced from quadratic to linear complexity and each one of the terms involves ratios of polynomials including square roots.

Figure 27:
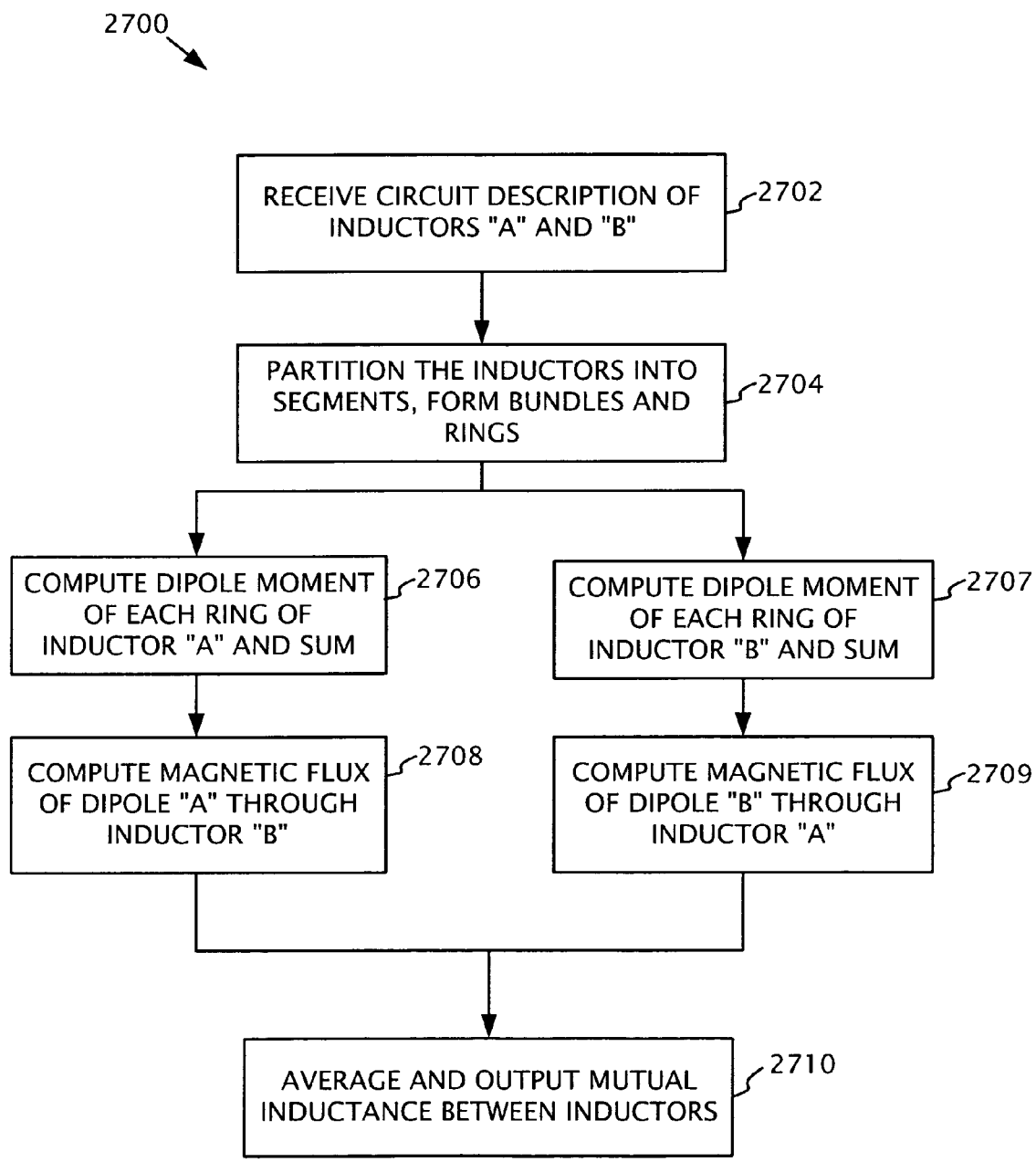
FIG. 27 is a flowchart showing an exemplary alternative application of the dipole approximation on inductors.

FIG. 27 is a flowchart illustrating the above-described alternative embodiment for computing mutual inductances between two inductors. In the particular implementation shown in FIG. 27, the inductors are assumed to be rectangular inductors. In particular, the flowchart shows the mutual inductance computation between inductor a and inductor b, which are not necessarily equal. FIG. 28 is a block diagram 2800 schematically showing example inductors a and b.

At process block 2702, a circuit description of a circuit is received (e.g., a circuit design file, such as a GDSII or Oasis file containing the intentional inductors). The circuit description may additionally comprise an indication of localization of the inductors.

Figure 29:
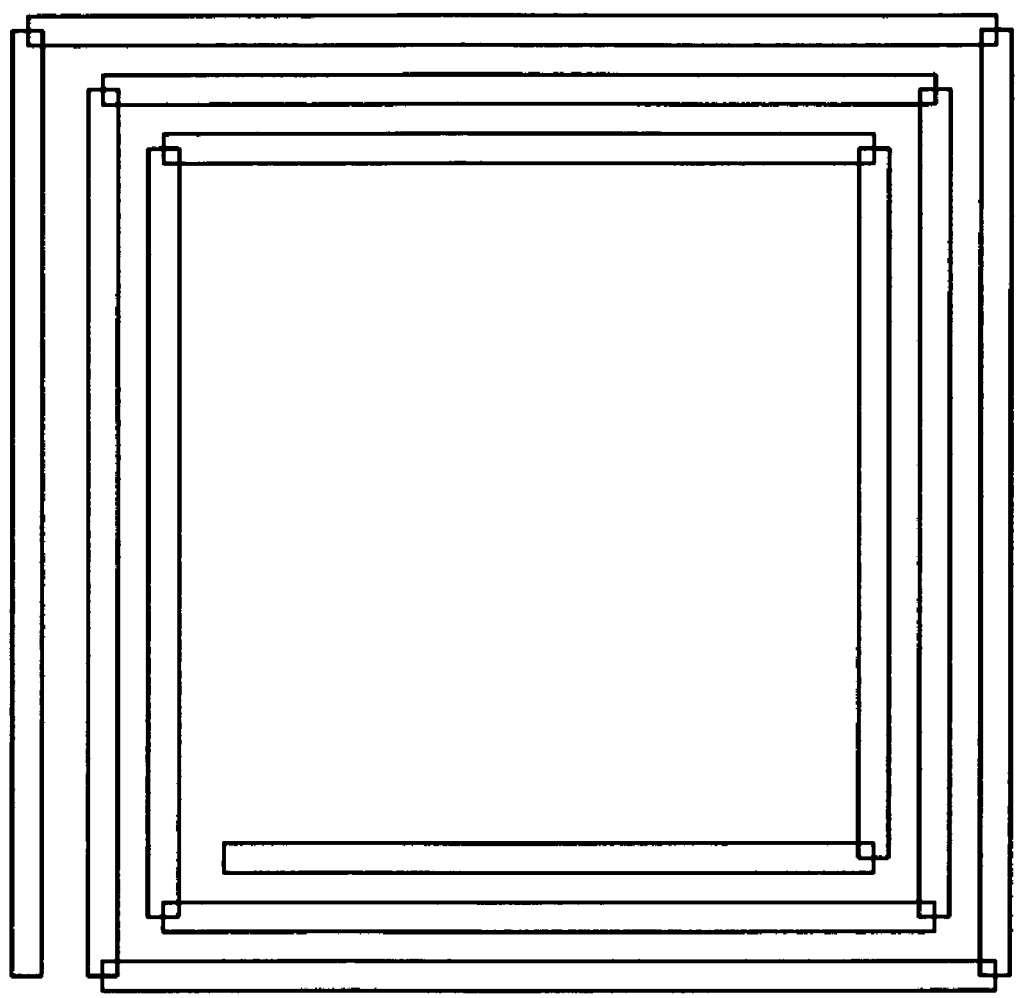
FIG. 29 is a block diagram showing an exemplary partitioning of an inductor into straight segments according to the method of FIG. 27.

At process block 2704, the inductors are broken (or partitioned) at their vertices in order to have straight segments. FIG. 29 is a block diagram 2900 illustrating this procedure for inductor a. Further, each turn in inductor a is replaced by a closed loop, or ring, in order to compute the dipole moment of the corresponding loop belonging to the inductor a. The loops or rings can be identified by closing the turns as illustrated in block diagram 3000 in FIG. 30. For purposes of this discussion, inductor a is considered to be the inductor for which the representative dipole moment is computed. As can be seen from FIG. 30, the approximate geometrical representation of inductor a is that of a concentric set of polygons (rectangles in the Manhattan case), one for each of the turns of the inductor. Bundles, as described above, can be formed from the rings.

At process block 2706, the dipole moments for each ring in inductor a are computed and summed to produce a single representative dipole moment. The resulting dipole moment of inductor a is proportional to the sum of areas of all its constituent polygons and can be computed in a single operation. This follows directly from equation (20).

At process block 2708, the mutual inductance is computed as the magnetic flux generated by magnetic field produced by the representative dipole moment of inductor a though inductor b. This computation can be performed, for example, as described above for the case of bundles. In one particular implementation, equation (18) is applied. Specifically, to calculate the flux of the magnetic field due to the dipole moment of equation (49) through inductor b, equation (18) can be used as follows:

$$\Psi_{a \to j} = \oint_{\partial S_j} A^{(a)} \cdot d\ell_j \quad (56)$$

$$= \tilde{p}^{(a)} \sum_{j=1}^{N_b} \int_{segment\,j} \frac{-y_j dx_j + x_j dy_i}{(x_j^2 + y_j^2 + z_j^2)^{3/2}}.$$

Integration of equation (56) and accounting for the relationship that $\tilde{p}^{(a)}=p^{(a)}/I$ leads to equation (40) above for computing the mutual inductance $M_{ab}$. In the Manhattan case, this results in a sum of terms like equation (26) for each segment oriented in the y direction, and an analogous term with y exchanged for x for segments oriented in the x direction. There are as many terms as there are segments in the victim. Further, in this example, the alphas ($\alpha$) can be replaced by "1", since all the current is carried by the loop.

The computation can be repeated by replacing inductor a with b, and averaging the two values obtained in this manner in order to arrive at a symmetrical mutual inductance between the two inductors. This is indicated in FIG. 27, for example, by the two branches in 2707, 2709 and subsequent merger at 2710, though it should be understood that this computation can be performed in some embodiments for just one inductor of the pair.

Figure 31:
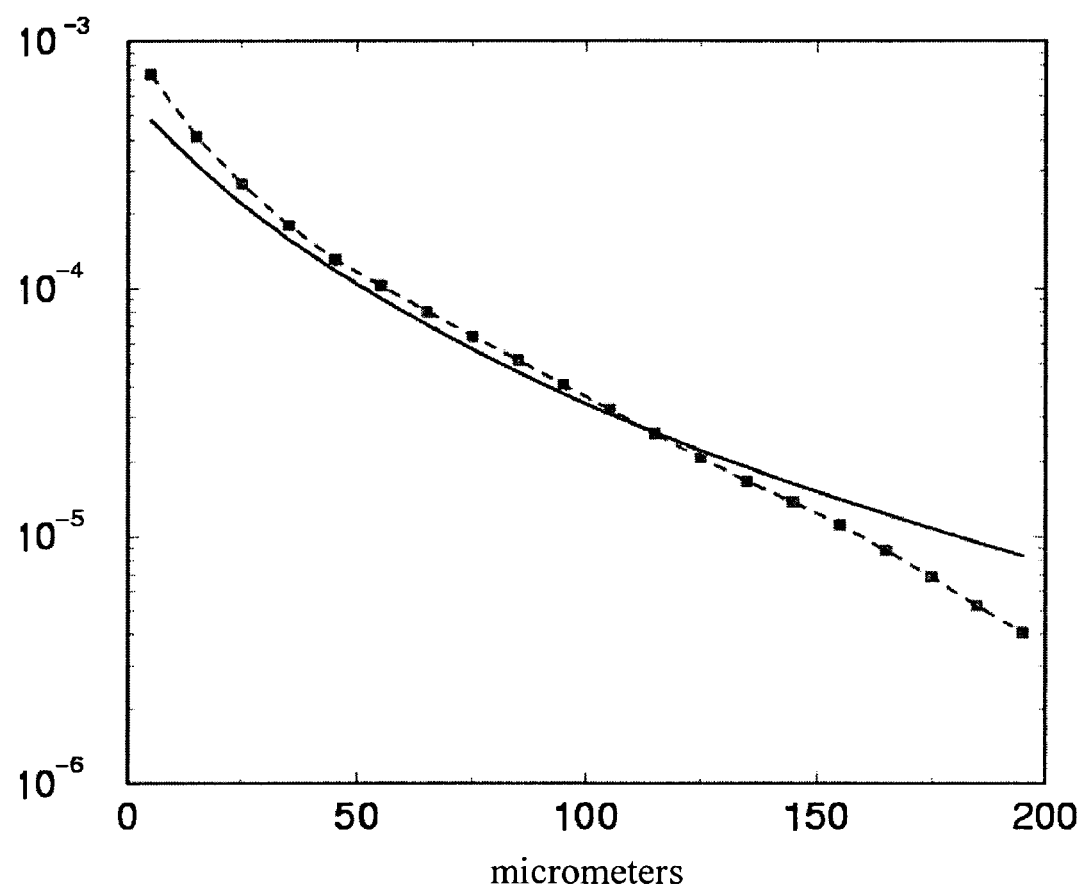
FIG. 31 is a graph showing a comparison between results of $\zeta$ as a function of two inductors' border-to-border separation obtained by an embodiment of the disclosed dipole approximation technique applied to a configuration having two inductors.

FIG. 31 shows the result of a mutual inductance calculation between two exemplary rectangular inductors using the alternative dipole approximation technique described above (dashed-symbol line) and a field solver (solid line). In graph 3100, the value of $\zeta=M_{ab}/\sqrt{L_aL_b}$ (the ratio of the mutual inductance to the geometric average of the two self inductances) is plotted against the separation (in microns) between the borders of the two inductors. In this example, the first inductor has 5 turns and the second inductor has 6 turns. For both inductors, each turn consists of four segments, and the separation between turns is 2 microns for the first inductor and 1 micron for the second. The wires of both inductors have a width of 1 micron and a thickness of 0.65 microns.

The Manhattan radius of one of them is 50 microns while the radius for the other one is 25 microns. Results for $\zeta$ show sufficiently good precision for noise estimations, where one is mainly interested in establishing bounds. Results for separations between the borders larger than 5 microns give adequate estimates for noise analysis. If the noise parameter $\zeta$ is larger than a predetermined noise figure of merit, one can increase the separation among the inductors until safe margins are satisfied. The process can be repeated for every pair of inductors till a desired configuration is obtained.

V. Exemplary Network Environments for Applying the Disclosed Techniques

Figure 32:
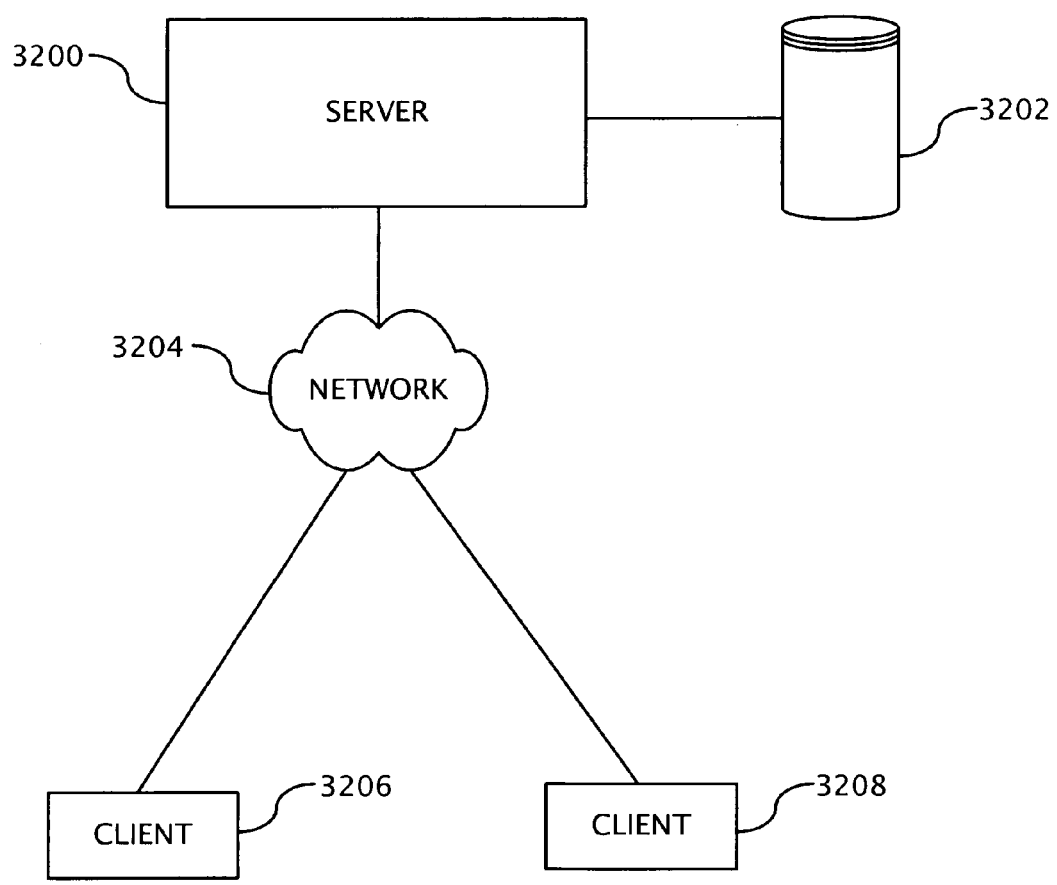
FIG. 32 is a block diagram showing a first exemplary computer network as may be used to perform any of the disclosed methods.

Any of the aspects of the technology described above may be performed using a distributed computer network. FIG. 32 shows one such exemplary network. A server computer 3200 can have an associated storage device 3202 (internal or external to the server computer). For example, the server computer 3200 can be configured to perform a mutual inductance extraction technique according to any of the disclosed embodiments (e.g., as part of an EDA software tool, such as a physical verification or synthesis tool). The server computer 3200 can be coupled to a network, shown generally at 3204, which can comprise, for example, a wide-area network, a local-area network, a client-server network, the Internet, or other such network. One or more client computers, such as those shown at 3206, 3208, may be coupled to the network 3204 using a network protocol. The work may also be performed on a single, dedicated workstation, which has its own memory and one or more CPUs.

Figure 33:
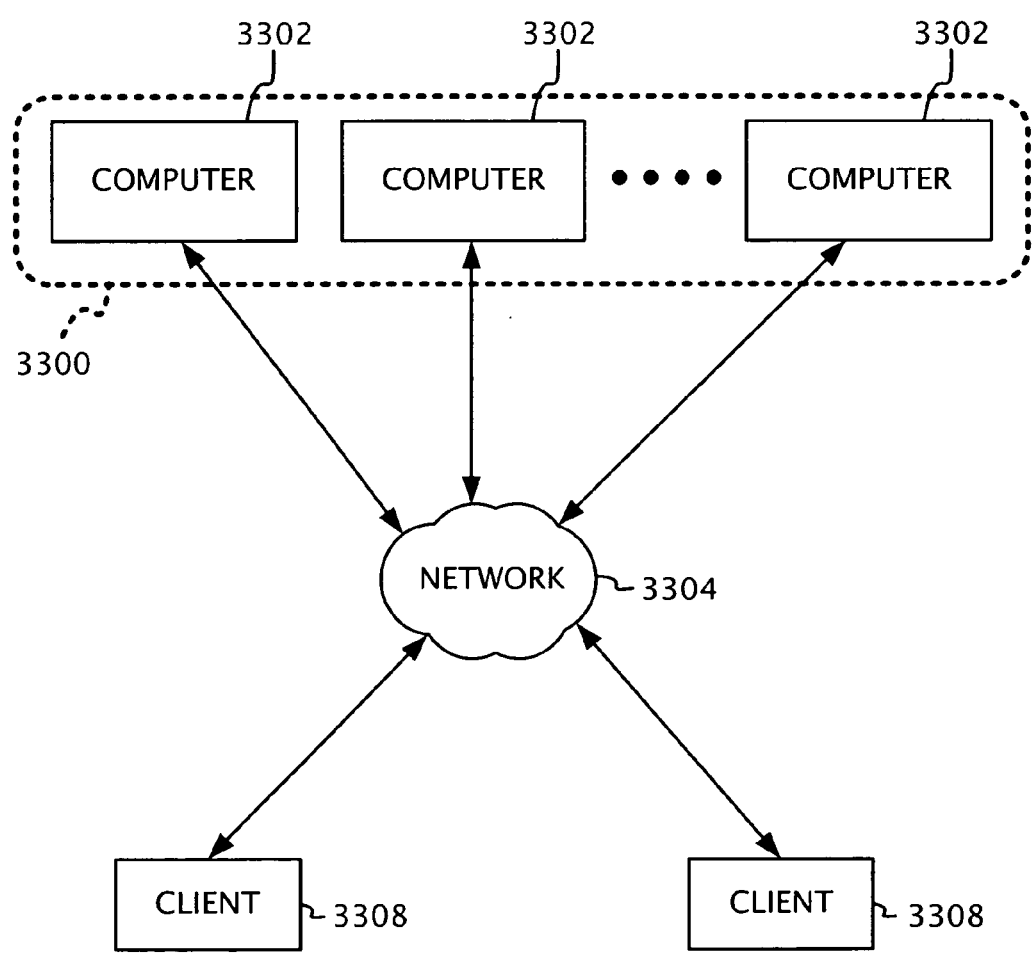
FIG. 33 is a block diagram showing a second exemplary computer network as may be used to perform any of the disclosed methods.

FIG. 33 shows another exemplary network. One or more computers 3302 communicate via a network 3304 and form a computing environment 3300 (e.g., a distributed computing environment). Each of the computers 3302 in the computing environment 3300 can be used to perform at least a portion of the mutual inductance extraction technique according to any of the disclosed embodiments (e.g., as part of an EDA software tool, such as a physical verification or synthesis tool). For instance, each of the computers may perform mutual inductance extraction (or parasitic extraction generally) for different portions of the circuit design or according to various other criteria. The network 3304 in the illustrated embodiment is also coupled to one or more client computers.

Figure 34:
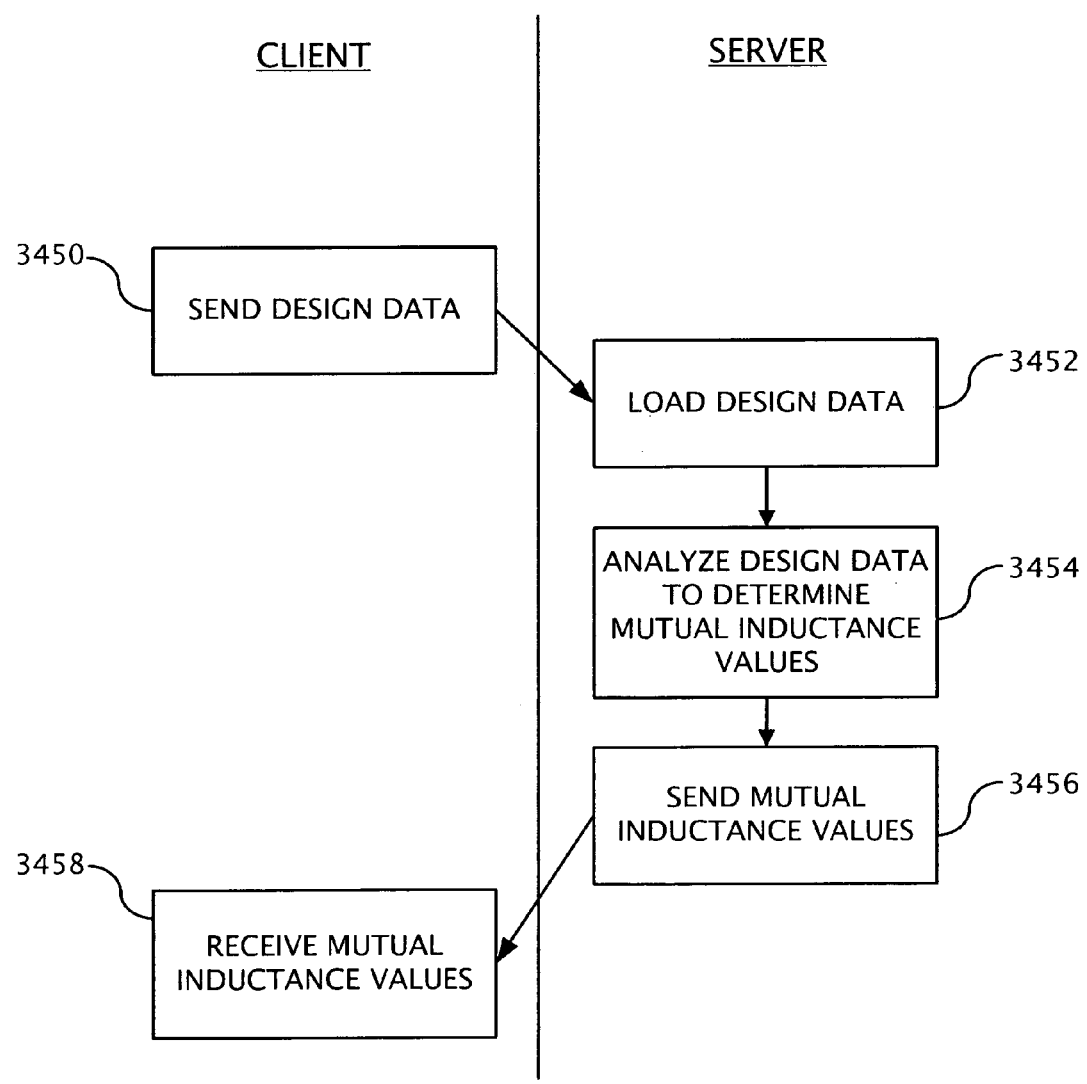
FIG. 34 is a flowchart of a method for determining mutual inductances between inductors in a circuit layout using any of the disclosed embodiments and using the network of FIG. 33 or 34.

FIG. 34 shows that a database or data structure containing design information (e.g., a GDSII, Oasis file, or other such file indicative of a circuit layout) can be analyzed using a remote server computer (such as the server computer 3200 shown in FIG. 32) or a remote computing environment (such as the computing environment 3300 shown in FIG. 33) in order to extract one or more parasitic inductance values (e.g., mutual inductance between inductors) using any of the embodiments disclosed herein. At process block 3402, for example, the client computer sends design data to the remote server or computing environment. For instance, the client computer may send a GDSII, Oasis file, or other EDA design file along with any other data used in the extraction process). In process block 3404, the design data is received and loaded by the remote server or by respective components of the remote computing environment. In process block 3406, mutual inductance values are determined using any of the disclosed embodiments. At process block 3408, the remote server or computing environment sends the inductance values determined to the client computer, which receives the data at process block 3410. For example, a database or data structure of the relevant mutual inductances computed by the inductance extraction procedure can be created. The mutual inductances can be stored, for example, as an updated version of the circuit design data (e.g., included in fields related to each signal wire) or as one or more separate files or data structures (e.g., a SPICE file). It should be apparent to those skilled in the art that the example shown in FIG. 34 is not the only way to obtain parasitic extraction results using multiple computers. For instance, the design data may be stored on a computer-readable medium that is not on a network and that is sent separately to the server or computing environment (e.g., a CD-ROM, DVD, or portable hard drive). Or, the server computer or remote computing environment may perform only a portion of the extraction procedures.

Having illustrated and described the principles of the illustrated embodiments, it will be apparent to those skilled in the art that the embodiments can be modified in arrangement and detail without departing from such principles. For example, the principles of the disclosed technology can be applied more generally such that they do not require direct correspondence to a dipole moment. For instance, in one exemplary embodiment, a value associated with a first inductor can be determined. Similar to the dipole moment, this value can be representative of plural magnetic fields generated by respective turns of the first inductor. The mutual inductance value between the first inductor and a second inductor can then be determined as a function of the value. For example, the value can be the magnitude of a vector located substantially in the center of the first inductor, and the mutual inductance can be determined as the flux of a magnetic field through the second inductor, wherein the magnetic field is represented as being generated at the location of the vector and having a strength proportional to the value. In view of the many possible embodiments, it will be recognized that the illustrated embodiments include only examples and should not be taken as a limitation on the scope of the invention. Rather, the invention is defined by the following claims. We therefore claim as the invention all such embodiments that come within the scope of these claims.

What is claimed is:

1. One or more computer-readable memory or storage devices storing computer-executable instructions for causing a computer system to perform a method, the method comprising:
   receiving circuit design information indicative of at least a portion of a circuit layout, the circuit design information including layout information about at least a first inductor and a second inductor;
   determining a value associated with the first inductor, the value being representative of a strength of a magnetic field generated by a magnetic dipole substantially at the center of the first inductor;
   determining a mutual inductance between the first inductor and the second inductor as a function of the value; and
   modifying a location of one of the first inductor or the second inductor in the circuit layout based at least in part on the determined mutual inductance.

2. The one or more computer-readable memory or storage devices of claim 1, wherein the act of determining the value comprises computing a sum of areas enclosed by the respective turns of the first inductor.

3. The one or more computer-readable memory or storage devices of claim 1, wherein the act of determining the value comprises:
   representing the respective turns in the first inductor as dipole moments; and
   computing a sum of the dipole moments.

4. The one or more computer-readable memory or storage devices of claim 1, wherein the value corresponds to the magnitude of a vector located substantially in the center of the first inductor.

5. The one or more computer-readable memory or storage devices of claim 4, wherein the act of determining a mutual inductance comprises determining the flux of a magnetic field through surfaces subtended by turns of the second inductor, wherein the magnetic field is represented as being generated at the location of the vector and having a strength proportional to the value.

6. The one or more computer-readable memory or storage devices of claim 1, wherein the value is a first value and the mutual inductance is a first mutual inductance, the method for analyzing mutual inductance further comprising:
   determining a second value associated with the second inductor, the second value being representative of a strength of a magnetic field generated by a magnetic dipole substantially at the center of the second inductor;
   determining a second mutual inductance between the first inductor and the second inductor as a function of the second value; and
   determining a final mutual inductance value, wherein the final mutual inductance value is based at least in part on the first mutual inductance and the second mutual inductance.

7. The one or more computer-readable memory or storage devices of claim 6, wherein the act of determining the final mutual inductance value comprises averaging the first mutual inductance and the second mutual inductance.

8. The one or more computer-readable memory or storage devices of claim 1, wherein the method further comprises determining a noise parameter based at least in part on the mutual inductance.

9. The one or more computer-readable memory or storage devices of claim 1, wherein the method further comprises storing the mutual inductance in a database of parasitic inductances associated with the circuit layout.

10. One or more computer-readable memory or storage devices storing design information for a circuit having a layout modified at least in part by a method, the method comprising:

receiving circuit design information indicative of at least a portion of a circuit layout, the circuit design information including layout information about at least a first inductor and a second inductor;

determining a value associated with the first inductor, the value being representative of a strength of a magnetic field generated by a magnetic dipole substantially at the center of the first inductor;

determining a mutual inductance between the first inductor and the second inductor as a function of the value; and modifying a location of one of the first inductor or the second inductor in the circuit layout based at least in part on the determined mutual inductance.

11. A method for analyzing mutual inductance between inductors in a circuit layout, the method comprising:

receiving circuit design information indicative of at least a portion of the circuit layout, the circuit design information including layout information about at least a first inductor and a second inductor;

determining a value associated with the first inductor, the value being representative of a strength of a magnetic field generated by a magnetic dipole substantially at the center of the first inductor;

using a computer, determining a mutual inductance between the first inductor and the second inductor as a function of the value; and modifying a location of one of the first inductor or the second inductor in the circuit layout based at least in part on the determined mutual inductance.

12. The method of claim 11, wherein the act of determining the value comprises computing a sum of areas enclosed by the respective turns of the first inductor.

13. The method of claim 11, wherein the act of determining the value comprises:

representing the respective turns in the first inductor as dipole moments; and computing a sum of the dipole moments.

14. The method of claim 11, wherein the value corresponds to the magnitude of a vector located substantially in the center of the first inductor.

15. The method of claim 14, wherein the act of determining a mutual inductance comprises determining the flux of a magnetic field through surfaces subtended by turns of the second inductor, wherein the magnetic field is represented as being generated at the location of the vector and having a strength proportional to the value.

16. The method of claim 11, wherein the value is a first value and the mutual inductance is a first mutual inductance, the method for analyzing mutual inductance further comprising:

determining a second value associated with the second inductor, the second value being representative of a strength of a magnetic field generated by a magnetic dipole substantially at the center of the second inductor;

determining a second mutual inductance between the first inductor and the second inductor as a function of the second value; and determining a final mutual inductance value, wherein the final mutual inductance value is based at least in part on the first mutual inductance and the second mutual inductance.

17. The method of claim 16, wherein the act of determining the final mutual inductance value comprises averaging the first mutual inductance and the second mutual inductance.

18. The method of claim 11, wherein the method for analyzing mutual inductance further comprises determining a noise parameter based at least in part on the mutual inductance.

19. The method of claim 11, wherein the method for analyzing mutual inductance further comprises storing the mutual inductance in a database of parasitic inductances associated with the circuit layout.

* * * * *

UNITED STATES PATENT AND TRADEMARK OFFICE
CERTIFICATE OF CORRECTION

PATENT NO. : 8,161,438 B2
APPLICATION NO. : 11/435426
DATED : April 17, 2012
INVENTOR(S) : Suaya et al.

Page 1 of 1

It is certified that error appears in the above-identified patent and that said Letters Patent is hereby corrected as shown below:

In the Specification:

Column 18, line 25, " $M_{ab} = \tilde{p}'_a \sum_{j \geq 0} \alpha'_{b,j} x_j \int_{y_{0,j}}^{y_{1,j}} \frac{dy}{(x_j^2 + y_j^2 + z_j^2)^{3/2}}$ " should read -- $M_{ab} = \tilde{p}_a \sum_{j \geq 0} \alpha'_{b,j} x_j \int_{y_{0,j}}^{y_{1,j}} \frac{dy}{(x_j^2 + y_j^2 + z_j^2)^{3/2}}$ --.

Column 26, line 16, "component ($B_{195}$)" should read --component ($B_\perp$)--.

Signed and Sealed this
Fifteenth Day of January, 2013

David J. Kappos
*Director of the United States Patent and Trademark Office*